(12) United States Patent
Vasylyev

(10) Patent No.: US 10,627,562 B2
(45) Date of Patent: Apr. 21, 2020

(54) ILLUMINATION SYSTEM USING EDGE-LIT WAVEGUIDE AND MICROSTRUCTURED SURFACES

(71) Applicant: Sergiy Vasylyev, Elk Grove, CA (US)

(72) Inventor: Sergiy Vasylyev, Elk Grove, CA (US)

(73) Assignee: SVV TECHNOLOGY INNOVATIONS, INC., Sacramento, CA (US)

( * ) Notice: Subject to any disclaimer, the term of this patent is extended or adjusted under 35 U.S.C. 154(b) by 10 days.

(21) Appl. No.: 15/838,061

(22) Filed: Dec. 11, 2017

(65) Prior Publication Data

US 2018/0100959 A1  Apr. 12, 2018

Related U.S. Application Data

(63) Continuation of application No. 14/969,898, filed on Dec. 15, 2015, now Pat. No. 9,880,342, which is a continuation of application No. 12/764,867, filed on Apr. 21, 2010, now Pat. No. 9,256,007.

(60) Provisional application No. 61/214,331, filed on Apr. 21, 2009, provisional application No. 61/339,512, filed on Mar. 6, 2010.

(51) Int. Cl.
*G02B 6/00* (2006.01)
*F21V 8/00* (2006.01)
*G03B 21/20* (2006.01)
*G02B 3/00* (2006.01)

(52) U.S. Cl.
CPC ........... *G02B 6/0038* (2013.01); *G02B 3/005* (2013.01); *G02B 6/0063* (2013.01); *G03B 21/208* (2013.01); *G02B 6/0055* (2013.01)

(58) Field of Classification Search
CPC .... G02B 6/005; G02B 6/0038; G02B 6/0055; G02B 6/0053; G02B 3/005; G02B 3/0056; G02B 6/0033; G02B 6/0035; G02B 6/0036; G02B 6/0063; G03B 21/2066; G03B 21/208; G02F 1/133605; G02F 2001/133607; G02F 2001/133625
USPC ................. 385/33, 36; 349/65; 257/E25.009
See application file for complete search history.

(56) References Cited

U.S. PATENT DOCUMENTS

| 3,973,994 A | 8/1976 | Redfield |
| 4,143,234 A | 3/1979 | Johnson et al. |
| 4,257,676 A | 3/1981 | Grenbel et al. |
| 4,357,486 A | 11/1982 | Blieden et al. |
| 4,411,490 A | 10/1983 | Daniel |

(Continued)

FOREIGN PATENT DOCUMENTS

| DE | 4016665 | 11/1991 |
| WO | 2010033859 | 3/2010 |

OTHER PUBLICATIONS

"Helmholtz reciprocity", Wikipedia article.*

(Continued)

*Primary Examiner* — Robert Tavlykaev

(57) ABSTRACT

An apparatus for distributing light from a planar waveguide through an array of elongated surface relief features formed in a major surface of the waveguide. Light received within a waveguide is propagated transmissively and retained by total internal reflection, except in response to impinging upon light deflecting elements which sufficiently redirect the light to escape the waveguide through the array of elongated surface relief features that further redirects and redistributes the light.

20 Claims, 23 Drawing Sheets

(56) References Cited

U.S. PATENT DOCUMENTS

| | | | |
|---|---|---|---|
| 4,505,264 A | 3/1985 | Tremblay | |
| 4,511,755 A | 4/1985 | Mori | |
| 4,529,830 A | 7/1985 | Daniel | |
| 4,638,110 A | 1/1987 | Erbert | |
| 4,691,994 A | 9/1987 | Afian et al. | |
| 4,863,224 A | 9/1989 | Afian et al. | |
| 5,089,055 A | 2/1992 | Nakamura | |
| 5,268,985 A | 12/1993 | Ando et al. | |
| 5,515,184 A | 5/1996 | Caulfield et al. | |
| 5,560,700 A | 10/1996 | Levens | |
| 5,592,332 A * | 1/1997 | Nishio | G02B 3/0031 359/455 |
| 5,806,955 A | 9/1998 | Parkyn, Jr. et al. | |
| 5,877,874 A | 3/1999 | Rosenberg | |
| 6,008,449 A | 12/1999 | Cole | |
| 6,021,007 A | 2/2000 | Murtha | |
| 6,072,551 A | 6/2000 | Jannson et al. | |
| 6,091,020 A | 7/2000 | Fairbanks et al. | |
| 6,151,169 A | 11/2000 | Kim | |
| 6,163,641 A | 12/2000 | Eastgate | |
| 6,274,860 B1 | 8/2001 | Rosenberg | |
| 6,280,063 B1 * | 8/2001 | Fong | G02B 5/045 362/333 |
| RE37,377 E * | 9/2001 | Gunjima | F21V 9/14 349/113 |
| 6,301,418 B1 * | 10/2001 | Freier | G02B 6/001 362/558 |
| 6,323,415 B1 | 11/2001 | Uematsu et al. | |
| 6,333,458 B1 | 12/2001 | Forrest et al. | |
| 6,560,030 B2 | 5/2003 | Legrand et al. | |
| 6,598,989 B2 * | 7/2003 | Huang | G02B 6/0028 362/23.16 |
| 6,667,782 B1 * | 12/2003 | Taira | G02B 6/0053 349/65 |
| 6,730,840 B2 | 5/2004 | Sasaoka et al. | |
| 6,775,460 B2 | 8/2004 | Steiner et al. | |
| 6,804,062 B2 | 10/2004 | Atwater et al. | |
| 6,819,687 B1 | 11/2004 | Fein | |
| 6,847,669 B2 | 1/2005 | Perner | |
| 6,948,341 B2 | 9/2005 | Beach et al. | |
| 7,391,939 B1 | 6/2008 | Williams | |
| 7,606,456 B2 | 10/2009 | Nyhart, Jr. | |
| 7,817,885 B1 * | 10/2010 | Moore | G02B 6/0036 385/33 |
| 7,991,257 B1 * | 8/2011 | Coleman | B29D 11/0073 264/1.24 |
| 8,358,266 B2 * | 1/2013 | Khazeni | B29D 11/00663 345/108 |
| 8,638,408 B2 | 1/2014 | Wang et al. | |
| 2005/0052750 A1 * | 3/2005 | King | B05D 1/40 359/619 |
| 2006/0050533 A1 * | 3/2006 | Yang | G02F 1/133606 362/613 |
| 2006/0146573 A1 * | 7/2006 | Iwauchi | G02B 6/0018 362/621 |
| 2007/0115569 A1 * | 5/2007 | Tang | G02B 5/021 359/831 |
| 2007/0189701 A1 * | 8/2007 | Chakmakjian | G02B 6/0028 385/146 |
| 2007/0279727 A1 * | 12/2007 | Gandhi | G02B 6/0035 359/242 |
| 2008/0086289 A1 * | 4/2008 | Brott | G02B 6/0061 703/6 |
| 2009/0041771 A1 * | 2/2009 | St. George-Hyslop | C07K 14/4711 424/139.1 |
| 2009/0064993 A1 | 3/2009 | Ghosh et al. | |
| 2009/0126792 A1 | 5/2009 | Gruhlke | |
| 2009/0147179 A1 | 6/2009 | Yamashita et al. | |
| 2010/0116336 A1 * | 5/2010 | Martinez Anton | G02B 3/08 136/259 |

OTHER PUBLICATIONS

"Reciprocity (electromagnetism)", Wikipedia article.*
"Reciprocity in optics" by Potton, Rep. Prog. Phys., vol. 67, 717-754, 2004.*
U.S. Appl. No. 61/098,279, filed Sep. 19, 2008—inventors Joseph Ford and Jason Karp, pp. 1-65.
WIPO, counterpart PCT Application No. PCT/US20101031949, International Publicatino No. W02010124028 dated Oct. 28, 2010, inclUding international search report and written opinion issued on Nov. 30, 2010, pp. 1-141.

* cited by examiner

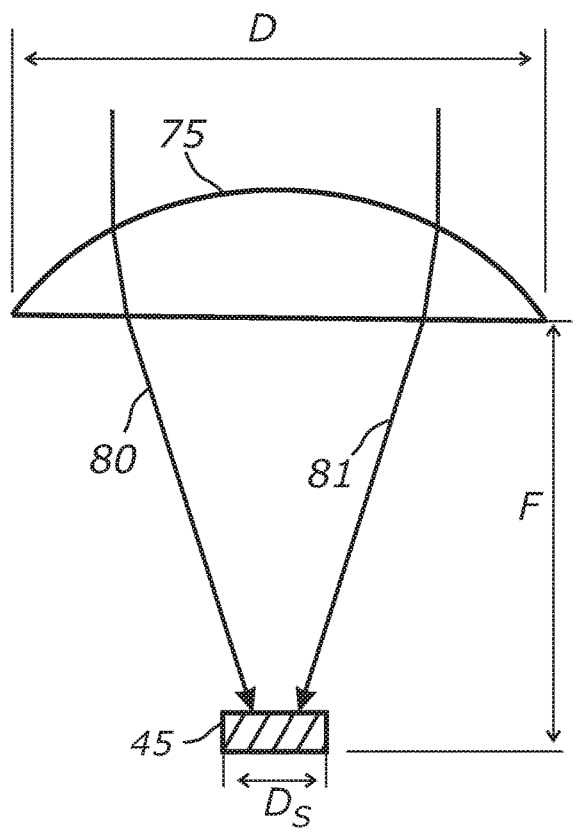
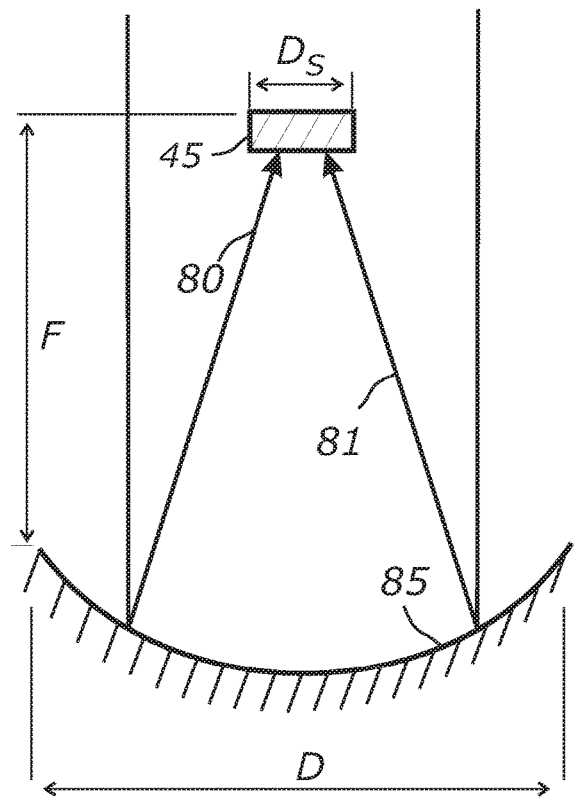
FIG. 1A
(PRIOR ART)
FIG. 1B
(PRIOR ART)

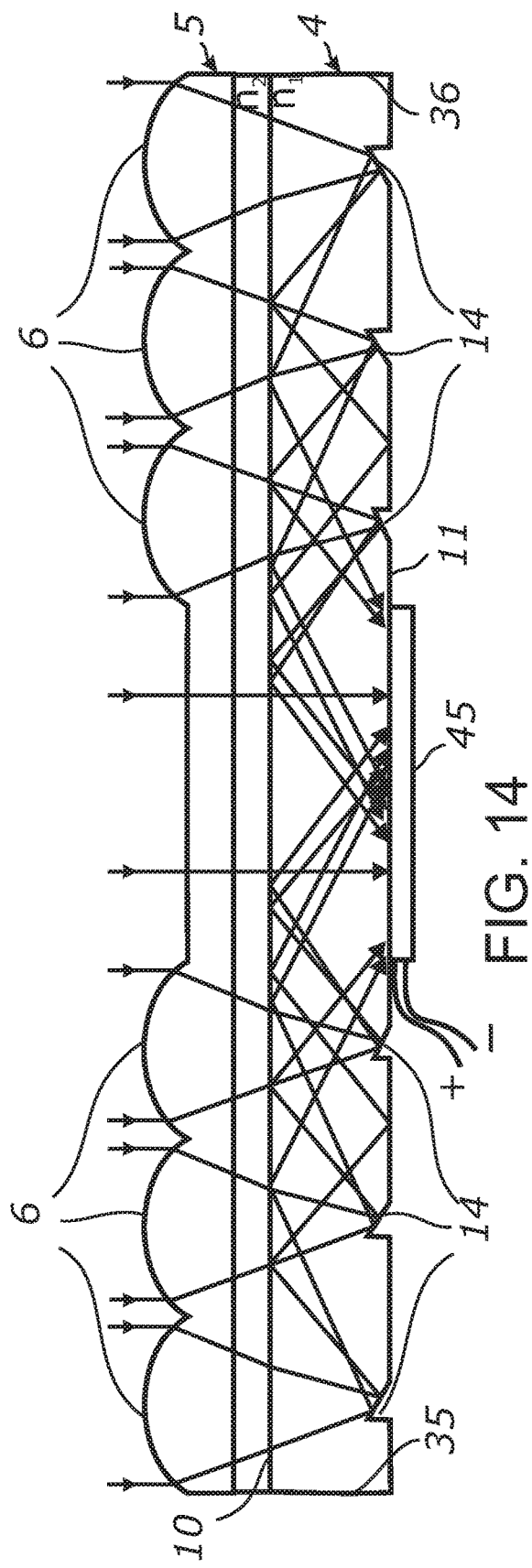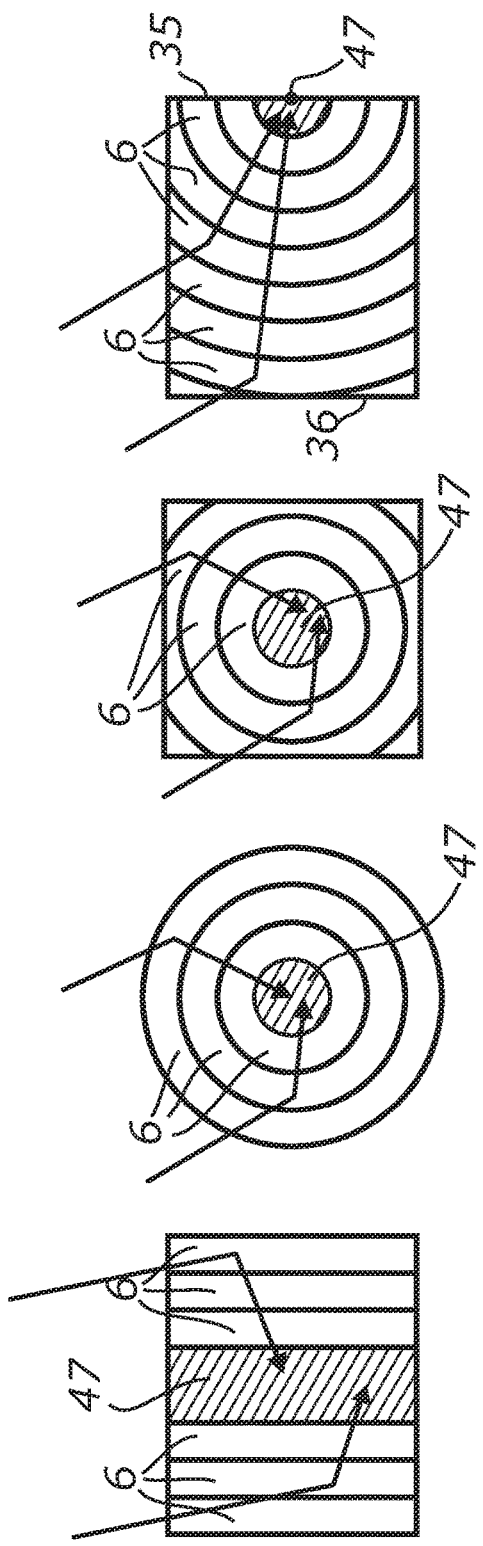
FIG. 14
FIG. 15A  FIG. 15B  FIG. 15C  FIG. 15D

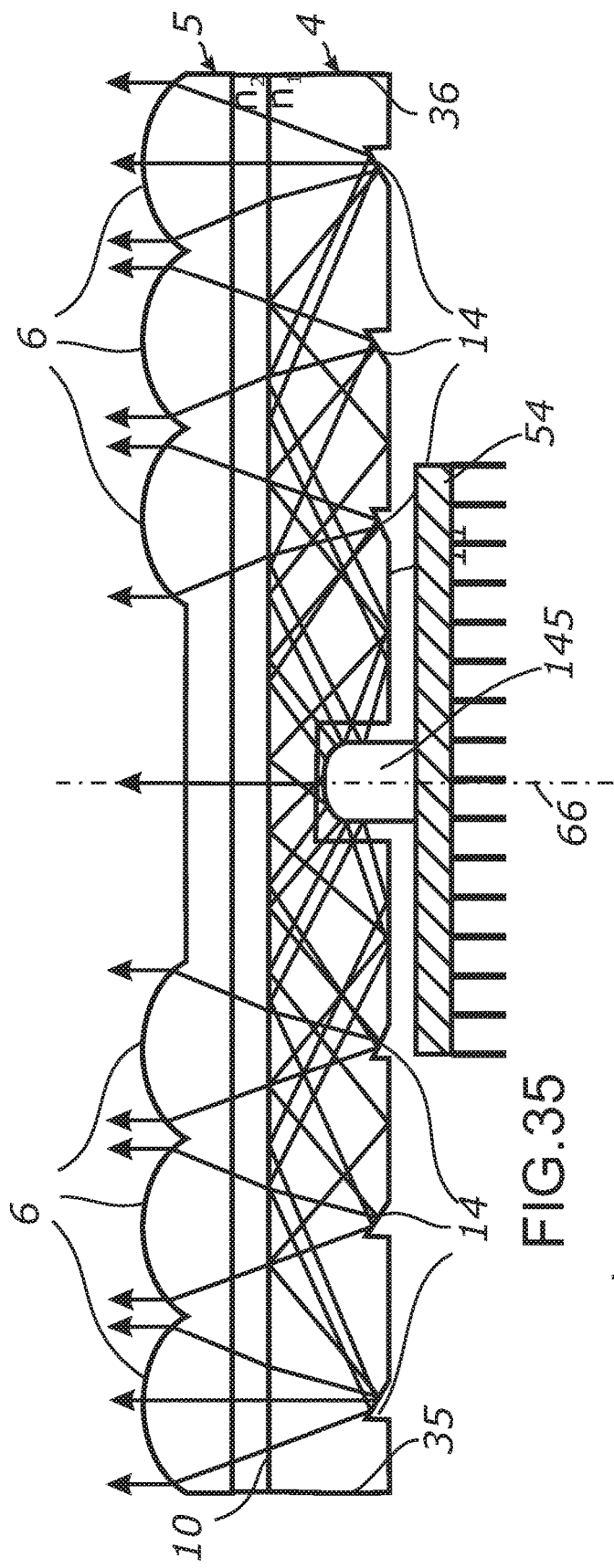
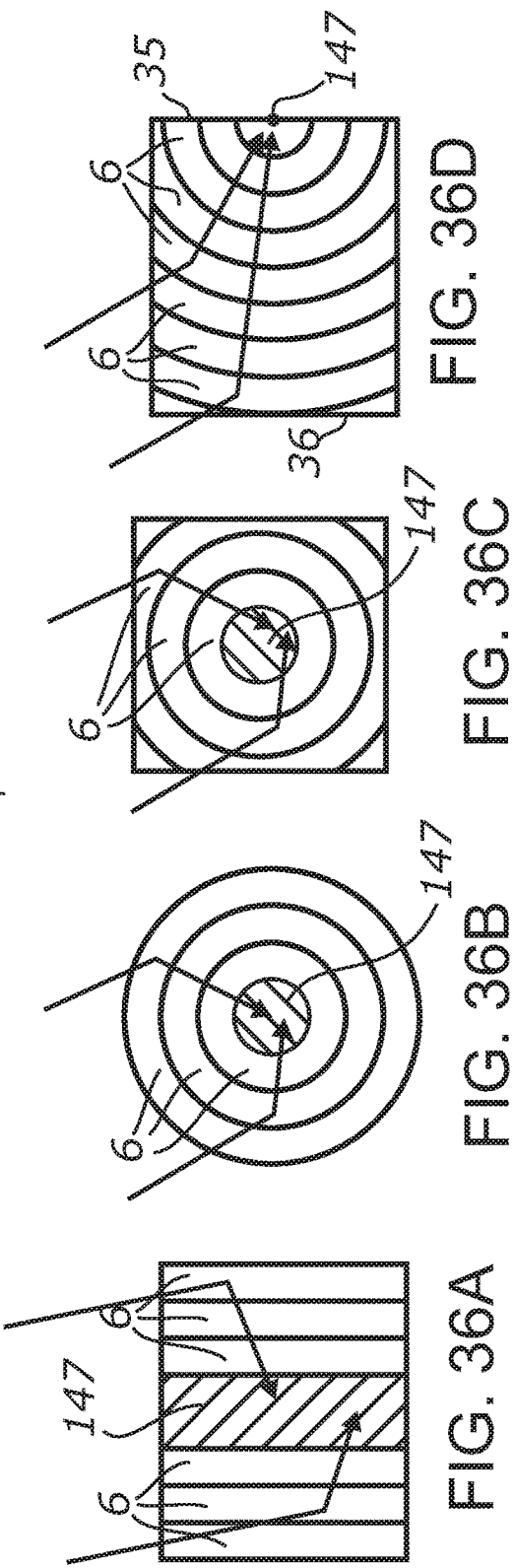
FIG. 35
FIG. 36A FIG. 36B FIG. 36C FIG. 36D

ILLUMINATION SYSTEM USING EDGE-LIT WAVEGUIDE AND MICROSTRUCTURED SURFACES

CROSS-REFERENCE TO RELATED APPLICATIONS

This application is a continuation of application Ser. No. 14/969,898 filed on Dec. 15, 2015, which is a continuation of application Ser. No. 12/764,867 filed on Apr. 21, 2010, now U.S. Pat. No. 9,256,007, which claims priority from U.S. provisional application Ser. No. 61/214,331 filed on Apr. 21, 2009, incorporated herein by reference in its entirety, and from U.S. provisional application Ser. No. 61/339,512 filed on Mar. 6, 2010, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

The present invention relates to a optical reflecting devices and more particularly to an apparatus for collecting or distributing radiant energy, into or from an optical waveguide.

2. Description of Background Art

Devices for collecting or concentrating a parallel beam of electromagnetic energy have conventionally employed reflective mirrors or refractive lenses. These devices collect energy in a broad spectrum from the entire area of the device and focus it onto a smaller area disposed at a considerable distance above or beneath the device and requires a fairly complex structure which occupies substantial volume.

Increasingly, light collection systems, including light detectors and concentrators, need to be configured for inputting light into a waveguide, such as an optical fiber or transparent rectangular plate, so it can be propagated along the waveguide by means of total internal reflection. In a conventional system, the spatially distributed light flux is input into a waveguide through one of its terminal ends using relatively large optical elements such as lenses and mirrors. Although the light guides themselves are typically slim and space efficient, the additional optics necessary for collecting or distributing the light over a large area leads to increased cost and system volume. In response to these shortcomings, the utility of the devices is hampered while numerous spatially-sensitive applications are rendered impractical.

Luminescent concentrators are also found in the industry for trapping incident radiation in a light guide by absorbing and re-radiating it in the form of scattered light at a longer wavelength using luminescent centers distributed in the volume of the light guide. However, because of the scattered nature of the reradiated light, only a portion of it can become trapped in the light guide by the total internal reflection, while the rest of the light escapes from the light guide. Furthermore, the luminescent centers can absorb or scatter already trapped light thus making the light guide less transparent and less efficient.

A holographic concentrator known in the art, utilizes a hologram layer that bends the incident light by means of diffraction so that it becomes trapped in a transparent light guide. However, at least a portion of the diffracted light is lost at each bounce from the same holographic layer guide due to re-coupling.

None of the previous efforts provides an efficient solution for light collection or concentration into a waveguide through its longitudinal face while maintaining a low system profile.

Conventional reflective mirror and refractive lens devices collimate electromagnetic energy across a broad energy spectrum from the entire area of the device and either focus it onto a smaller area disposed at a considerable distance above or beneath the device or collimate and direct it into a predetermined direction or onto a target. These devices are fairly bulky structures occupying substantial volume.

For example, in a conventional system, the primary optical element (e.g., mirror or lens) is focused at the location where the light emitting or light receiving element is disposed. Considering that the focus is usually located at a considerable distance from the primary optical element, the resulting volume formed by a three-dimensional shape enveloping the optical element's aperture and the focal point is considerably larger than the volume of the optical element itself. This increases system size, weight, and cost, while hampering utility of the system.

Many applications require the optical system to provide homogeneous irradiance distribution or another desired illumination pattern on a target. Examples are projection display systems requiring uniform light distribution from a light source on a target screen or optical collector where the light has to be collected and more evenly distributed across a light receiving device.

Numerous light processing systems require light to be input into a waveguide, propagated along the waveguide, and extracted from the waveguide to illuminate a designated target or pattern. In a conventional system, the light is extracted from a waveguide through one of its terminal ends and is further collimated by an optical system whose focus is disposed in the vicinity of the area where the light exits the waveguide. The inclusion of additional optics increases cost and system volume rendering the designs impractical in space-limited applications.

In another conventional system a planar waveguide is employed which extracts light from a lateral face of the waveguide by means of a number of light deflecting elements embedded into the waveguide or attached to its lateral face. Although this latter approach is more space efficient than the former one, the light comes out of the waveguide substantially uncollimated due to the inherent divergence of the light propagating in the waveguide which results in the substantial divergence of light extracted from the waveguide.

In addition, modern illumination systems often utilize compact and discrete light sources, such as Light Emitting Diodes (LEDs). Use of these light sources often results in unwanted glare problems, particularly in some general lighting applications or display lights. Typically, these problems are addressed by adding conventional and bulky optical systems, collimators and diffusers that at least partially negate the advantages of LEDs such as compactness and energy efficiency.

Accordingly, prior illumination efforts have failed to provide an efficient solution for extracting light from a waveguide through its longitudinal face with efficient light collimation. These needs and others are met within the present invention, which provides an improved optical system for distributing light along a waveguide and extracting the distributed light from the waveguide with minimum space consumption and improved light collimation.

BRIEF SUMMARY OF THE INVENTION

The present invention solves a number of light collection and distribution problems within a compact system. Light is directed through a waveguide configured with deflection means for redirecting light to/from a collimating means.

In a first portion of the invention, apparatus and methods are described for collecting and concentrating radiant energy, more particularly, to collecting light from a distant light source and injecting the light into an optical light guide (also referenced heretofore as a "waveguide"), concentrating light guides, radiation detectors, optical couplers, solar thermal and photovoltaic concentrators, and day lighting systems. In at least one embodiment, the present invention describes a collector which provides light collection in response to collecting incident light by a collector array and injecting the light into a planar waveguide through its light conducting wall, trapping the light in the waveguide by means of at least a total internal reflection and guiding the light to a terminal end of the waveguide.

A compact light collection system including a planar waveguide and a collector array are described. The waveguide comprises a plurality of light deflecting elements optically coupled to the waveguide. The collector array comprises a plurality of mini-collectors configured to collect light from a larger area and focus the incident light onto respective light deflecting elements characterized by a substantially smaller area. Each light deflecting element is configured to receive a light beam and redirect it at an angle with respect to a surface normal angle (perpendicular to both axis) of the prevailing plane of the waveguide greater than a critical angle at which the light beam becomes trapped in the waveguide and can propagate toward the terminal end of the waveguide by optical transmission and total internal reflection (TIR).

Disposed in the radiant energy flux transformation system is a primary linear focus concentrating collector formed by a plurality of cylindrical slat-like reflectors and a secondary elongated collector. The reflectors of the primary collector generally have concave or planar transversal profiles and are positioned in a stepped arrangement with longitudinal axes being parallel to each other and to the secondary collector. The reflectors are tilted away from the direction of the source of radiant energy at a range of angles being less than 45° to reflect and direct the incident energy flux to a common focal region located below the primary collector where the concentrated flux is intercepted and further transformed by the secondary collector. In addition to efficient concentrating of radiant energy such as sunlight, the system can provide uniformity or a desired energy distribution in the concentrated flux.

A second portion of the invention describes a device and method for collimating and distributing radiant energy, more particularly, to guiding the light by an optical waveguide (light guide) and extracting the light from the waveguide with improved light collimation. More generally, it also relates to a device intercepting the divergent light from a light source and directing the light into a collimated beam such as flashlights, spotlights, flood lights, LED collimators, lanterns, headlamps, backlight or projection display systems, accent lights, various other illumination devices, optical couplers and switches, and the like. In at least one embodiment, the present invention describes an illuminator which provides light collimation by extracting light from a planar waveguide through its lateral light conducting face in response to an array of discrete light deflecting means optically coupled to the waveguide and further collimated by a matching array of light collimating means. Other objects and advantages of this invention will be apparent to those skilled in the art from the following disclosure.

The invention is amenable to being embodied in a number of ways, including but not limited to the following descriptions.

At least one embodiment of the invention is configured as an apparatus for light collimation and distribution, comprising: (a) a planar waveguide having an optically transparent planar material having edges disposed between a first planar surface and a second planar surface; in which the planar waveguide is configured to receive light on one edge of the planar material, and to propagate the received light through the planar waveguide in response to optical transmission and total internal reflection; (b) a plurality of light collimating elements within a collimating array which is disposed in an optical receiving relationship with a planar surface of the planar waveguide; and (c) a plurality of light deflecting elements optically coupled to the waveguide and configured for deflecting light propagating through the planar waveguide at a sufficiently low angle, below the predetermined critical angle for total internal reflection (TIR), with respect to a surface normal direction of an exterior surface of the planar waveguide to exit the planar waveguide and enter the collimating array. Each of the plurality of light deflecting elements is in a predetermined alignment with each of the plurality of light collimating elements. The device operates in response to light received on the edge of the planar waveguide being angularly redirected, collimated, and distributed from the surface of the collimating array which is optically coupled to the planar waveguide.

In at least one implementation, the plurality of light collimating elements comprises a parallel array of elongated lenticular lenses, or parallel array of elongated focus mirrors. In at least one implementation, the plurality of deflecting elements comprises a parallel array of grooves. These elements and grooves are preferably elongated, such as in response to comprising a one-dimensional array spanning across a width equivalent to the entire waveguide surface, or a substantial portion thereof. In at least one implementation, the grooves are configured at a slope angle $\theta_{30}$ which is bounded by the relation $$\arcsin\left(\frac{n_2}{n_1}\right) \le \theta_{30} \le \arccos\left(\frac{n_2}{n_1}\right)$$

in which $n_1$ is the refractive index of the planar waveguide and $n_2$ is the refractive index of an outside medium.

In alternative implementations, the grooves can be configured in different ways. In at least one implementation, the plurality of light deflecting elements comprises grooves within (e.g., cut or molded into) the planar waveguide configured for redirecting the received light in response to reflection from at least one surface of the groove toward the collimating array. In at least one implementation, the light deflecting elements comprise grooves formed within each of a plurality of blocks that are attached and in optical communication with the planar waveguide, and the grooves are configured for redirecting the received light in response to reflection from at least one surface of the groove toward the collimating array. In at least one implementation, each of the grooves has a transparent surface and a reflective surface, and light received from the planar waveguide passes through the transparent surface of each of the grooves to be reflected from the reflective surface of each of the grooves toward the collimating array. In at least one implementation, the grooves comprise a prismatic groove or ridge formed in a surface of the planar waveguide disposed toward the collimating array for refractively deflecting the received light impinging on the prismatic groove to pass through the prismatic groove or ridge to exit the planar waveguide.

In at least one implementation, the plurality of light collimating elements is selected from the group consisting of imaging lenses, non-imaging lenses, spherical lenses, aspherical lenses, lens arrays, Fresnel lenses, TIR lenses, gradient index lenses, diffraction lenses, mirrors, Fresnel mirrors, spherical mirrors, parabolic mirrors, mirror arrays, and trough mirrors.

In at least one implementation, the plurality of light deflecting elements is selected from the group consisting of planar mirrors, curved mirrors, prisms, prism arrays, prismatic grooves, surface relief features, reflective surfaces, refractive surfaces, diffraction gratings, holograms, and light scattering elements.

In at least one implementation, an optical interface layer is disposed between the planar waveguide and the collimating array. In at least one implementation, the optical interface layer has a lower refractive index than the planar waveguide, and in at least one implementation, the optical interface layer comprises air. In at least one implementation, the optical interface layer is selected from the group of optical materials consisting of low refractive index monomers, polymers, fluoropolymers, low-n optical adhesives, thin films, and optical waveguide cladding materials.

In at least one implementation, at least one illumination source is optically coupled to at least one edge of the planar waveguide. In at least one implementation, one or more illumination sources is optically coupled to the edges of one or more cutouts within the planar waveguide.

In at least one implementation, both the collimating array and the planar waveguide have a round or sectorial shape, such as obtainable in response to revolving a cross section of the collimating array and the planar waveguide around an axis.

In at least one implementation, the collimator array comprises point focus lenses, or mirrors, having a shape selected from the group consisting of round, rectangular, square, and hexagonal.

In at least one implementation, the planar waveguide comprises a rectangular plate having a first terminal edge, a second terminal edge, a first side wall, a second side wall, the first planar surface and the second planar surface. Although it should be appreciated that the rectangular plate can be bent, or otherwise slightly curved, while retaining a substantially rectangular planform. And more particularly, the combination of collimator and waveguide, along with any intermediary layers, are adapted in at least one implementation to support bent and/or rolled configurations. In at least one implementation, a mirrored surface is added to one or more of the first terminal edge, the second terminal edge, the first side wall and the second side wall. In at least one implementation, a cladding layer is added to one or more of the first terminal edge, the second terminal edge, the first side wall and the second side wall.

In at least one implementation, the planar waveguide and collimator array are adapted for being retained in a translated, a reversed and/or a rotated orientation relative to each other toward achieving a adjusting the light distribution or collimation pattern. In at least one implementation, the planar waveguide and collimator array are adapted for being retained in a movable relationship with one another toward adjusting the light distribution or collimation pattern. In at least one implementation, a coating is disposed on the exterior of said planar waveguide and/or said collimator array, such as including any of the following coatings or combination of coatings thereof: anti-reflective, protective, encapsulates, reflective, diffusive, radiation protective, scratch and stain resistant, and light filtering.

At least one embodiment of the invention is configured as an apparatus for light collimation and distribution, comprising: (a) a planar waveguide having an optically transparent planar material configured to receive light on one edge of the planar material, and to propagate the received light through the planar waveguide in response to optical transmission and total internal reflection; (b) a parallel collimating array having a plurality of elongated light collimating lenses disposed in an optical receiving relationship with a planar surface of the planar waveguide; and (c) a parallel deflecting array having a plurality of elongated light deflecting grooves within the planar waveguide which are configured for deflecting light propagating through the waveguide at a sufficiently low angle, below the predetermined critical angle for total internal reflection (TIR), with respect to a surface normal direction of an exterior surface of the planar waveguide to exit the planar waveguide and enter the parallel collimating array. Each of elongated light deflecting grooves is preferably positioned in a predetermined alignment with each of the plurality of elongated light collimating lenses. In operation, the light received on the edge of the planar waveguide is angularly redirected, collimated, and distributed from the surface of the parallel collimating array which is optically coupled to the planar waveguide.

At least one embodiment of the invention is configured as a method for distributing radiant energy comprising: (a) receiving radiant energy into an edge of an optical waveguide having edges disposed between a first planar surface and a second planar surface; (b) propagating the radiant energy by optical transmission and total internal reflection in an optical material disposed between the first planar surface and the second planar surface along the length of the optical waveguide; (c) deflecting the radiant energy at a plurality of deflecting elements distributed along the first planar surface and/or second planar surface of the optical waveguide to a sufficiently low angle, below the predetermined critical angle for total internal reflection (TIR) which is with respect to a surface normal direction of the first planar surface or second planar surface of the optical waveguide, causing the radiant energy to exit the surface of the optical waveguide through the first planar surface and/or the second planar surface; and (d) collimating the radiant energy exiting the optical waveguide at a plurality of focal zones in response to the radiant energy passing through a plurality of radiation collimating elements.

At least one embodiment of the invention is configured as an apparatus for collecting light, comprising: (a) a plurality of light collecting elements within a collector array configured for collecting received light; (b) a planar waveguide having edges disposed between a first planar surface and a second planar surface, in which the planar waveguide is disposed in an optical receiving relationship with the collector array and configured to propagate the received light by optical transmission and total internal reflection; and (c) a plurality of light deflecting elements optically coupled to the planar waveguide with each of the plurality of light deflecting elements disposed in energy receiving relationship within the planar waveguide to at least one of the plurality of light collecting elements. Each of the light deflecting elements is configured to redirect incident light at a sufficiently high angle, above the predetermined critical angle for total internal reflection (TIR) with respect to a surface normal direction with respect to the first planar surface or the second planar surface of the planar waveguide, to redirect and propagate the received light within the planar waveguide by optical transmission and TIR.

In different embodiments and implementations the light collecting and light deflecting elements can differ. In at least one embodiment, the light collecting elements comprise a parallel array of elongated focus mirrors. In at least one embodiment, the light collecting elements comprise a parallel array of elongated lenticular lenses. In at least one embodiment, the light deflecting elements comprise a parallel array of elongated grooves. In at least one embodiment, the light deflecting elements comprise grooves within the planar waveguide configured for redirecting the received light in response to reflection from at least one surface of the groove toward the collector array. In at least one embodiment, the light deflecting elements comprise grooves formed within each of a plurality of blocks that are attached and in optical communication with the planar waveguide, and the grooves are configured for redirecting the received light in response to reflection from at least one surface of the groove toward the collecting array. In at least one implementation, the grooves are configured at a slope angle $\theta_{30}$ which is bounded by the relation $$\arcsin\left(\frac{n_2}{n_1}\right) \leq \theta_{30} \leq \arccos\left(\frac{n_2}{n_1}\right)$$

in which $n_1$ is the refractive index of the planar waveguide and $n_2$ is the refractive index of an outside medium.

In at least one embodiment, the light deflecting elements are selected from the group of optical elements consisting of planar mirrors, curved mirrors, prisms, prism arrays, prismatic grooves, surface relief features, reflective surfaces, refractive surfaces, diffraction gratings, holograms, and light scattering elements. In at least one embodiment, the light collecting elements are selected from the group of optical elements consisting of imaging lenses, non-imaging lenses, spherical lenses, aspherical lenses, lens arrays, Fresnel lenses, TIR lenses, gradient index lenses, diffraction lenses, mirrors, Fresnel mirrors, spherical mirrors, parabolic mirrors, mirror arrays, and trough mirrors.

In at least one implementation, an optical interface layer is added between the planar waveguide and the collector array, which preferably comprises a lower refractive index (e.g., air, or other material) than the planar waveguide. In at least one implementation, the optical interface layer is selected from the group of optical materials consisting of low refractive index monomers, polymers, fluoropolymers, low-n optical adhesives, thin films, and optical waveguide cladding materials.

In at least one implementation, the planar waveguide comprises a substantially rectangular plate having a first terminal edge, a second terminal edge, a first side wall, a second side wall, a first planar surface and a second planar surface. In at least one implementation, a mirrored surface, or a cladding layer, is added on one or more of the first terminal edge, the second terminal edge, a first side wall or a second side wall.

In at least one implementation, at least one optically responsive electronic device is coupled to at least one of the first terminal edge or the second terminal edge of the planar waveguide. In at least one implementation, the electronic device can be optically coupled to a cutout within the planar waveguide. In at least one implementation, any optional cladding or protective coatings are removed from the light harvesting area, such as from the first or second terminal edge, and/or the first or second side wall, to facilitate light transport and harvesting in the harvesting area.

In at least one implementation, both the collector array and the planar waveguide have a round or sectorial shape obtainable by a revolution of a cross section of the collector array and the planar waveguide around an axis.

In different implementations the collector array can be differently configured. In at least one implementation, the collector array comprises point focus lenses, or mirrors, which may have a shape such as round, rectangular, square, hexagonal, and so forth.

In at least one implementation, the planar waveguide and the collector array are adapted for being retained in either a planar configuration or in bent and/or rolled configurations.

In at least one implementation, the planar waveguide and collector array are adapted for being retained in a translated, a reversed and/or a rotated orientation relative to each other toward adjusting the acceptance angle or for tracking the source of light. In at least one implementation, the planar waveguide and collector array are adapted for being retained in a movable relationship with one another adjusting the acceptance angle or for tracking the source of light. In at least one implementation, a coating is disposed on the exterior of said planar waveguide and/or said collector array, such as including any of the following coatings or combination of coatings thereof: anti-reflective, protective, encapsulates, reflective, diffusive, radiation protective, scratch and stain resistant, and light filtering.

At least one embodiment of the invention is configured as an apparatus for collecting light, comprising: (a) a parallel collecting array having a plurality of elongated light collecting structures configured for collecting received light; (b) a planar waveguide having edges disposed between a first planar surface and a second planar surface, in which the planar waveguide is disposed in an optical receiving relationship with the collector array and configured to propagate the received light by elements of optical transmission and total internal reflection; and (c) a parallel deflecting array having a plurality of light deflecting groove structures optically coupled to the planar waveguide with each of the plurality of light deflecting structures disposed in light receiving relationship within the planar waveguide to at least one of the light collecting groove structures. Each of the plurality of light deflecting groove structures is configured to redirect incident light at a sufficiently high angle, above the predetermined critical angle for total internal reflection (TIR) with respect to a surface normal direction of an exterior surface of the planar waveguide, to redirect and propagate the received light within the planar waveguide by optical transmission and TIR.

At least one embodiment of the invention is configured as a method for collecting radiant energy comprising: (a) concentrating a radiant energy received upon a plurality of focal zones in response to a plurality of radiation concentrator elements; (b) directing the radiant energy from the plurality of focal zones through a first planar surface into an optical waveguide having edges disposed between a first planar surface and a second planar surface; (c) deflecting the radiant energy at a plurality of deflecting elements positioned to receive the radiant energy from the focal zones, and to deflect the radiant energy into the planar waveguide at angles exceeding the critical angle of total internal reflection in the waveguide, which is with respect to a surface normal direction of the first planar surface or second planar surface of the optical waveguide; and (d) propagating the radiant energy through the optical waveguide by optical transmission and total internal reflection.

The present invention provides a number of beneficial elements which can be implemented either separately or in any desired combination without departing from the present teachings.

An element of the invention is an apparatus and method of collecting light over a given area and traveling in a first direction, into a waveguide region directed in a second direction which can have any desired angular relationship with the first direction.

Another element of the invention is the inclusion of distributed deflecting means within the interior of the waveguide.

Another element of the invention is the coupling of a collimation means, such as a lens array, to the waveguide either directly, or with an interposing material or air layer.

Another element of the invention is the use of reflective or refractive deflecting means operating within the waveguide.

Another element of the invention is the use of deflecting elements attached to the waveguide.

Another element of the invention is the use of deflecting elements attached cut into the waveguide.

Another element of the invention is the use of deflecting elements which extend from the waveguide.

Another element of the invention is the use of deflecting means having at least one reflective or refractive, surface for redirecting the light in relation to the waveguide.

Another element of the invention is the use of deflecting means comprising a facet containing both a reflective and transmissive surface for redirecting the light in relation to the waveguide.

Another element of the invention is the use of deflecting means comprising a facet containing both a reflective and transmissive surface for redirecting the light in relation to the waveguide.

Another element of the invention is the use of deflecting means which may be on the same, or opposite, side of the waveguide as the collimating means.

Another element of the invention is the use of a linear array of deflecting and/or collimating means which span the surface of the device, or a portion thereof.

Another element of the invention is the use of separate deflecting and/or collimating means which are optically coupled to a specific deflecting and/or collimating means.

Another element of the invention is a collimating means operating in response to refraction and/or reflection to direct light into or from the adjacent waveguide.

Another element of the invention is a light collimating or distribution device configured for performing light collimation on either side of the waveguide device.

Another element of the invention is a light collimating and/or distribution device which can be formed in a point form, linear form, annular form, as well as portions and combinations thereof.

Another element of the invention is a collimating and/or distributing device configured with an attached optically responsive device (e.g., sensor) or optical illumination device.

A still further element of the invention is a light collection and/or distribution device which can be utilized in a wide range of light collecting, light sensing, and light distribution applications.

Further elements of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIGS. 1A and 1B are ray tracing diagrams for conventional light collection systems.

FIG. 14 is a cross section view of a collector device coupled to a photoresponsive device according to at least one embodiment of the present invention.

FIG. 15A through 15D are facing views of collector devices of configurations according to different embodiments of the present invention.

FIG. 35 is a cross section and ray tracing of a combination illuminator device and light source, according to at least one embodiment of the present invention.

FIG. 36A through 36D is a facing view of illuminator arrays using lenticular lenses, according to different embodiments of the present invention.

DETAILED DESCRIPTION OF THE INVENTION

Referring more specifically to the drawings, for illustrative purposes the present invention is embodied in the apparatus generally shown in the preceding figures. It will be appreciated that the apparatus may vary as to configuration and as to details of the parts, and that the method may vary as to the specific steps and sequence, without departing from the basic concepts as disclosed herein. Furthermore, elements represented in one embodiment as taught herein are applicable without limitation to other embodiments taught herein, and in combination with those embodiments and what is known in the art.

1. Collector Embodiments

A wide range of applications exist for the present invention in relation to the collection of electromagnetic radiant energy, such as light. Therefore, for the sake of simplicity of expression, without limiting generality of this invention, the term "light" will be used herein although the terms "electromagnetic energy" or "radiant energy" would also be appropriate.

In order to be able to compare and contrast the present invention with typical collectors, FIG. 1A and FIG. 1B are shown to illustrate the operation of conventional light collection systems typically employing a large-aperture optical collector device, such as lens 75 (FIG. 1A) or a mirror 85 (FIG. 1B). Each lens 75 and mirror 85 can be characterized by a transversal size D and a focal length F. In the prior art, a radiation receiver 45 is usually placed in the focus of the lens or mirror at a considerable distance from the collector. Rays 80 and 81 incident onto the aperture of the collector are being directed to radiation receiver 45. It will be appreciated by those skilled in the art, that in order to obtain useful light concentration, dimension D of the collector should be significantly larger than the finite transversal size Ds of radiation receiver 45. The focal length F, or the height of the collector, also needs to be significantly greater than Ds for proper collection. The culmination of these dimensional relations requires significant system size and weight penalties which can be detrimental to implementation in space constrained applications.

Figure 2:
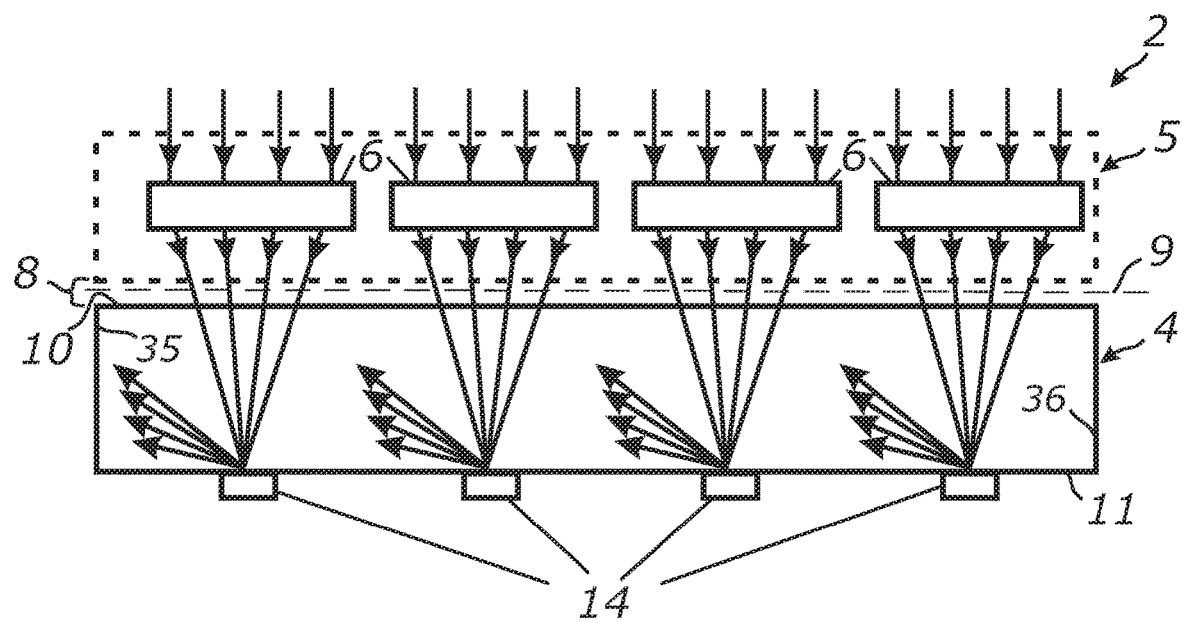
FIG. 2 is a schematic view and ray tracing of a compact light collection system in accordance with at least one embodiment of the present invention.

FIG. 2 illustrates a first embodiment 2 of a compact light collecting system. Light collection system 2 includes a planar collector array 5 and a planar waveguide 4 configured to conduct light through it, such as along and between its opposing parallel walls 10 and 11 by means of optical transmission and total internal reflection (TIR). The shape and lateral dimensions of collector array 5 approximate those of waveguide 4. In at least one preferred embodiment, collector array 5 is disposed in close proximity to waveguide 4 so that the combination of collector array 5 and waveguide 4 form a planar sandwich-like configuration.

Collector array 5 comprises a plurality of light focusing means 6 arranged in a planar array. Each focusing means 6 is configured to receive an impinging beam of light, as may emanate from a distant light source (not shown), on its receiving surface in a pre-determined acceptance angle and to focus this incident light onto a smaller focal area so that collector array 5 forms a plurality of foci. The light source can be of any known type, including but not limited to sunlight, incandescent lamps, heat emitting bodies, light emitting diodes, lasers, light/heat scattering or radiating surfaces and the like. The incident beam can also be formed by an optical system providing a suitable angular and/or spatial energy distribution in the beam. For example, a light collimating device can be used to produce a generally parallel beam of light that will impinge onto focusing means 6. In another example, if the energy source is the sun, the incident light is a quasi-parallel beam of light in a broad spectrum of electromagnetic spectrum. Collector array 5 is configured to have an entrance aperture facing the light source and an opposing exit aperture facing waveguide 4.

Focusing means 6 may comprise any desired optical structure adapted for collecting or concentrating the impinging light. Any known optical system or collector of radiant energy or light which collects the energy from a larger area and focuses it to a smaller focal area can be used for the purpose of this invention. By way of example and not limitation, focusing means 6 can be selected from the group of optical elements consisting essentially of spherical or aspherical refractive lenses, Fresnel lenses, TIR lenses, gradient index lenses, diffraction lenses, lens arrays, mirrors, Fresnel mirrors, mirror arrays and the like. For the purpose of this invention and from the practical standpoint, the terms "focal area" or "focus" of focusing means 6 should be understood broadly and generally refers to an area within the envelope of the focused beam where said area has a cross section substantially smaller than the cross section of respective focusing means 6. Accordingly, the focal area can include areas at a relatively small distance from the "ideal" focus of focusing means 6 and where the focused beam can be convergent (before focus) or divergent (after focus).

In accordance with this invention, it is preferred that an effective focal length of each focusing means 6 is substantially shorter than the dimensions of walls 10 and 11 in order to achieve better compactness of system 2. For the purpose of this invention, the term "effective focal length" generally refers to the distance between focusing means 6 and its focus. This term should also be understood broadly and it also includes the cases when the focal length of the same focusing means 6 can change depending on the optical properties of the material filling up the space between said focusing means 6 and the focus. In other words, the location of the effective focal area may be different (thus focal length differs) when a different material separates lens 6 and its focal area. By way of example, for the same parameters of focusing means 6, its focal distance can be longer in high refractive index material (e.g., polymethyl methacrylate (PMMA)) than in the air due to the difference in refractive indexes.

Waveguide 4 is positioned in close proximity and generally parallel to collector array 5 and is disposed in an energy receiving relationship, through transparent wall (face) 10, with respect to collector array 5. The energy receiving relationship is meant to mean any relationship between waveguide 4 and collector array 5 which enables light to pass from collector array 5 into waveguide 4. For this purpose, wall 10 of waveguide 4 is configured to transmit a substantial portion of light incident onto the waveguide from collector array 5.

Waveguide 4 can be formed by any optically transmissive body having a generally planar configuration and suitable for the purpose of conducting electromagnetic radiation toward a terminal end or a pre-determined portion of the waveguide by means of reflection of the propagating light from the opposing walls. By way of example, it can be an optically transparent planar plate or a slab having a rectangular or circular shape. Referring back to FIG. 2, an exemplary configuration of waveguide 4 comprises a substantially rectangular plate having light conducting opposing walls 10 and 11 extending parallel to a predominant plane 9, a first terminal end wall 35, an opposing second terminal end wall 36, a first side wall and an opposite second side wall.

The thickness, or height, of waveguide 4 is selected to be substantially less than its lateral dimensions (length and width) so that the surface area of either planar wall 10 or 11 is substantially greater than the area of at least one of the terminal walls 35 and 36. Further, waveguide 4 is configured to be able to conduct light along and between at least its light conducting walls 10 and 11 and generally toward at least one of the terminal walls 35 and 36. A light harvesting area can be associated with either of terminal walls 35 or 36 for collecting and converting the light in whatever type of energy which is useful in the application. By way of example, waveguide 4 can be configured so that a light ray propagating in waveguide 4 at a normal angle to walls 10 and 11 greater than a certain angle can be generally guided in one direction toward the opposing face 36 by means of light conduction through the body of waveguide 4, including bouncing of the light from faces 10 and 11.

If used at optical frequencies, waveguide 4 can be made from a dielectric, highly transparent material such as glass, PMMA, or polycarbonate. In order to enhance its optical guiding ability, the material of waveguide 4 can be selected to have high index of refraction, and can be surrounded by a material with lower index of refraction.

It will be appreciated that the larger the incident angle from the surface normal direction, the smaller is the fraction of light transmitted through the medium. Finally, at a sufficient angle from the normal, a point of total internal reflection occurs, which is referred to as the TIR angle. At angles equal to or exceeding the TIR angle, all of the incident light is reflected back into the medium. Accordingly, the structure can guide optical waves in response to total internal reflection, characterized by a critical angle of TIR, so that when a ray of light propagating within waveguide 4 strikes a medium boundary (such as wall 10 or 11) at an angle larger than the critical angle of TIR with respect to the normal of the boundary surface plane, the ray is reflected back into the media of waveguide 4 so it can propagate further in said waveguide. Walls 10 and 11 should normally be smooth or polished so as to avoid or minimize parasitic light scattering when undergoing TIR from said walls. When appropriate, wall 11 can be adapted with a mirrored surface to enhance light guiding properties of waveguide 4. Additionally, the other walls of waveguide 4 can be made similarly smooth and capable of reflecting light by means of TIR or specular reflection so that the light is kept within the waveguide even when it reaches either of the side walls. Wall 36 can also be made specularly reflective in order to reflect any light arriving at it from the inside of waveguide 4 back into the waveguide. TIR reflectivity for either wall of waveguide 4 can be provided, for example, by making contact by the wall with a lower refractive index medium, such as the air, or by applying a layer of a low-n cladding material to the wall. A specular reflectivity can be obtained in any desired manner, including but not limited to the use of metallization, application of reflective films or other types of mirror finishing to further enhance the ability of the waveguide to conduct light.

In accordance with at least one preferred embodiment, waveguide 4 should be optically separated from collector array 5 by at least one optical interface 8 that provides trapping of the light propagating in the waveguide after it has been deflected by deflecting means 14. The primary function of interface 8 is to allow light to enter waveguide 4 from a variety of incidence angles and reject (by reflection) the light coming back out of waveguide 4.

A suitable optical interface 8 can be created by various mechanisms. For example, when the total internal reflection is used for trapping the light in waveguide 4, interface 8 may comprise a physical boundary or wall of the body of waveguide 4 which is surrounded by outside media with lower refractive medium such as air. Alternatively, it can be an interface between two media having different refractive indices so that the refractive index increases along the optical path from focusing means 6 toward waveguide 4. Interface 8 can be implemented by separating waveguide 4 from the body of collector array 5 or from bodies of individual focusing means 6 by means of a thin layer of air, a layer of lower refractive index dielectric medium or any other boundary between a higher refractive index medium and a lower refractive index medium. In a more specific example, interface 8 can be implemented from an interface between glass, PMMA or polycarbonate (high refractive index) and a low refractive index polymer or air. Alternatively, a layer of cladding material can be provided between waveguide 4 and collector array 5 in which case, embodiment 2 of FIG. 2 can form a monolithic system while maintaining the same basic structure and operation. By way of example and in order to illustrate one or more of the preferred modes of utilizing the present invention, interface 8 is formed by wall 10 of high-refraction-index waveguide 4 and the surrounding ambient low-refraction-index media (such as air) in FIG. 2.

Waveguide 4 comprises a plurality of light deflecting means 14 associated with wall 11 and optically coupled to waveguide 4. The term "optically coupled" is directed to mean any relationship between two optical components which enables light to pass from one optical component to the other. Deflecting means 14 can be any suitable optical device used to receive the light beam in a pre-determined acceptance angle from one direction and deflect at least a substantial portion of the incident beam from its original direction to a different direction. By means of example, deflecting means 14 can include a reflective surface or a refractive element or face disposed at an angle to the incident light beam. Similarly, deflecting means 14 can be selected from the group of deflecting means consisting essentially of planar mirrors, curved mirrors, mirror array, prisms, prism arrays, one or more reflective or refractive surfaces, diffraction gratings, holograms, light diffusing or scattering elements, and so forth.

The location of deflective means 14 in waveguide 4 and the position of the waveguide itself with respect to collector array 5 are interoperably selected with each deflecting means 14 disposed at or near the focus of one or more focusing means 6 (see FIG. 2). It is an important aspect of the present invention that the working area of light deflecting means 14 is substantially smaller than the entrance aperture of the respective focusing means 6 illuminating said deflecting means 14. In other words, each focusing means 6 pre-concentrates the incident radiation from a larger area into a smaller focal area while the respective deflecting means 14 is configured to collect the concentrated light from the focal area and redirect the light into waveguide 4 at a different angle than the angle of incidence. The light receiving surface, or entrance aperture, of each focusing means 6 should also be sufficiently spaced apart from the respective deflecting means 14 to allow for efficient focusing of light. Yet, the distance between collector array 5 and waveguide 4 should be kept small compared to the lateral dimensions of collector 2 toward enhanced system compactness.

Each deflecting means 14 is configured to receive the light beam which is focused by focusing means 6 and redirect it into waveguide 4 at a different angle with respect to the angle of incidence. It is essential that at least a substantial portion of the redirected beam proscribe an angle with respect to surface normal of walls 10 and 11 greater than a pre-defined critical angle $\theta_C$, so that the redirected radiation becomes trapped in and propagated through waveguide 4 toward one or more of its terminal ends.

TIR is one such convenient mechanism for trapping light in waveguide 4 in which case critical angle $\theta_C$ can be selected to be the critical TIR angle. It will appreciated by those skilled in the art of optics, that TIR can be defined as the reflection of electromagnetic radiation from an interface between a first and second optical medium in response to an incident angle measured with respect to surface normal of the interface. The first optical medium being more optically dense, and accordingly having a higher index of refraction. It will also be appreciated that in response to TIR almost lossless internal reflections are provided.

According to Snell's law of optics, when light passes through a boundary between a first refractive medium and a second refractive medium, $n_1 \sin \phi_1 = n_2 \sin \phi_2$, where $n_1$ and $n_2$ are the refractive index of the first medium and the second medium, respectively, with $\phi_1$ and $\phi_2$ being the angle of incidence and the angle of refraction, respectively. Furthermore, the critical angle of TIR $\theta_C$ is the value of $\phi_1$ for which $\phi_2$ equals 90°. Accordingly, $\theta_C = \arcsin(n_2/n_1 \cdot \sin \phi_2) = \arcsin(n_2/n_1)$, which makes $\theta_C$ approximately 42.155° for an exemplary case of the interface between PMMA (acrylic) with the reflective index $n_1$ of about 1.49 and air with $n_2$ of about 1.

As discussed above, the condition of TIR at wall 10 can be achieved by providing the refractive index of waveguide 4 which is greater than the refractive index of the outside media contacting waveguide 4 at wall 10. Wall 11 can also be configured to contact an outside media having a lower refractive index than the refractive index of waveguide 4 to allow for reflecting the light trapped in waveguide 4 by means of TIR. Alternatively, or in order to improve the reflection of light from wall 11 in a broad range of angles and/or wavelengths, wall 11 can be mirrored to provide for specular reflection. Mirrored surface of wall 11 can be obtained by depositing a reflective layer using any known means, such as, for example, silvering, aluminizing or laminating with a mirrored film.

In operation, as illustrated in FIG. 2, the collector device can be used to collect a distributed beam of light by a larger entrance aperture of collector array 5 and concentrate the collected energy on the smaller exit aperture of a first terminal end wall 35 of waveguide 4. Each deflecting means 14 receives a focused light beam (illustrated as an incoming fan of rays) formed by focusing means 6 and injects the focused light beam into waveguide 4 at a sharper angle with respect to both walls 10 and 11 (the injected light beam is shown as an outgoing fan of rays in FIG. 2) to provide that the TIR condition is met for each ray in the injected light beam. As discussed above, wall 36 which is opposite to first terminal end wall 35, can be mirror coated to reflect any light (e.g., stray light) back into waveguide 4 and toward wall 35. The dimensions of waveguide 4 are selected so that area of wall 35 is substantially smaller than the area of collector array 5 and wall 10 of waveguide 4. In this case, the light injected into wave guide through the large surface area of wall 10 will arrive at wall 35 with a greater light intensity compared to the intensity found at wall 10. Assuming an ideal case of negligible optical losses in waveguide 4, a geometrical concentration ratio $C_G$ can be found from the following formula:

$$C_G = \frac{S_{IN}}{S_{OUT}},$$

where $S_{IN}$ is the area of wall 10 and $S_{OUT}$ is the area of wall 35. In an exemplary case of a 5 mm thick rectangular waveguide 4 having dimensions of wall 10 of about 20 cm by 10 cm and dimensions of wall 35 of about 10 cm by 0.5 cm, $C_G$ will be approximately equal to $$\frac{20 \text{ cm} \times 10 \text{ cm}}{10 \text{ cm} \times 0.5 \text{ cm}} = 40.$$

This means that the average light intensity at wall 35 will be approximately 40 times greater than the average light intensity impinging on the entrance aperture of collector array 5 or wall 10 of waveguide 4. The concentrated light received at wall 35 can be further directed, extracted from waveguide or converted to any desired form of energy or signal. For this purpose, wall 35 can be configured as transparent and/or can be associated with a light detector or energy conversion device. Alternatively, the wall can be configured to allow for ejecting the concentrated light out of waveguide 4 through walls 10 or 11. For this purpose, wall 35 can be mirrored and inclined at an angle with respect to a surface normal direction of either wall 10 or 11 (for example at an angle of about 45 degrees) thus allowing the light arriving at wall 35 from the inside of waveguide 4 to be reflected from wall 35 and extracted from waveguide 4 toward a perpendicular to plane 9.

By way of a further example and taking an illustrative case of a generally parallel beam emanated by a distant source subtending a relatively small finite angle (such as the beam produced by sunlight or a distant light emitting device), collector array 5 can be designed as a planar lens array.

Figure 3:
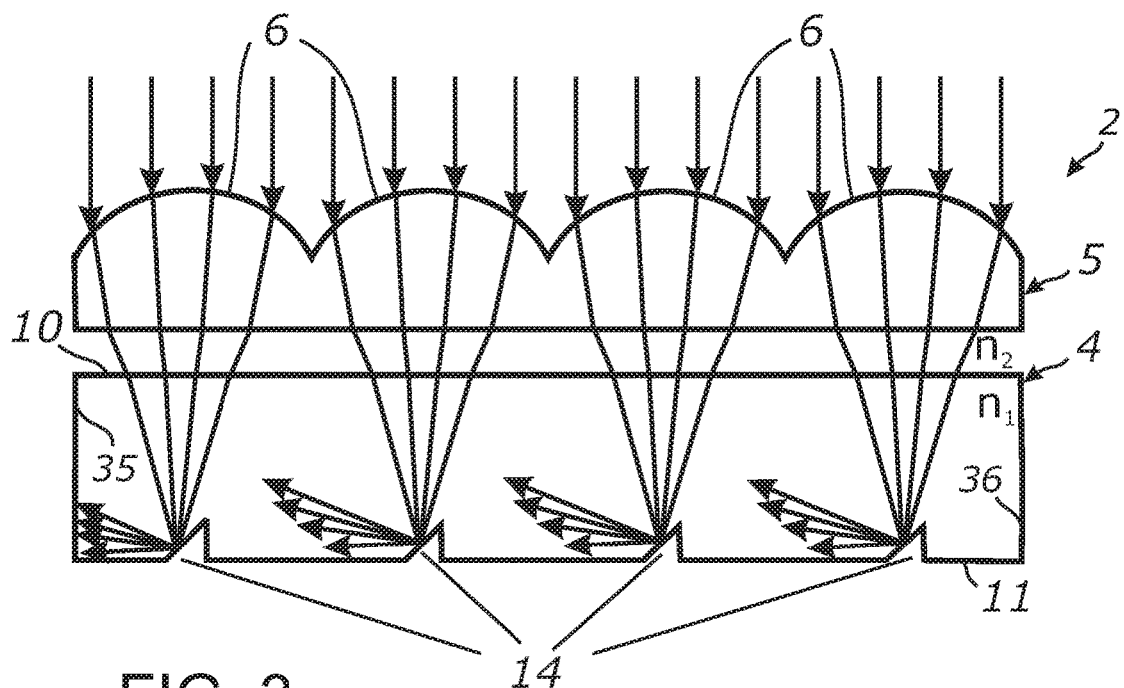
FIG. 3 is a schematic view of the system shown in FIG. 2 according to at least one embodiment of the present invention, showing a planar lens array and prismatic grooved features.

FIG. 3 illustrates an example implementation of embodiment 2, in which collector array 5 comprises a planar lens array where the plurality of collecting means (elements) 6 are each represented by a positive lens (collecting/concentrating) disposed in a planar configuration. The lenses forming the planar lens array can be of any desired configuration which provides for concentration of the received light, including but not limited to lenticular, cylindrical, round, hexagonal, square, rectangular, linear-focus, or point-focus lenses, and can be packed with any desired density covering the entrance aperture of collector array 5. The lens array can be fabricated using any conventional method such as replication, molding, micro-machining, chemical etching, beam etching and the like. The individual lenses can be integrated with collector array 5 and preferably comprise the same material as the body of the array. Alternatively, the lens array can be disposed on a transparent substrate plate and fabricated of the same or a different material than the substrate plate. Individual lenses can also be configured as separate pieces and attached to the substrate plate. Suitable materials include but are not limited to optical glass, polymethyl methacrylate (PMMA), silicone, polycarbonate, polystyrene, polyolefin, any optically clear resin which is obtainable by polymerization and curing of various compositions, and other methods directed at creating a sufficiently optically transparent structure. The placement of lenses in the lens array can be according to any suitable spatial metric and by any desired means. For example, the lenses can be spaced apart, contacting each other or overlapping and can be positioned in any desired pattern in the planar array.

For the purpose of illustrating the present invention, the lens array is selected to be a densely packed lenticular lens array in which each collecting means 6 is represented by a cylindrical lens. Each lens is designed to have a point of focus located outside of the lens array itself, preferably at a pre-determined distance from the lens array, such as at a deflector positioned on an opposing side of a waveguide having a given refractive index. Accordingly, when positioned with one side representing the entrance aperture perpendicular to the incident beam, the planar array of collecting means 6 provides a plurality of foci on the opposite side, the foci being spaced apart from each other in accordance with the spacing of individual lenses in the lens array. With the lens array being planar and individual lenses having an identical optical configuration, the plurality of foci of individual reflecting means 6 provides a common focal plane disposed at a distance from lens array 5.

Referring to FIG. 3, waveguide 4 is shown comprising a substantially planar light guide formed by a transparent plate having a rectangular shape and configured to conduct light by means of TIR along its parallel faces 10 and 11. Waveguide 4 comprises a plurality of deflecting means 14 associated with wall 11, each deflecting means 14 being designed as a parallel grooved structure formed by a tapered prismatic void, V-shaped groove or micro-prism in wall 11, the grooved structure having at least one sloped reflective face. The elongated parallel grooved structures forming deflecting means 14 should preferably have the same spacing and approximately the same extent as the parallel lenticular lenses forming focusing means 6. A "V"-shaped groove can be either symmetric or asymmetric and having faces which can make any suitable individual angles with wall 11.

A variety of methods can be utilized for incorporating the prismatic grooved structures within wall 11 to create the surface relief micro-structures or texture described. By way of example, the structures can be fabricated using a technique for direct material removal including mechanical scribing, laser scribing, micromachining, etching, grinding, embossing, imprinting from a master mold, photolithography, and a plurality of known methods and combinations thereof for structuring optical materials. In addition, the faces of prismatic grooved structures can be optionally polished, as desired, to obtain any desired level of polished smooth surface. Alternatively, waveguide 4 can be fabricated to incorporate embedded grooves, such as by means of casting, injection molding, compression molding, or similar processes and combinations of molding and machining processes thereof.

Alternatively, waveguide 4 can incorporate a layer of transparent material, such as a plastic film or thin transparent plate, attached to face 11 and the prismatic grooved structures can be formed in that layer. Various mechanisms, including optical lithography, can be used to create the required pattern in a light-sensitive chemical photo resist by exposing it to light (typically UV) either using a projected image or an optical mask with the subsequent selective removal of unwanted parts of the thin film or the bulk of a substrate.

In a further alternative, the transparent material can be overmolded onto waveguide 4 in the respective areas and prismatic grooved structures can be formed in the over mold. By way of example, and not limitation, a negative replica of the grooves can be formed by diamond cutting/machining, laser micromachining, ion beam etching, chemical etching, or similar techniques followed by imprinting of it in the overmold. In the illustrated case, deflecting means 14 is formed by prismatic grooved structures in face 11 to extend end-to-end across one face of waveguide 4 and to be optically coupled with waveguide 4 directly through its surface, without the need of any additional optical interfaces or layers and their attendant optical losses.

Waveguide 4 is preferably positioned parallel to collector array 5, and is shown directly underneath it in the figure, so that the plurality of deflecting means 14 is disposed in the focal plane of the lens array. In at least one embodiment a thin cushion layer, or space, is provided between collector 5 and waveguide 4. The thickness of waveguide 4 and the cushion space are so selected in relevance to the focal length of individual lenses of collector array 5 that each deflecting means 14 is located in a focal area of the respective collecting means 6 so that each lens representing collecting means 6 can focus the incident light onto the reflective face of the respective prismatic groove representing deflecting means 14. Thus, the array of collecting means 6 is configured to have a matching array of deflecting means 14 positioned in the vicinity of the focal plane of the lens array. However, it should be understood that deflecting means 14 can be positioned with any predefined offset from the focus or they can also be positioned in a convergent or divergent beam provided that light collecting system 2 has the same basic arrangement. Each deflecting means 14 is adapted with a first face for deflecting light received from collecting means 6, while a second face (shown as a vertical step in the figure) can be adapted as desired to enhance the characteristics of light passing through waveguide 4. By way of example and not limitation, the second face of deflecting means 14 can be sloped (not shown), at any desired angle, such as even reaching the base of the preceding deflecting means, or any intermediate position, so as to reduce backscatter and maximize light transmission through the waveguide.

In at least one embodiment of FIG. 3, waveguide 4 comprises a highly transparent material having a refractive index $n_1$ which should be generally greater than a refractive index $n_2$ of the outside medium ($n_1 > n_2$). In an exemplary case of waveguide 4 being made from glass or PMMA, $n_1$ is about 1.5. The thin cushion space between collector array 5 and waveguide 4, provides a thin layer of a low refractive index material, exemplified as air which has a refractive index of about unity. As a result, the refractive index increases outwardly at each external face of waveguide 4 including walls 10 and 11. Walls 10 and 11 serve as TIR reflectors for light propagating in waveguide 4 at angles with respect to a surface normal direction with respect to walls 10 and 11 at greater than $\theta_C$. As discussed above, $\theta_C$ is, in this case, a critical angle of TIR and wall 10 also serves as the light trapping optical interface 8 between waveguide 4 and focusing means 6.

Referring yet further to FIG. 3, the reflective face of each grooved structure is inclined at a sufficient angle with respect to wall 11 so that it deflects the focused beam formed by respective collecting means 6 back into waveguide 4 at an angle allowing for the propagation of the reflected beam by optical transmission and by means of TIR from walls 10 and 11 toward terminal end 35 of waveguide 4. The reflective faces of these grooved structures can be metalized or otherwise configured with a highly reflective surface.

For the sake of illustrative clarity, only four focusing means 6 and four matching deflecting means are shown in FIG. 2 and FIG. 3; however, it should be understood that collector array 5 can incorporate any suitable number of focusing means 6 to provide for a desired operation and light collection and that waveguide 4 can also incorporate any suitable number of deflecting means 14 in order to trap the light beams formed by collector array 5 into the waveguide.

In addition, the thickness of collector array 5 and waveguide 4 is exaggerated in FIG. 2 and FIG. 3 for the sake of illustrative clarity. However, it should be understood that either, or both, collector array 5 and waveguide 4 may comprise layers of any desired thickness, such as implemented as sufficiently thin layers to result in creating a very compact planar device. The size of deflecting means 14 is also exaggerated for clarity; however, it should be understood that the individual deflecting means 14 require a substantially smaller reflecting surface than the size of the respective focusing means 6 from which light is directed onto the reflecting surface. Accordingly, light is injected into waveguide 4 through a plurality of small-area zones, which reduce the chance for a light ray deflected by an individual deflecting means 14 to enter into such a zone a second time on its way in waveguide 4 and therefore to reduce interception of light already trapped in waveguide 4 toward maximizing system throughput and efficiency. Accordingly, the relative dimensions of waveguide 4 and deflecting means 14 are also selected so that the projected area of deflecting means 14 in the path of light propagating in waveguide 4 is substantially smaller than the transversal cross section of the waveguide 4 in the path of light. In other words, the area of each deflecting means 14 should be sufficient to intercept a substantial portion of light focused by respective focusing means 6, but a cross section of the deflecting means 14 in a plane perpendicular to the prevailing direction of light propagation in waveguide should be substantially smaller than a cross section of waveguide 4 in the same plane. This can be necessary especially in the case of lenticular configuration of collecting means 6 and deflecting means 14 in order to minimize the light blockage or other interference of deflecting means 14 with the light trapped in waveguide 4 by other deflecting means 14 and propagating along the waveguide toward a pre-determined direction.

In reference to the example embodiment of FIG. 3, this minimization of light blockage is by selecting the depth of grooved structures to be substantially smaller than the thickness of waveguide 4, the thickness can be defined in relation to the distance between faces 10 and 11. It will be appreciated by those skilled in the art that the interference of deflecting means 14 with light propagating in waveguide 4 can be minimized by minimizing the depth of the receiving aperture of individual deflecting means 14 and by positioning the deflecting means directly in the focus or a close proximity of the focus of respective collecting means 6. In certain instances, for example when the acceptance angle of system 2 needs to be increased, the receiving area (and hence the overall size) of deflecting means 14 can be made slightly larger than the cross section of the effective focal area of the respective collecting means 6. In this case, deflecting means 14 will accept focused light from a broader range of angles while not substantially impairing the light throughput of waveguide 4. Since a point-focus lens or any other conventional light collector usually produces a much smaller focal area than a linear focus configuration with the same cross sectional design of the collector, it will also be appreciated by a skilled artisan in the subject field that the size of deflecting means 14 can also be minimized by selecting a point-focus configuration for each collecting means 6 versus its linear configuration.

Figure 4A:
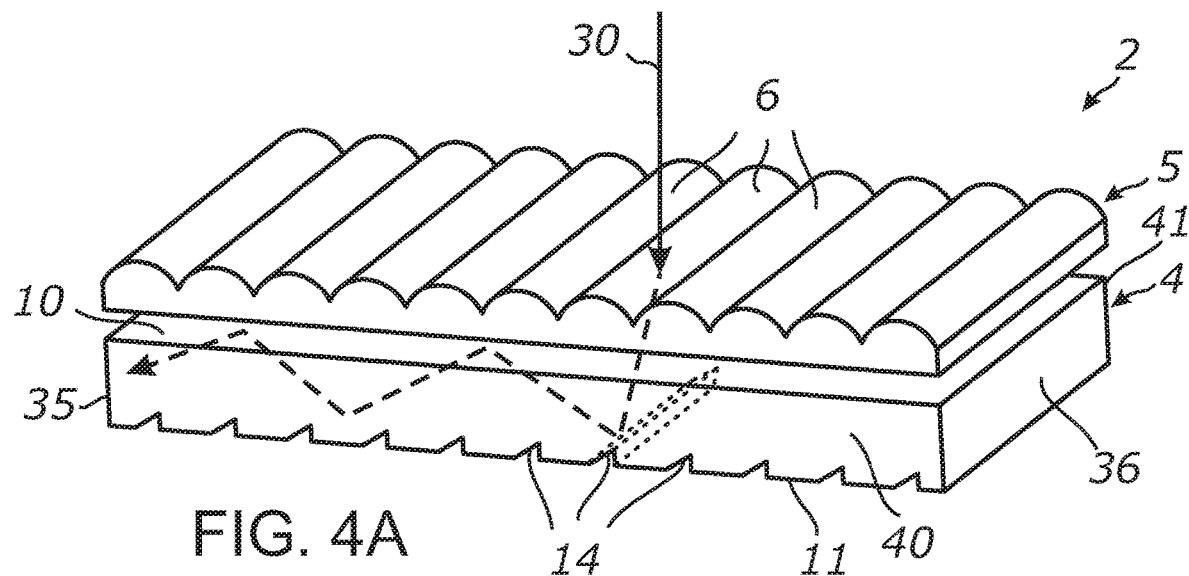
FIGS. 4A and 4B are perspective views of a light collector according to at least one embodiment of the present invention.
Figure 4B:
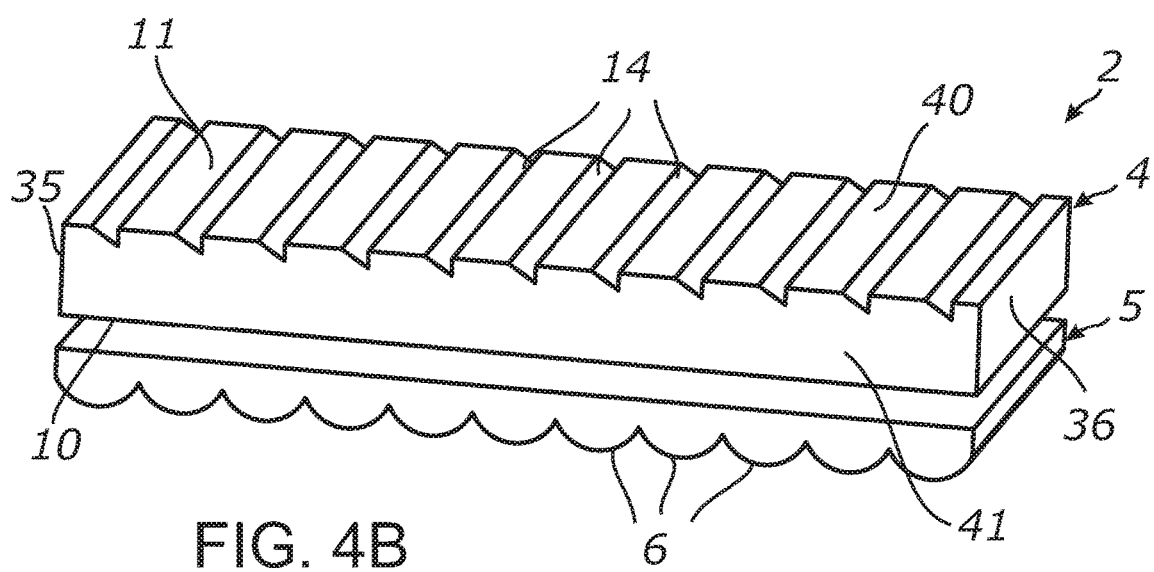

FIG. 4A-4B illustrate the exemplary linear configuration of the collector device in FIG. 3, showing a first perspective view in FIG. 4A of the top-side, and a perspective view in FIG. 4B of the device after being rotated upside down. Collector array 5 comprises a lenticular lens array having a rectangular shape and waveguide 4 comprises a rectangular transparent plate preferably having the same length and width as the lens array, with end walls (terminal sides) 35, 36, and side walls 40, 41. In FIG. 4A, deflecting means 14 are shown implemented as linear prismatic grooves in wall 11 of waveguide 4, the prismatic grooves being aligned parallel to the longitudinal axes of respective lenticular lenses of the collector. In such a linear configuration of collecting means 6, it is preferred that deflecting means 14 have about the same extent as the respective collecting means 6 in order to intercept the entire focused beam.

FIG. 4B shows a different view of system 2 shown in FIG. 4A. The waveguide structure and its prismatic grooves can be fabricated by any desired method, including without limitation, etching, grinding, scribing, extrusion, embossing, imprinting from a master mold, injection or compression molding, other conventional methods, and combinations thereof. The grooves can extend as desired across a face of waveguide 4 from first side wall 40 to opposing second side wall 41, or any substantial portion thereof, so that the base of such a groove can form a rectangular opening in wall 11 with a triangular cross section, as illustrated in FIG. 4B. As discussed above, the transverse size of deflecting means 14 is exaggerated for clarity. Waveguide 4 can also be implemented with grooves already embedded into it by means of casting, injection molding, compression molding or similar processes. Alternatively waveguide 4 can incorporate a layer of transparent material, such as a plastic film or thin transparent plate, attached to wall 11 and the prismatic grooves can be formed in that layer.

Waveguide 4 is spaced apart from collector array 5 and thus is separated from the collector array by a layer of air or other media with a low refraction index compared to the material of waveguide 4. Walls 10 and 11 are thus disposed in direct contact with air and can conduct light by optical transmission and TIR. Accordingly, each prismatic groove is disposed along the focal line of a respective linear lens and has a sloped reflective face that is capable of intercepting the focused light beam from the lens and redirecting the light beam into waveguide 4 at an angle allowing for TIR on walls 10 and 11.

In FIG. 4A, an incident light ray 30 enters one of the focusing means 6 and is directed by it down to one of deflecting means 14 disposed parallel to the focusing means 6 and configured to redirect ray 30 back into the waveguide but away from the original propagation path of ray 30. In the illustrated case when deflecting means 14 is formed by a prismatic grooved feature in wall 11 of waveguide 4, a reflective face of the grooved feature is inclined at a suitable angle with respect to wall 11 to result in the angle that ray 30 makes with surface normal to wall 10 being greater than critical angle $\theta_C$. For the purpose of illustrating this invention, $\theta_C$ is selected to be the critical angle of TIR at the interface formed by wall 10 with the outside media. Focusing means 6 and respective deflecting means 14 are also oriented to direct ray 30 generally toward wall 35. The extent to which an individual deflecting means 14 extends in waveguide 4 is indicated by a dotted line. A portion of ray 30 propagating inside system 2 and its components such as collector array 5 and waveguide 4 is indicated by a dashed line. After being redirected by deflecting means 14, ray 30 propagates in waveguide 4 by striking wall 10. Since the requirement of TIR is met, ray 30 upon striking wall 10 is reflected back into waveguide with a negligible loss. As a matter of optics, ray 30 is reflected from wall 10 by means of TIR at the same angle with respect to a normal to wall 10 as it makes with the normal upon striking wall 10. Consequently, upon bouncing from wall 10 by means of TIR, ray 30 further propagates in waveguide 4 and strikes wall 11. Since wall 11 is parallel to wall 10, a normal to wall 10 is also a normal to wall 11 and the requirement of TIR is also met for the interface formed by wall 11 and the outside media. Accordingly, ray 30 undergoes TIR at wall 11 with a low loss and maintains the same angle to a normal to wall 10 and 11. Ray 30 is thus trapped by TIR within waveguide 4 and propagates through the waveguide toward a terminal end at wall 35. Depending on the application, ray 30 can further cross wall 35 and enter, for example, a light detector or an energy conversion device adjacent to wall 35.

Figure 5:
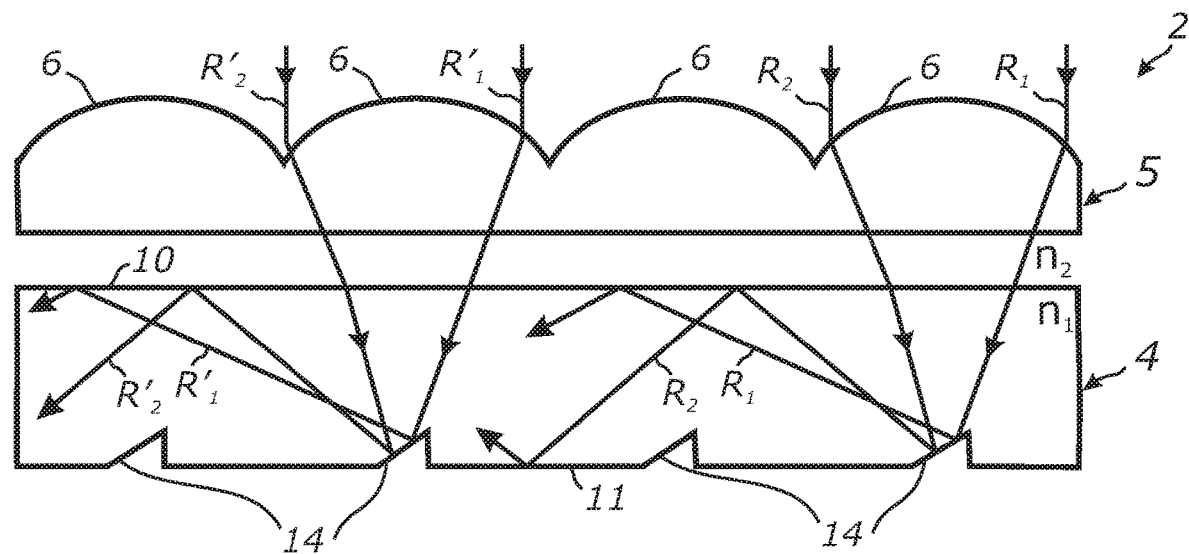
FIG. 5 is a ray tracing diagram of compact light collection within FIG. 4A, according to at least one embodiment of the present invention.

FIG. 5 illustrates an example of light rays passing through the collector and being retained by TIR within the waveguide according to the present invention. As shown in FIG. 5, a ray $R_1$ is received from a substantially parallel light source (e.g., a distant light source) as it strikes the entrance aperture of the collector array, and more particularly, the entrance aperture of an individual focusing means 6. Focusing means 6 is shown implemented as a positive cylindrical lens which refracts ray $R_1$ and redirects it toward the focal area of the lens. Ray $R_1$ crosses wall 10 of waveguide 4 with some refraction and strikes light deflecting means 14 disposed in the vicinity of the focus of focusing means 6. Deflecting means 14 redirects at least a substantial portion of energy of ray $R_1$ into waveguide 4 by means of reflecting ray $R_1$ from a sloped reflective face of the prismatic groove. Waveguide 4 has a higher refractive index $n_1$ than the surrounding medium ($n_2$). The angle with respect to a normal to waveguide 4 at which deflecting means 14 reflects ray $R_1$ into waveguide 4 medium is equal or greater than critical angle $\theta_C$ defined by a critical angle of TIR which, in turn, is defined by refractive indices $n_1$ and $n_2$.

In similar manner, a ray $R_2$ impinging onto the receiving surface of focusing means 6 is directed to the same focal area and to the same light deflecting means 14. Ray $R_2$ enters focusing means 14 at a different angle than ray $R_1$ but is further redirected into waveguide 4 so that ray $R_2$ also propagates in the medium of waveguide 4 at an angle greater than $\theta_C$ that permits for a total internal reflection from walls 10 and 11. Similarly, rays $R'_1$ and $R'_2$ focused on a different reflecting means 14 by the respective collecting means 6 are also reflected into waveguide at angles allowing for propagating the reflected rays in waveguide 4 by means of TIR.

It should be understood that while the figure depicts only two example rays, focusing means 6 is configured to collect any rays impinging onto its receiving aperture in a predefined acceptance angle and any desirable spectral range. While only parallel rays impinging onto the receiving aperture of collector array 5 are shown in FIG. 5, it should also be understood that, deflecting means 14 can be configured to receive a convergent or divergent beam of light having a predetermined angular spread and redirect the beam to waveguide 4 at a sufficient bend angle so that each ray of the redirected beam becomes trapped in waveguide 4 and further propagates within the waveguide 4 by means of TIR from walls 10 and 11. It will be appreciated by those skilled in the art that collector array 2 can operate with any number of rays within a selected acceptance angle and in a desired spectral range of the incident light. Particularly, collector array 2 can be used to conveniently inject a quasi-parallel beam of monochromatic or broad-spectrum electromagnetic energy into waveguide 4 through a large-area light conducting wall of the waveguide as opposed to injecting the beam through a terminal end of the waveguide as within conventional devices.

Figure 6:
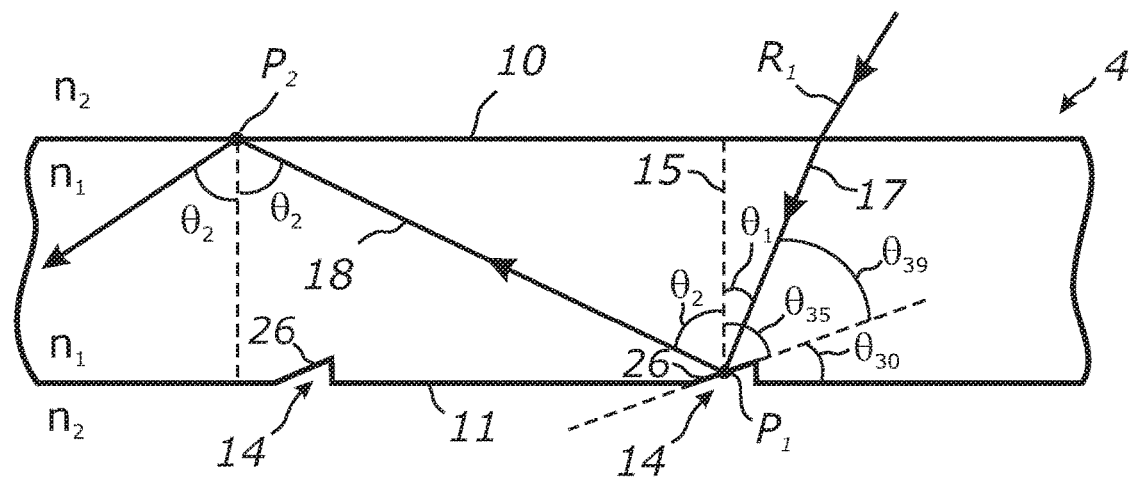
FIG. 6 is a ray tracing diagram of the compact light collection system according to at least one embodiment of the present invention, depicted in greater detail.

FIG. 6 illustrates a ray traversing waveguide 4 in further detail by showing and analyzing a path of ray $R_1$. Referring to FIG. 6, ray $R_1$ directed by a focusing means (element) is propagated in the lower refractive index medium surrounding waveguide 4 crosses wall 10 of waveguide 4 and further propagates in the higher refractive index medium of the waveguide until it strikes light deflecting means 14. Light deflecting means 14 is designed to deflect ray $R_1$ from its original direction of propagation in waveguide 4 into a different direction. In order to do this, a reflective face 26 is provided in light deflecting means 14. Reflective face 26 is inclined with respect to wall 11 so that it makes a slope angle $\theta_{30}$ with wall 11 and an angle $\theta_{35}$ with a surface normal direction 15. If $\theta_{39}$ is an angle between face 26 and ray $R_1$, then $\theta_{39}=\theta_{35}-\theta_{30}$. Face 26 has a planar mirrored surface to provide for a low-loss specular reflection. Reflective face 26 is illustrated to have a planar surface. However, it should be understood that face 26 can be adapted with reflective surfaces other than planar surfaces, for example segmented, curved surfaces. It will also be appreciated that although the back face of deflecting means 14 is shown following the surface normal direction, it can be configured at a desired slope back toward the previous deflector, for reducing back scatter of rays traversing the waveguide.

Upon incidence onto face 26 at point $P_1$ an angle $\theta_1$, ray $R_1$ reflects at an angle $\theta_2$ with respect to a surface normal direction 15 to wall 10. The corresponding portion of ray $R_1$ propagating from wall 10 to light deflecting means 14 is denoted as a ray segment 17. A ray segment 18 represents a continuation of the ray $R_1$ when it is internally redirected/deflected by deflecting means 14 back into waveguide 4 but at a different angle so that segment 18 forms an angle $\theta_2$ with respect to a normal to wall 10. The slope of face 26 is selected so as to result in angle $\theta_2$ being greater than angle $\theta_1$ and equal to or greater than angle $\theta_C$. As discussed above, angle $\theta_C$ can be defined from the following expression for a critical TIR angle:

$$\theta_C = \arcsin(n_2/n_1),$$

where $n_1$ and $n_2$ are the refractive indices of waveguide 4 and the lower refractive index medium adjacent to wall 10 of waveguide 4, respectively.

When ray $R_1$ is reflected by face 26 and further strikes wall 10 from the inside of waveguide 4 at point $P_1$, it makes an angle of incidence with respect to the surface normal direction of interface wall 10. Obviously, the angle of incidence is equal to $\theta_2$ due to the parallelism of walls 10 and 11 and surface normal direction 15 to wall 10 is also a normal to wall 11 for the same reason. Since angle $\theta_2$ is greater than angle $\theta_C$, the condition of TIR is automatically met for wall 11. Therefore, ray $R_1$ does not pass through wall 10 and is totally internally reflected back into waveguide 4 maintaining the same angle $\theta_2$ with respect to a normal to walls 10 and 11. As a result, ray $R_1$, after being deflected by light deflecting means 14, will become trapped in waveguide 4 and will continue to propagate in waveguide 4 by bouncing from walls 10 and 11 due to TIR. The above condition can be achieved by providing a suitable angle between a normal to sloped reflective face 26 and surface normal direction 15 so as to allow for sufficient bend angles for rays focused by focusing means 6.

Referring further to FIG. 6, since surface normal direction 15 makes an angle of 90° with walls 10 and 11, $\theta_{35}=90°\theta_{30}$. The following expression can also be derived as a matter of optics and geometry: $\theta_2=2(90°-\theta_{35})+\theta_1$. Thus, for the example illustrated in FIG. 6, if ray $R_1$ enters waveguide 4 so that it makes an angle of 10° with respect to normal 15 at point $P_1$, that is $\theta_1=10°$, and face 26 is inclined at an angle of 27° with respect to wall 10, that is $\theta_{30}=27°$ and $\theta_{35}=63°$, then a value $\theta_2=64°$ is obtained. This means that segment 18 will strike wall 10 at the angle of 64° with respect to a normal of wall 10. If waveguide 4 is made from PMMA with the reflective index $n_1$ of about 1.49 and the ambient medium is air with refractive index $n_2$ of about 1, angle $\theta_C$ selected in this case to be the TIR angle will be equal to arcsin(1/1.49) which is approximately 42.155°, that is greater than angle $\theta_2$. Thus, it follows that, in the above example, $\theta_2 > \theta_C$.

Therefore the condition of TIR is met at point $P_2$ and that ray $R_1$ will undergo a total internal reflection at wall 10. Since ray $R_1$ maintains the same angle with respect to a normal to parallel walls 10 and 11 when subsequently bouncing from the walls, the condition or TIR is also preserved along the entire length of waveguide 4. Thus, ray $R_1$ becomes trapped in waveguide 4 so it can propagate along its walls 10 and 11 toward a terminal end. In another example, if ray $R_1$ enters waveguide 4 perpendicular to wall 10 (i.e., $\theta_1=0°$) and face 26 is inclined at an angle 45 degrees with respect to wall 10 and normal 15 ($\theta_{30}=45°$ and $\theta_{35}=45°$), $\theta_2=90°$, which means that segment 18 is perpendicular to normal 15 and parallel to both walls 10 and 11. Therefore, in this latter example, $R_1$ will propagate in waveguide 4 toward a terminal end without touching either wall 10 or 11.

Figure 7:
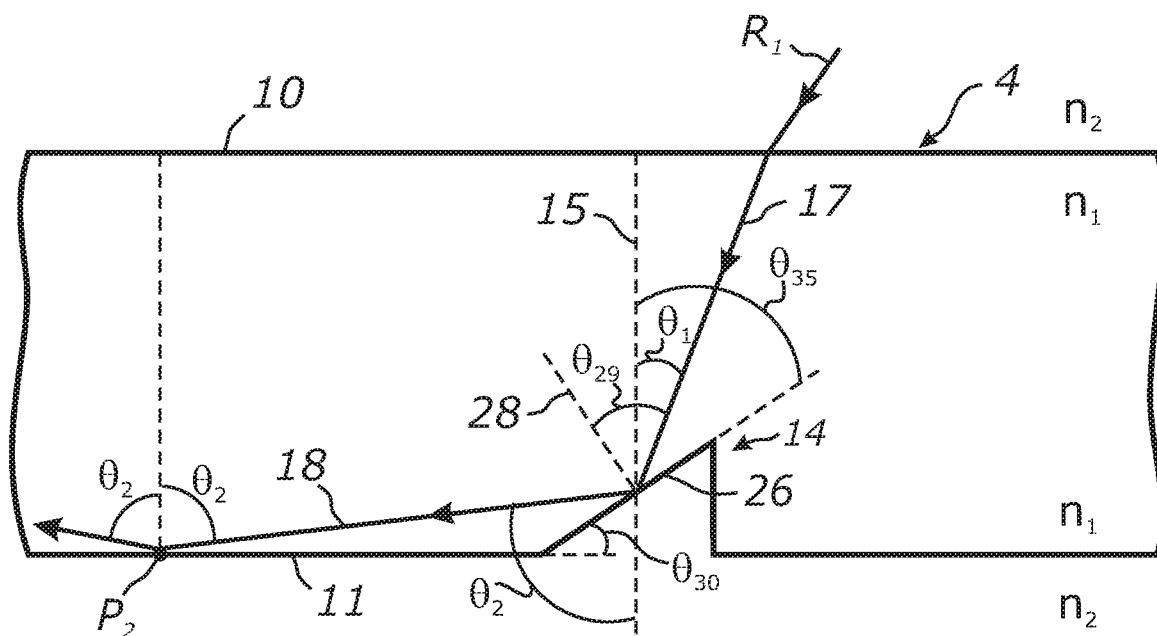
FIG. 7 is a ray tracing of a first ray angle being trapped in a waveguide by means of TIR, according to at least one embodiment of the present invention.

FIG. 7 illustrates an example ray diagram which illustrates that by selecting a suitable slope angle $\theta_{30}$ of reflective face 26, ray $R_1$ can be directed at any desired angle with respect to surface normal direction 15 or walls 10 and 11. The figure illustrates this exemplary case when reflective face 26 is inclined at a greater angle $\theta_{30}$ with respect to wall 11 so that at least a portion of light redirected by deflecting means 14 can strike wall 11 first. In FIG. 7, ray $R_1$ enters waveguide 4 and propagates in it so that segment 17 makes angle $\theta_1$ with surface normal direction 15. Ray $R_1$ strikes reflective face 26 of deflecting means 14 and is reflected into waveguide 4 so that segment 18 makes an angle $\theta_2$ with respect to surface normal direction 15. Slope angle $\theta_{30}$ is selected to result in angle $\theta_2$ being greater than $\theta_C$. Accordingly, upon striking wall 11 at point $P_2$, ray $R_1$ makes an angle of incidence equal to $\theta_2$ which is greater than the TIR angle. Since walls 10 and 11 are parallel, a TIR will occur each time when ray $R_1$ strikes either of the walls. Accordingly, ray $R_1$ becomes trapped in waveguide 4 and can propagate along its walls 10 and 11 by means of at least TIR.

Figure 8:
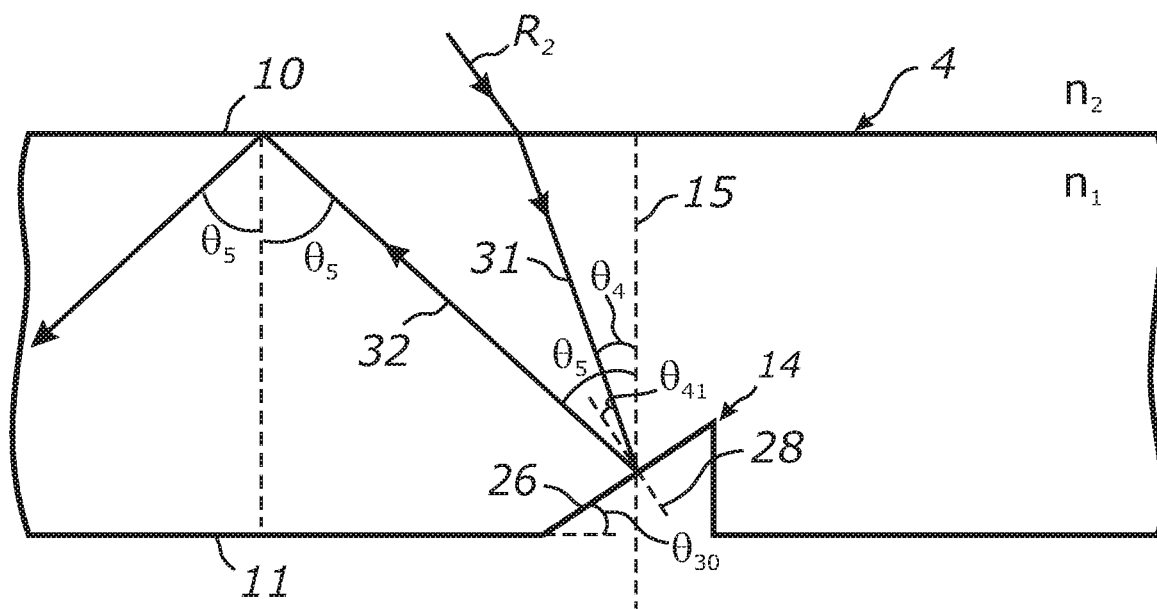
FIG. 8 is a ray tracing of a second ray angle being trapped in a waveguide by means of TIR, according to at least one embodiment of the present invention.

FIG. 8 illustrates another ray path $R_2$ in the system depicted in FIG. 7. Ray $R_2$ propagates in waveguide 4, as indicated by a ray segment 31 and impinges onto face 26 at an angle of incidence $\theta_{41}$. Segment 31 makes an angle $\theta_4$ with respect to surface normal direction 15. A ray segment 32 represents a continuation of ray $R_2$ when it is reflected from face 26 back into waveguide 4. Angle $\theta_{41}$ is greater than angle $\theta_{29}$ of FIG. 7 resulting in the bend angle of ray $R_2$ in FIG. 8 being greater than that of ray $R_1$ in FIG. 7. Slope angle $\theta_{30}$ of face 26 is selected so that segment 18 makes an angle $\theta_5$ which is greater than angle $\theta_4$, while angle $\theta_5$ is greater than a TIR angle $\theta_C$. Accordingly, the condition of TIR propagation in waveguide 4 is satisfied for ray $R_2$ and it can also propagate along walls 10 and 11 toward a terminal end.

Reflective face 26 can be inclined at an even more acute angle with respect to surface normal direction 15 in which case it can reflect a portion or all incident focused beam by means of TIR in which case no mirror coating may be required for face 26. Referring to FIG. 7, an angle $\theta_{29}$ represents an angle of incidence of ray $R_1$ onto face 26 with respect to a surface normal direction 28. When face 26 makes a sufficient angle with respect to segment 17, angle $\theta_{29}$ can exceed a TIR angle for the optical interface formed by face 26 and the outside media. Thus, ray $R_1$ will undergo TIR at face 26 even if face 26 is optically transparent and not specularly reflective.

Figure 9:
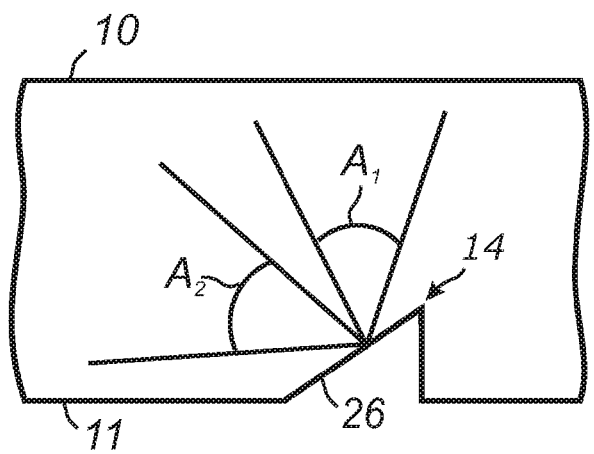
FIG. 9 is a ray range tracing of light redirection from a first angular aperture to a second angular aperture, according to at least one embodiment of the present invention.

FIG. 9 illustrates by way of example, both incident and reflected beam ranges from the surface of deflector 14. In considering an individual deflecting means 14, the focused beam impinging onto face 26 can be characterized by a cone of light having a first angular aperture $A_1$ as seen in the figure. As discussed above, deflecting means 14 can be configured to receive light rays incident into its working surface at different angles and to redirect the rays at angles greater than the TIR angle in relation with walls 10 and 11. Thus, deflecting means 14 can be configured to receive light from first angular aperture $A_1$ and redirect the light into a second angular aperture $A_2$ so that apertures $A_1$ and $A_2$ do not intersect, and each ray in the second angular aperture $A_2$ propagates at an angle with respect to surface normal direction 15 greater than angle $\theta_C$. When deflecting means employ a planar reflective face 26, the angular value of second angular aperture $A_2$ will generally be the same as the angular value of first angular aperture $A_1$. However, face 26 can also be made concave or convex resulting in the second angular aperture $A_2$ being greater or smaller than first angular aperture $A_1$. Since a light ray striking wall 10 from the outside of waveguide 4 cannot practically enter the waveguide at an angle with respect to surface normal greater than $\theta_C$, a practical limit for $A_1$ is defined by the refractive indices of waveguide 4 and the outside medium: $A_1 \leq 2\theta_C$ or $A_1 \leq 2\arcsin(n_2/n_1)$. When $A_1=2\theta_C$, in view of minimizing losses of light coupling to waveguide 4, a practical useful range for slope angle $\theta_{30}$ can be defined from the following relationship: $\theta_C \leq \theta_{30} \leq 90° - \theta_C$ or $$\arcsin\left(\frac{n_2}{n_1}\right) \leq \theta_{30} \leq \arccos\left(\frac{n_2}{n_1}\right).$$

By taking an above exemplary case of waveguide 4 being made from PMMA ($n_1 \approx 1.49$) with air cladding ($n_2 \approx 1$), the desired range for slope angle $\theta_{30}$ is obtained as: $42.16° \leq \theta_{30} \leq 47.84°$ which provides a slope angle width of about 5.7° for obtaining the maximum light coupling efficiency employing prismatic grooved features for deflecting means 14.

In a more general case, and when first angular aperture $A_1$ is less than $2\theta_C$, a practical range of useful slope angles $\theta_{30}$ can be defined as follows: $A_1/4+\theta_C/2 \leq \theta_{30} \leq 90°-A_1/4-\theta_C/2$. If slope angle $\theta_{30}$ is outside of this range, a portion of the light beam redirected by the respective prismatic groove 14 may exit from waveguide 4 through one of its light conducting walls 10 or 11 and that decoupled light will be lost.

It should be appreciated that although FIG. 4 through FIG. 8 illustrated embodiments which employ a light deflecting means 14 formed by a grooved structure associated with wall 11 of waveguide 14 and having sloped reflective face 16, the invention is not limited to this configuration. Specifically, light deflecting means 14 can be positioned anywhere at or between walls 10 and 11, and can be configured as embedded or integral to waveguide 4 or attached externally to either wall 10 or 11, provided that the deflecting means 14 is optically coupled to waveguide 4 and can intercept the focused beam from the respective focusing means 6 and inject the beam into the waveguide at an angle allowing for light trapping by means of at least TIR.

FIG. 10A through FIG. 10E illustrate, by way of example and not limitation, alternative implementations of light deflecting means 14 disposed on surface 11. It should be noted that each of these variations can be implemented separately or in combination with one another without departing from the teachings of the present invention.

Figure 10A:
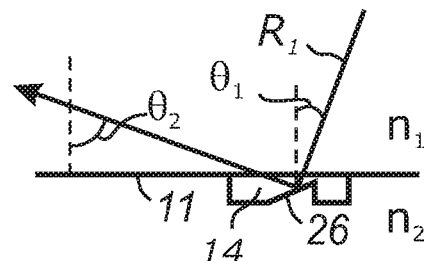
FIG. 10A is a schematic of a waveguide portion comprising a block of transparent material with a prismatic feature, according to at least one embodiment of the present invention.

In FIG. 10A, deflecting means 14 comprises a block of transparent material attached to wall 11 and optically coupled to waveguide 4. In this case, deflecting means 14 can have a prismatic relief feature with a reflective face 26 which is capable of redirecting a focused beam of light into waveguide at an angle $\theta_2$ greater than $\theta_C$. The material of deflecting means 14 can be selected to approximately match that of waveguide 4 in which case the parasitic reflections at the interface between waveguide 4 and deflecting means 14 can be minimized which minimizes the losses related to light propagation both to and from deflecting means 14.

Figure 10B:
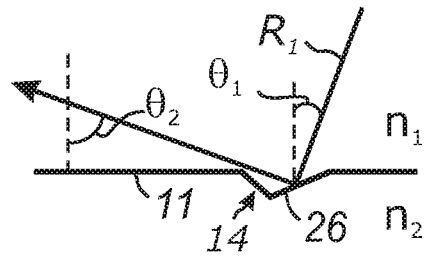
FIG. 10B is a schematic of a waveguide portion comprising a prismatic feature protruding from a light conducting walls of a waveguide, according to at least one embodiment of the present invention.

FIG. 10B illustrates a further example in which a deflecting means comprising a prismatic feature is protruding from face 11. In this example, reflective face 26 is provided so that system 2 has the same basic operation as described above as one can see the tracing of ray $R_1$.

Figure 10C:
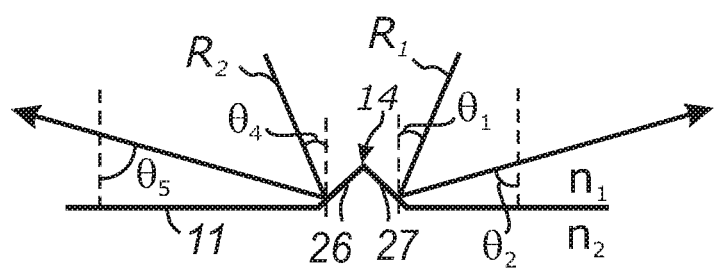
FIG. 10O is a schematic of a waveguide portion having a bifacial prismatic grooved feature, according to at least one embodiment of the present invention.
FIG. 10D is a schematic of a waveguide portion incorporating a plurality of prismatic surface relief features, according to at least one embodiment of the present invention.
FIG. 10E is a schematic of a waveguide portion incorporating a diffraction grating for deflecting the light, according to at least one embodiment of the present invention.

FIG. 10C illustrates the use of a deflecting means 14 which comprises a v-shaped prismatic groove in wall 11 where both faces 26 and 27 of the groove are made reflective and configured to redirect and couple the focused light into waveguide 4 thus forming a bifacial prismatic grooved feature. Ray $R_1$ enters face 26 making angle $\theta$, with respect to surface normal to wall 10. Face 26 redirects ray $R_1$ so that it makes angle $\theta_2$ with respect to the same surface normal. Ray $R_2$ enters face 27 making angle $\theta_4$ with a surface normal to wall 10. Face 27 redirects ray $R_2$ so that it makes angle $\theta_5$ with respect to the same surface normal direction. The slopes of faces 26 and 27 are selected to result in both angles $\theta_2$ and $\theta_5$ being greater than $\theta_C$, which leads to trapping the light in waveguide 4 and collecting the light at a terminal face of the waveguide with concentration. Furthermore, prismatic grooves 14 can have any other desired geometry and any desired number of faces that can reflect, refract, scatter or otherwise redirect light propagating within waveguide 4 so that the redirected light can be extracted from the waveguide.

Figure 10D:
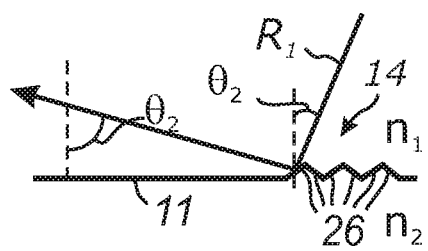

FIG. 10D illustrates the use of several smaller v-shaped prismatic grooves being used instead of a single prismatic groove 14. It will be recognized that the plurality of reflective groove faces 26 are inclined in accordance with the above principles to allow for efficient light collection in waveguide 4.

Figure 10E:
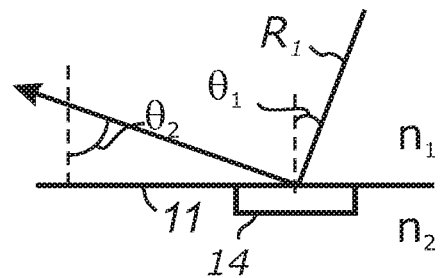

FIG. 10E illustrates a deflecting means 14 comprising one or more diffraction gratings. This grating may be implemented by way of example and not limitation, in the form of a hologram which is capable of deflecting the incident light at a suitable angle of TIR with respect to walls 10 and 11. The hologram can be formed in a glass plate or highly transparent plastic film and can be made angularly and/or spectrally multiplexed.

The foregoing embodiments of the present invention are described upon the case where deflecting means 14 are of a reflective type. However, this invention is not limited to this and can be applied to the case when light deflecting means 14 is of a refractive type and the light passes through a portion of light deflecting means 14 rather than being reflected from it. One such example is deflecting means 14 comprising a prism with a different refractive index embedded into waveguide 4 or attached to either its walls 10 or 11.

Furthermore, one or more embodiments of system 2 within the present invention can be configured to collect light rays in a preselected spectral domain and/or only those rays that are propagating in waveguide 4 in a predetermined range of acceptance angles. For example, the deflecting means may comprise a reflective or transmissive hologram designed to deflect only a specific wavelength or a relatively narrow range of wavelengths into waveguide 4 while allowing the other wavelengths to pass without deflection.

Alternatively, in at least one embodiment of the invention, deflecting means 14 can comprise one or more layers of a dichroic material which causes the incident light to be split up into distinct beams of different wavelengths and allows only selected beam(s) to be trapped in waveguide 4 while rejecting the rest of the spectral energy. In a further example, light deflecting means 14 can be designed so that any rays impinging onto its active aperture within an acceptance angle of up to a pre-determined value (e.g., up to 30 degrees) will be trapped in waveguide 4. The remainder of the rays are deflected at angles smaller the TIR angle $\theta_C$ with respect to surface normal direction 15 and these latter rays can therefore be allowed to escape from waveguide 4. According to the above deflective means a combination or reflection and refraction is provided which efficiently redirects light focused by the respective focusing means 6.

Figure 11:
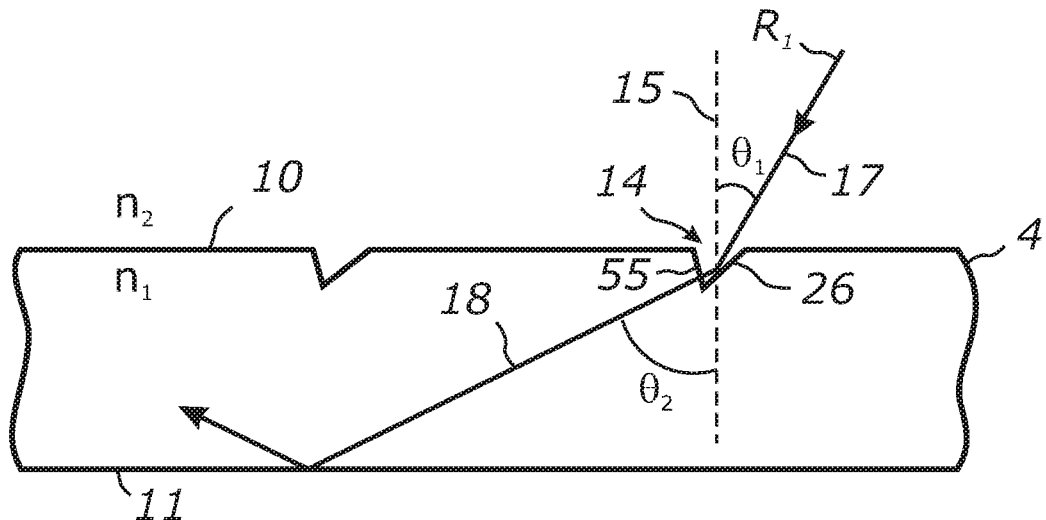
FIG. 11 is a ray tracing in response to a prismatic feature in a wall of a waveguide according to at least one embodiment of the present invention.

FIG. 11 illustrates an example of a waveguide structure according to the present invention which incorporates a deflecting means 14, which in this example is implemented as a grooved structure formed in wall 10. Ray $R_1$ directed by focusing means 6 (not shown) enters waveguide 4 and strikes deflecting means 14 at angle $\theta_1$ with respect to a surface normal direction 15 to wall 10. Deflecting means 14 deflects segment 17 of ray $R_1$ into segment 18 which propagates in waveguide 4 and forms angle $\theta_2$ with respect to surface normal direction 15 to wall 10. In the figure light deflecting means 14 is configured with both a reflective face 26 and a transparent face 55. Ray $R_1$ is reflected by face 26 and passes through face 55 into waveguide 4. Face 26 is inclined with respect to wall 10 so as to result in angle $\theta_2$ being greater than the TIR angle $\theta_C$. Similar to the embodiments described above, ray $R_1$ is thus trapped in waveguide 4 and will propagate through it by means of TIR from its longitudinal walls. Face 55 can be made approximately perpendicular to wall 10 or it can be inclined at any suitable angle with respect to wall 10 or surface normal direction 15 so as to provide an efficient light deflection into, and trapping within waveguide 4. It will be appreciated by those skilled in the art, that if segment 17 of ray $R_1$ lies in waveguide 4 (e.g., FIG. 6 through FIG. 8) angle $\theta_1$ will generally be smaller than the TIR angle $\theta_C$ to provide for the entrance of $R_1$ from the lower refractive index medium of the outside media into the higher refractive index medium of waveguide 4. Therefore, angle $\theta_1$ will generally be smaller than angle $\theta_2$ for the cases illustrated in FIG. 6 through FIG. 8. However, if segment 17 of ray $R_1$ propagates outside waveguide 4 angle $\theta_1$ can be of any suitable value and can even be equal or exceed $\theta_2$ provided that $\theta_2$ is still greater than the TIR angle $\theta_C$.

Figure 12:
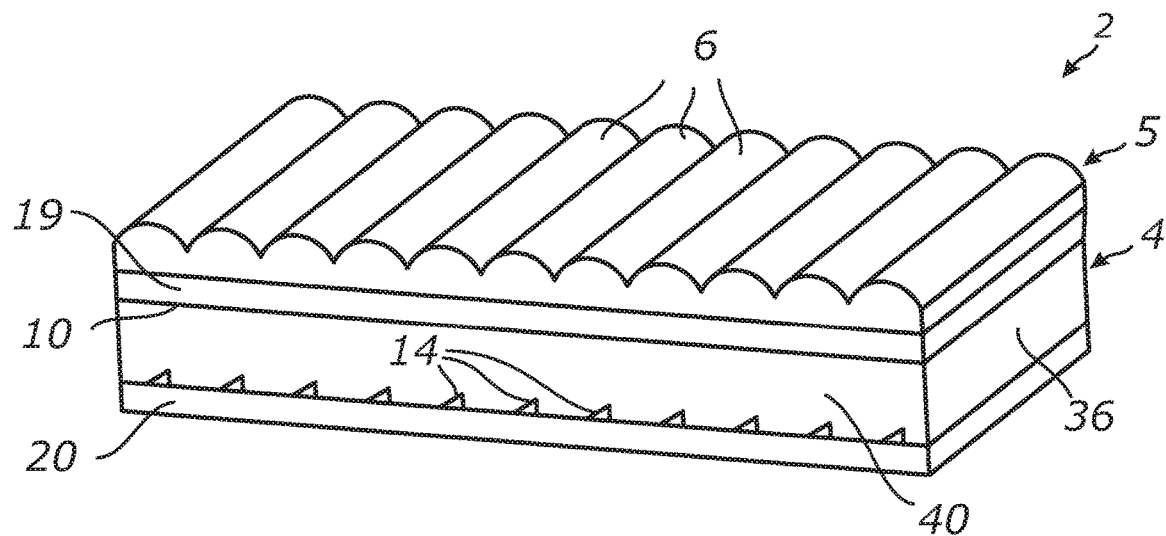
FIG. 12 is a perspective view of a light collection device having a cladding layer according to at least one embodiment of the present invention.

FIG. 12 illustrates an example of the invention in which the collector and waveguide are not separated by an air medium. In this example a cladding or buffer layer 19 of optically transmissive material having a refractive index lower than that of waveguide 4. Layer 19 is separating waveguide 4 from collector array 5 providing for a stepped drop in refractive index outwardly from waveguide 4 so that light can be injected and trapped in waveguide and that system 2 has the same basic operation as discussed above. Layer 19 can be positioned between collector array 5 and waveguide 4 so that system 2 forms a monolithic sandwiched structure. Suitable materials for layer 19 can include but are not limited to low refractive index monomers, polymers, fluoropolymers, low-n optical adhesives, thin films, materials commonly used for cladding in optical waveguides or any other optically clear material provided that its refractive index is lower than the refractive index of the material selected for waveguide 4. Particularly, amorphous fluoropolymers conventionally used for cladding optical waveguides such as PFTE AF 1600 and PFTE AF 2400 can be utilized.

Additionally, wall 11 of waveguide is shown optionally provided with a cladding layer 20 which also has a low refractive index so that waveguide 4 is encapsulated and protected from the outside media by a low-n material similar to conventional light guides. This can help avoid light spillage from waveguide 4 toward improving the efficiency of system 2. Cladding materials suitable for layer 20 can include any of the low-n materials mentioned above for layer 19. Alternatively, layer 20 can be formed by a plastic reflective film or by metallization of wall 11 to improve reflectivity or reduce light spillage through wall 11. Another example of a suitable protective backsheet material for layer 20 can be Polyvinyl fluoride (PVF), a fluoropolymer which is commercially available as a film from DuPont and is sold under the Tedlar® brand.

Similarly, any or all side walls 40 and 41 or end walls 35 and 36 of waveguide 4 can be encapsulated or otherwise covered by a protective or reflective layer and allowed to reflect light propagating in waveguide 4 back into the waveguide by means of TIR or specular reflection. It will be appreciated that layer 20 or encapsulation layers of any of the transversal ends of waveguide 4 do not have to be optically transparent and can include opaque, light scattering or reflective materials. Yet further, system 2 can incorporate any other suitable layers, such as reflective or anti-reflective coatings, diffusers, radiation protective coatings or films, scratch and stain resistant coatings, light filtering films and the like. By way of example, waveguide 4, collector array 5 or any of their portions can be coated by dip coating, spin coating, vacuum metallization, applying a thin film using low-n adhesives, and so forth. Embodiments of the collector device discussed above can further comprise one or more light sources and/or light detectors or energy converters.

Figure 13:
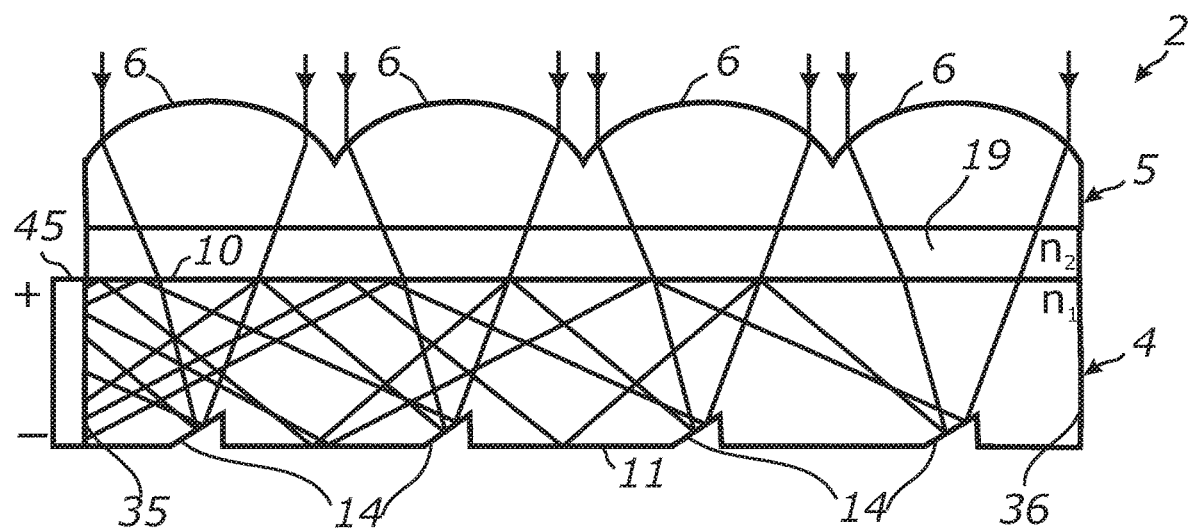
FIG. 13 is a ray tracing diagram of the collector shown in FIG. 12, according to at least one embodiment of the present invention.

FIG. 13 illustrates an example embodiment in which a photoresponsive element, exemplified by photovoltaic cell 45, is disposed on wall 35. By way of example, the photoresponsive elements can be attached to wall 35 using an optical glue or transparent encapsulant, which preferably has a thermal expansion coefficient and refractive index matching those of waveguide 4. A suitable buffer layer 19 based on a low-n fluoropolymer film is laid between collector array 5 and waveguide 4, thus forming a monolithic solid-state solar energy conversion device.

In FIG. 13, the ambient sunlight is collected from a large area of collector array 5 and brought to a much smaller area of face 35 of waveguide 4 thus causing a substantial concentration of solar radiation. It follows that system 2 of FIG. 13 can utilize a substantially smaller area of raw photovoltaic materials than a conventional PV panel of a similar power output and does not have the bulkiness and complexity of conventional photovoltaic concentrators. A suitable heat sink (not shown) can be attached to the back of cell 45 to provide for efficient heat dissipation and reducing the operating temperatures of the cell. A number of such devices can be arranged in an array on a single metal sheet or frame and connected in series and/or in parallel to build the desired power capacity.

Referring further to FIG. 13, the light deflected by deflecting means 14 will undergo multiple reflections from at least walls 10 and 11. Additionally, some rays may undergo one or more total internal reflections from the side walls of waveguide 4. It will be appreciated by those skilled in the optical arts that, as a result of the above, the light rays will arrive at wall 35 from random directions and will strike the surface of end wall (terminal wall) 35 at randomly distributed points. In other words, waveguide 4 will also act as a homogenizer of the concentrated light. Therefore, the concentrated light illuminating cell 45 will have a more uniform energy distribution across the cell compared to a case when the light is concentrated using a conventional optical device such as a lens or mirror which are generally characterized by highly non-uniform concentrated fluxes and substantially elevated peak flux densities in the center of the focal plane. It will also be appreciated that flux homogenization can be further improved by increasing the number of deflecting means 14 and by increasing the number of ray bounces from walls 10 and 11 which, in turn, can be for example accomplished by reducing the thickness of waveguide 4. However, the invention is not limited to the above but can also be applied to the case when collecting means 6 and/or deflecting means 14 are positioned and aligned in accordance to a pre-selected ordered or randomized pattern. Alternatively, or in addition to, the side walls can be disposed at an angle with respect to each other to provide for additional concentration or homogenization. Yet further, any or all of the end walls 35, 36, or side walls 40, 41 can be curved or patterned to direct the light propagating in waveguide 4 more efficiently toward a pre-determined direction or a plurality of directions.

The foregoing embodiments are described upon the case where deflecting means 14 are arranged to trap incident light in waveguide 4 and direct the light in waveguide 4 toward a terminal end of the waveguide or walls by means of at least TIR. However, this invention is not limited to this but can be applied to the case where deflecting means 14 are configured to direct the light trapped in waveguide 4 toward a different pre-determined area within the waveguide.

FIG. 14 illustrates an embodiment in which the matching pairs of focusing means 6 and deflecting means 14 are disposed symmetrically about a central line of symmetry of system 2 and configured to trap the incident light in waveguide 4 and direct the light toward a central portion of the waveguide. One or more photoresponsive elements are disposed on the device, for example a photovoltaic cell 45 attached to wall 11 in close proximity to that central portion of waveguide 4 and is disposed in energy receiving relationship from waveguide 4 to provide for the removal of light from the waveguide and collecting light by cell 45. If wall 11 has a reflective or protective coating, such coating should have an opening in the area where cell 45 is attached.

By way of example and not limitation the photoresponsive element can be coupled to the waveguide element by a thin layer of optical adhesive or a photovoltaic encapsulant, such as silicone, EVA resin, or the like can be provided between waveguide 4 and photovoltaic cell 45 to promote adhesion and optical contact between cell 45 and waveguide 4. For efficient light removal, the refractive index of the adhesive or encapsulant should preferably be close to or greater than the refractive index of the material of waveguide 4. This matching of refractive indices will ensure that no TIR occurs in the area where cell 45 is attached to wall 11 and the light striking that area is allowed to escape from waveguide 4 and enter into cell 45.

Referring again to FIG. 14, this embodiment can be arranged to have a linear configuration with a plane of symmetry perpendicular to the drawing plane, similar to that of FIG. 12, in which case collector array 5 can be formed by a lenticular lens array and the matching array of deflecting means 14 can be formed by parallel prismatic grooves made in wall 11.

FIG. 15A-15D illustrates example embodiments of collector arrays with different rectangular or circular arrangements, each being shown with example rays striking the collector and being directed inwardly to the light harvesting area. In FIG. 15A collector array 5 and waveguide 4 is shown with a planar shape having a square or rectangular outline. A light harvesting area 47 (indicated by a hatched area) is configured, such as with a rectangular shape and surface area substantially smaller than the surface area of collector array 5 and/or waveguide 4 in order to obtain sufficient light concentration.

FIG. 15B illustrates an embodiment with an axial symmetry in which case collecting means 6 and deflecting means 14 have an annular configuration formed by a revolution of the cross sectional design shown in FIG. 14 around an axis of symmetry by a full or partial angular turn. In such an axisymmetrical configuration, the collector array 5 and waveguide 4 have a round outline.

FIG. 15C illustrates an embodiment similar to that of FIG. 15B, but cut with a rectangular or square outline, or to any other desired shape or outline (e.g., hexagonal, sectorial, and so forth), depending on the application, packing requirements, aesthetics and/or desired operating parameters. Harvesting area 47 can have a round shape as shown in FIG. 15B and FIG. 15C or it can be of any other suitable shape. Harvesting area 47 can be formed on either wall 10 or 11 where it can be centrally located or offset relative to the center forming an asymmetric configuration.

FIG. 15D illustrates an embodiment in which the harvesting area 47 is configured on or at any of the terminal ends of waveguide 4. The figure shows a device in which collector array 5 is based on annular lenticular lenses focusing incident light onto a plurality of deflecting means 14 underneath (not shown) which are following the circular pattern of focusing means 6. This configuration allows for forming a point-like harvesting area 47 at wall 35 of waveguide 4. It should also be understood that system 2 can be configured to have multiple harvesting areas as desired. Further, waveguide 4 may be tapered such that an overall length or width of waveguide 4 is reduced or enlarged as desired.

Figure 16A:
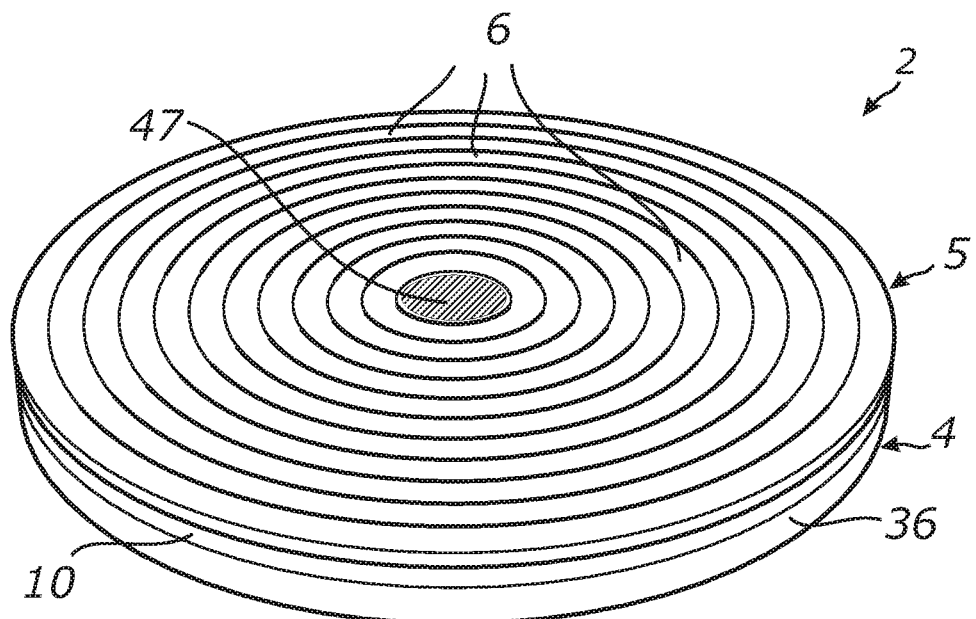
FIGS. 16A and 16B are perspective views of an annular collector according to at least one embodiment of the present invention.
Figure 16B:
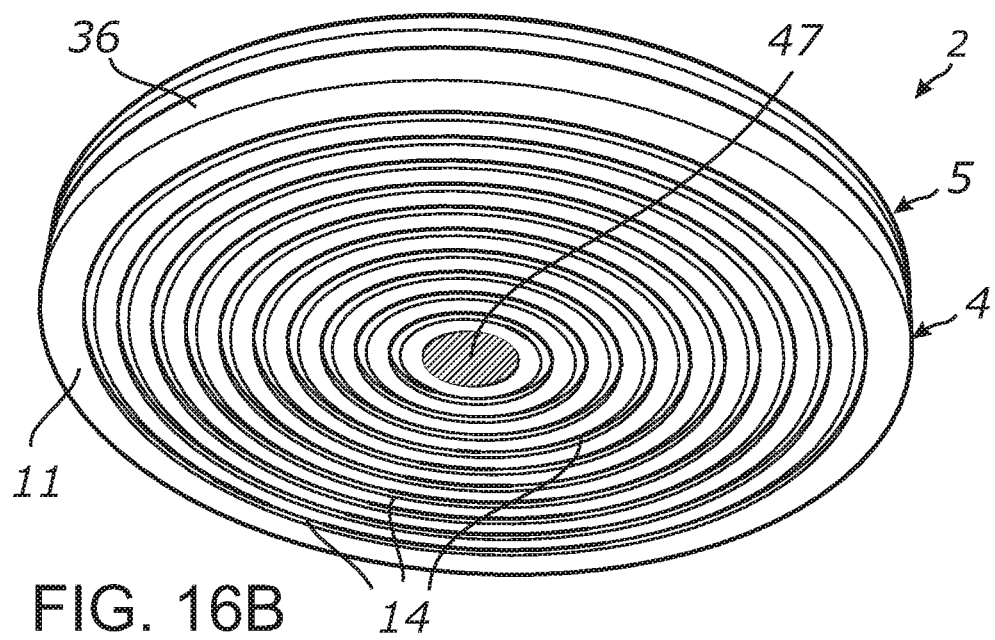

FIG. 16A and FIG. 16B illustrate different perspective views of system 2 in an exemplary annular configuration where light harvesting area 47 is located in the central portion of such an axisymmetrical, collection device. While a full-circle round configuration of system 2 is shown in the figures, it should be appreciated that the collector can be laid out in any desired shape or layout, either symmetric or asymmetric, or may comprise any desired portion of the illustrated annular configuration.

Yet further, although the foregoing embodiments of system 2 are discussing a planar configuration, the invention is not limited to planar light collection devices. It can also be applied to a case when collector array 5 and waveguide 4 are made of a flexible material which is configured for bending and can be shaped, for example, in a cylindrical configuration. It will be appreciated, however, that in response to an excessively tight bend radius, for a given thickness of waveguide, that the internal light reflections can reach below the critical angle required to achieve total internal reflections, thus leading to a loss of light.

Figure 17:
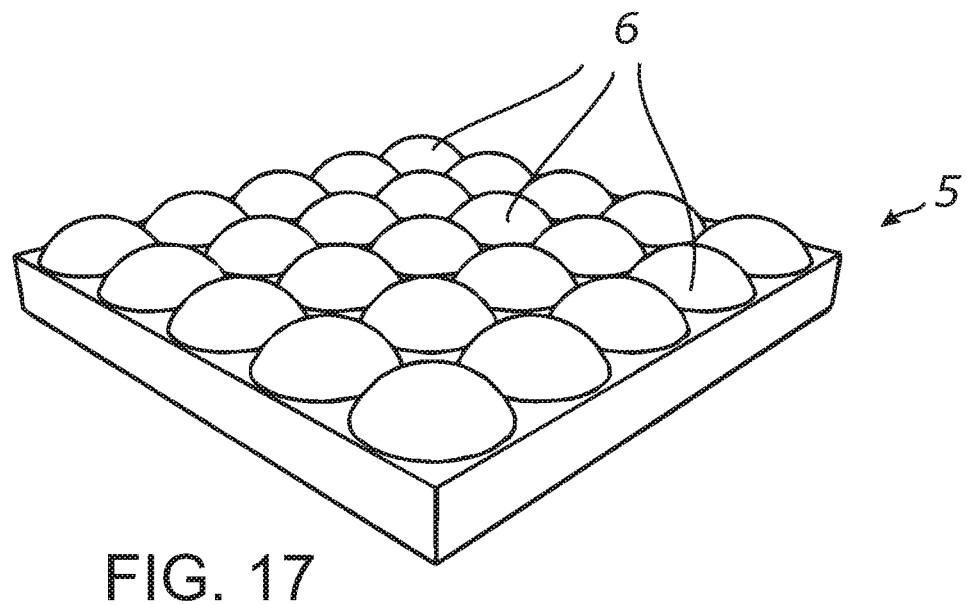
FIG. 17 is a perspective view a light collector array according to at least one embodiment of the present invention, showing the use of point focus lenses.
Figure 18:
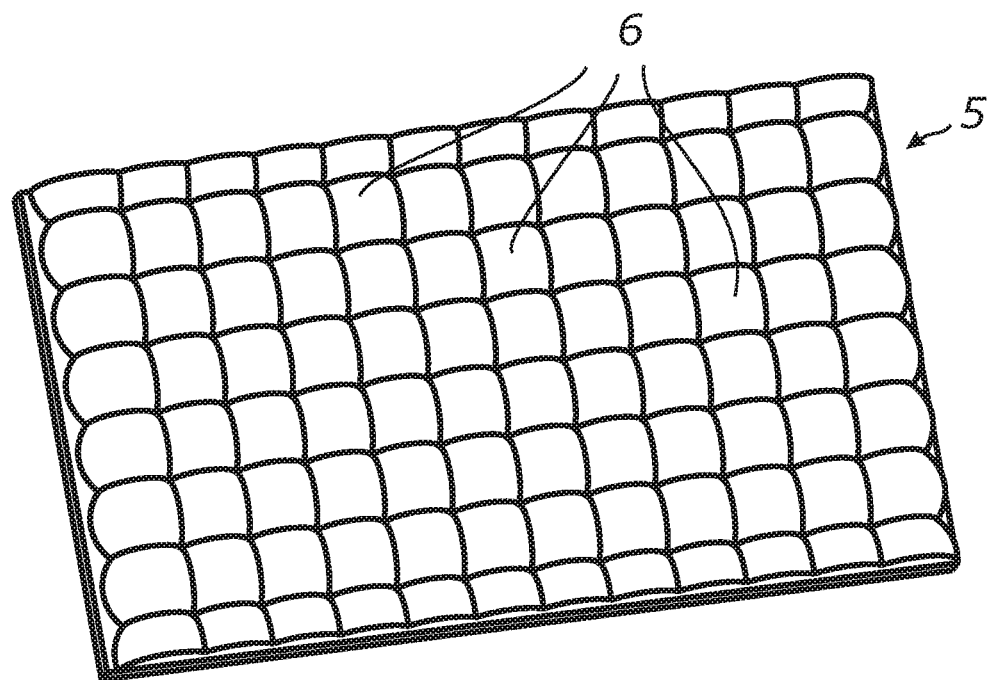
FIG. 18 is a top view of a light collector array according to at least one embodiment of the present invention, showing a different arrangement of point focus lenses than were shown in FIG. 17.
Figure 19:
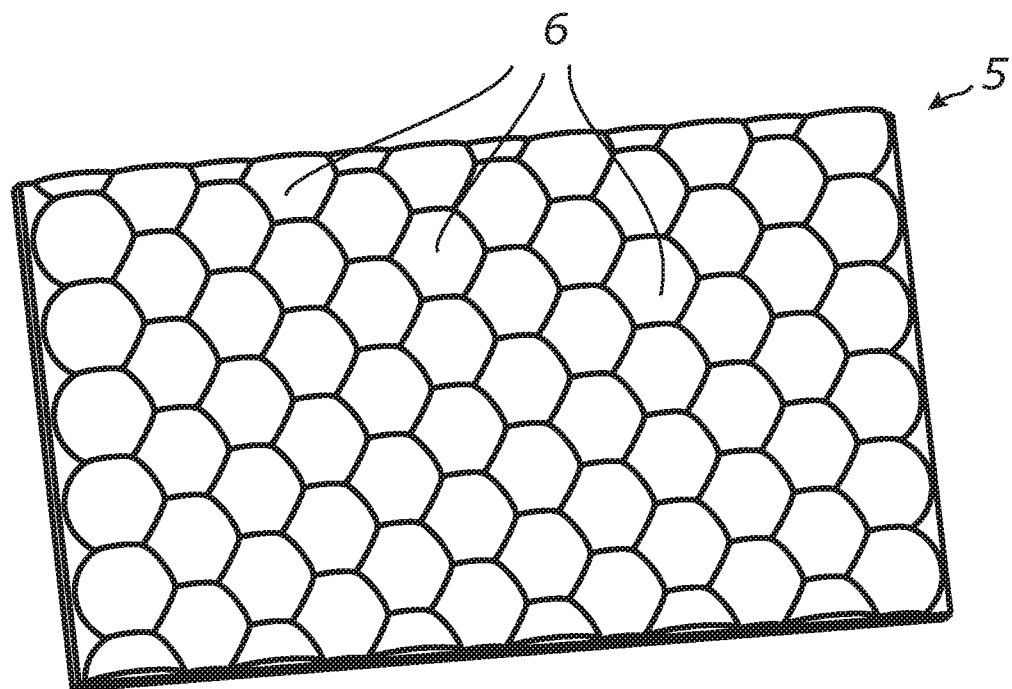
FIG. 19 is a top view of a light collector array according to at least one embodiment of the present invention, showing a different arrangement of point focus lenses than were shown in FIG. 17 and FIG. 18.

FIG. 17 through FIG. 19 illustrate point focus lens collector embodiments by way of example and not limitation. Although, the preceding embodiments described collector means which were organized in linear or lenticular configurations, the present invention can be implemented in a wide range of point focus configurations. In FIG. 17 illustrates collector array 5 formed by a planar lens array where collecting means 6 has a configuration of point-focus lenses having a round shape, positioned adjacent to each other and arranged in a regular geometric pattern, shown depicted for the sake of simplicity with rows and columns on a single transparent substrate.

In FIG. 18 the packing factor of the lenses is increased in response to eliminating the non-lens areas and overlaying small external portions of each lens. It should be understood that a packing factor of up to 100% can be achieved, for example, by using square-shaped or hexagonal lenses. Square-shaped lenses are shown in FIG. 18 which completely fills the receiving surface of collector array 5 with point-focus lenses. Collecting means 6 is shown implemented in a tight square pattern which more efficiently covers the surface area of collector array 5.

In FIG. 19 a hexagonal arrangement of collecting means 6 is shown in which point-focus lenses form a planar array with about 100% packing factor. Suitable arrangements of point-focus collecting means 6 may include other placement patterns and spacing between individual elements.

Figure 20:
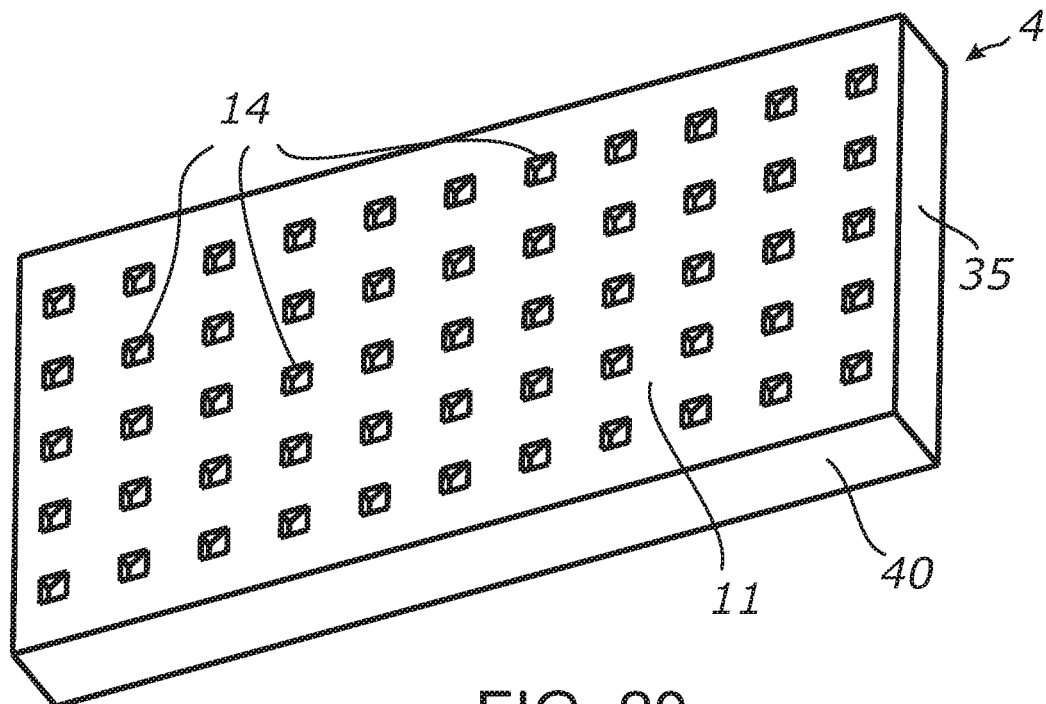
FIG. 20 is a perspective view of a plurality of deflecting means in a point focus configuration on a waveguide according to at least one embodiment of the present invention.

FIG. 20 illustrates a waveguide embodiment configured with deflecting means configured for point focus collection, such as depicted in FIGS. 17-19. When using a point focus collecting means, it will be appreciated that the deflecting means may still comprise an elongated deflecting means 14, such as shown in FIG. 4A-4B and FIG. 12, to receive focused beams from multiple focusing means 6 and inject the beams into waveguide at TIR angles with respect to at least walls 10 and 11. However, for the reasons of minimizing the interference with the light propagating in waveguide 4, as discussed above, the prismatic grooves can be separated into point focus deflectors which are each substantially smaller in width in the longitudinal direction to take advantage of the smaller size of the focal area in a point focus collector configuration versus the linear focus. By way of example, the base of a prismatic groove made in wall 11 can have a square shape dimensioned to closely approximate the focal area of the respective point-focus focusing means 6 as seen in FIG. 20. In response to the use of separate point-focus deflectors, deflecting means 14 will occupy much less volume of waveguide 4 and take much less space from wall 11 thus reducing the chance of intercepting useful light propagating in waveguide 4. FIG. 20 shows an arrangement of deflecting means 14 formed by small-area square-shaped prismatic grooves in wall 11 of waveguide 4.

By way of example and not limitation, each of the separate deflection grooves shown in FIG. 20 has a triangular or v-shaped cross section in a plane parallel to side wall 40 so that each groove forms at least one reflective face 26 to trap incident light in waveguide 4. In the figure, the combined area of deflecting means 14 when projected to a plane perpendicular to the prevailing direction of light propagation in waveguide 4, will be reduced compared to a case when linear groves extend all the way from wall 40 to the opposing side wall and can be made much smaller than the cross section of waveguide 4 in the same plane. Therefore, the interference of deflecting means 14 with the light trapped in waveguide 4 will generally be less in a point focus configuration of both focusing means 6 and deflecting means 14 in comparison to a linear focus design.

The foregoing embodiments are described upon the case when collector array 5 is of a refractive type. However, this invention is not limited to this but can also be applied to the case when collector array 5 is of a reflective type. By way of example, collector array 5 can be formed by a dense planar array of micro-mirrors in which case each focusing means 6 can be represented by a concave reflector which has a mirrored surface and is configured to focus an incident beam of light onto a respective deflecting means 14. Each mirror can have a spherical shape, parabolic shape or any other shape resulting in collection of the incident light to a substantially smaller area than the aperture area of the mirror. In another example, each mirror in collector array 5 can be formed by a micro-array of planar reflectors inclined at suitable angles, such as a Fresnel mirror, so as to result in efficient focusing of the incident radiation.

Figure 21:
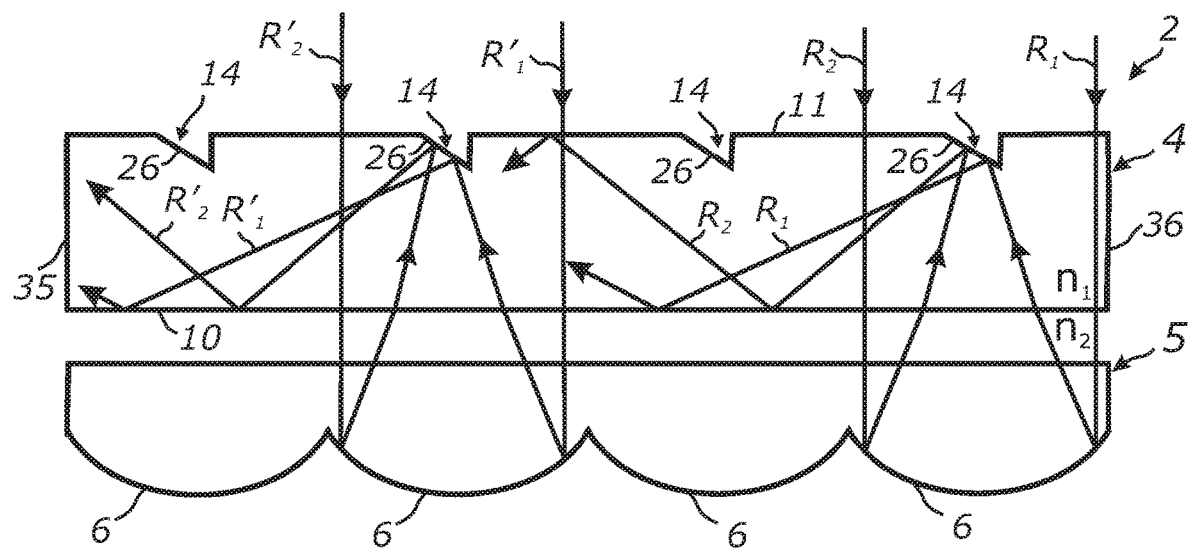
FIG. 21 is a ray tracing diagram of collection within a collector array formed by an array of micro-mirrors, according to at least one embodiment of the present invention.

FIG. 21 illustrates a collector device embodiment 2 which comprises a collector array 5 having a planar transparent body upon whose surface is disposed a densely packed array of micro-mirrors. Thus, each collecting means 6 is formed by a micro-mirror which is integral to the planar transparent body. Each micro-mirror has a curved mirrored surface that allows it to efficiently collect incident light and focus the light onto a corresponding deflecting means 14 having a substantially smaller aperture. Similarly to lenses in a lens array, micro-mirrors can be designed in linear or point focus configurations. Waveguide 4 is configured in the form of a planar transparent plate whose refractive index is greater than that of the outside media. In similar manner as the examples discussed above, each deflecting means 14 can comprise a prismatic grooved feature in wall 11 having reflective face 26 and which is optically coupled to waveguide 4. Both parallel walls 10 and 11 of waveguide 4 are also made transparent to the incident light.

In operation, incident ray $R_1$ enters waveguide 4 first, and passes through the waveguide into collector array 5. Ray $R_1$ is further focused by the mirror surface of an individual focusing means 6 and is directed to the face 26 of a prismatic groove of a respective deflecting means 14. Face 26 is inclined with respect to a surface normal direction to walls 10 and 11 and it redirects ray $R_1$ into waveguide 4 at an angle with respect to a normal to walls 10 and 11 greater than critical angle $\theta_C$, so that ray $R_1$ further propagates in waveguide 4 by means of at least TIR toward terminal end 35. Accordingly, rays $R_2$, $R'_1$ and $R'_2$ are also injected into waveguide 4, trapped in waveguide 4 by means of TIR and directed generally toward the same direction. Similarly to the light collection system of FIG. 12, a transparent cladding or buffer layer made of low-n material can be laid between collector array and waveguide 4. Further, a cladding and/or protective layer or layers can be added to wall 11 and/or side walls of waveguide 4 to protect it from the environment. Further details of operation of system 2 shown in FIG. 21 as well as its possible variations configurations will be apparent from the foregoing description of preferred and other embodiments.

Figure 22:
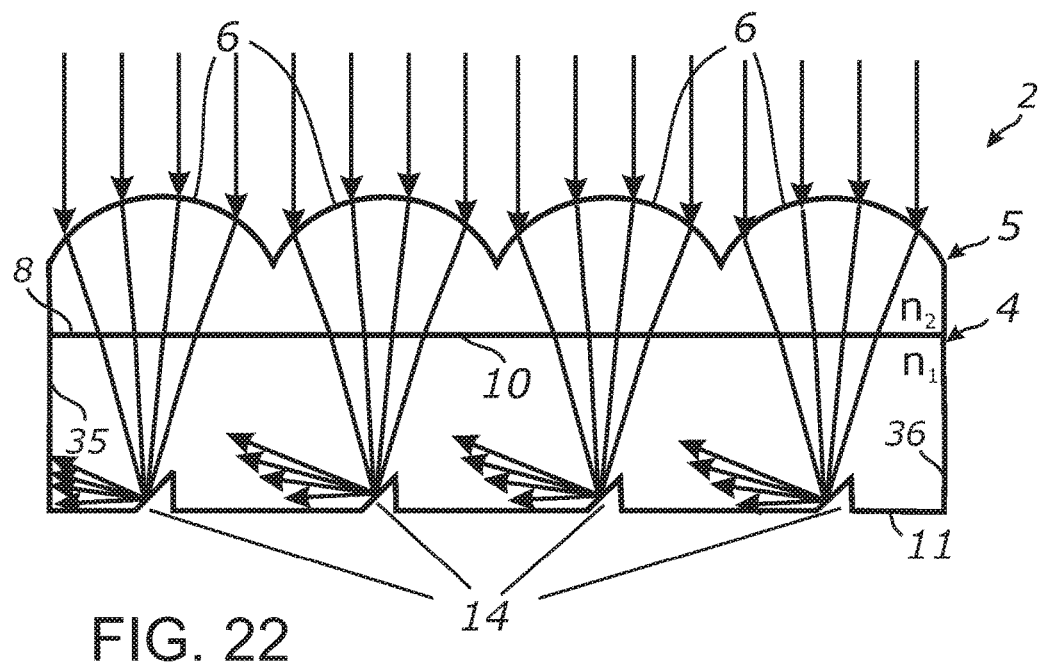
FIG. 22 is a ray tracing diagram of a lens array directly coupled to a waveguide and having a lower refractive index than the waveguide, according to at least one embodiment of the present invention.

FIG. 22 illustrates an example embodiment which does not include the cladding material between the collector and the waveguide. The preceding embodiments have been described comprising a space or a cladding layer between collector array 5 and waveguide 4 which has a suitable optical interface 8 for trapping light in waveguide 4 formed by the interface between waveguide 4 and that space or cladding layer. However, it should be appreciated that embodiments of the present invention are not limited to the use of this cladding space. Alternatively, as exemplified in FIG. 22, the stepped drop in refractive index outwardly from waveguide 4 can also be created by providing a smaller refractive index for collector array 5 compared to that of waveguide 4.

In FIG. 22 is depicted a cross section of a waveguide 4 in which a refractive index $n_1$, collector array 5 has a refractive index $n_2$ with $n_1 > n_2$. More particularly, collector array 5 is configured with a lower refractive index $n_2$ than waveguide 4 and can be disposed thereon (e.g., molded directly on waveguide 4 or otherwise attached to wall 10), so that the line of its attachment to the waveguide forms interface 8 which allows rays to enter into waveguide through wall 10 but reflects outgoing rays that have an incidence angle greater than critical angle $\theta_C$. By way of example, a high refractive index glass, such as LASF35 glass manufactured by Schott and having the refractive index $n_1$ of around 2, can be used for waveguide 4 while PMMA with refractive index $n_2$ of around 1.49 can be used to create such interface 8 at wall 10 of the waveguide. As with the examples described above, each light deflecting means 14 redirects light incident from the respective focusing means 6 at an angle greater than a critical angle of TIR, which is in this case is about 48.16° that results in trapping the light in waveguide 4 and concentrating the light at wall 35.

The present invention is also not limited to the case when collector array 5 and waveguide 4 are disposed in a stationary position with respect to each other and can also be applied to the case when collector array 5 and waveguide 4 can be disposed in any one of a translated, a reversed, and/or a rotated orientation relative to each other toward achieving different light concentration or altering the acceptance angle. Furthermore, collector array 5 and waveguide 4 can be made movable with respect to each other to provide for fine tuning the acceptance angle or for tracking the source of light.

2. Illuminator Embodiments

The present invention teaches both optical collector embodiments as described above, and optical illumination devices which are discussed below.

Figure 23A:
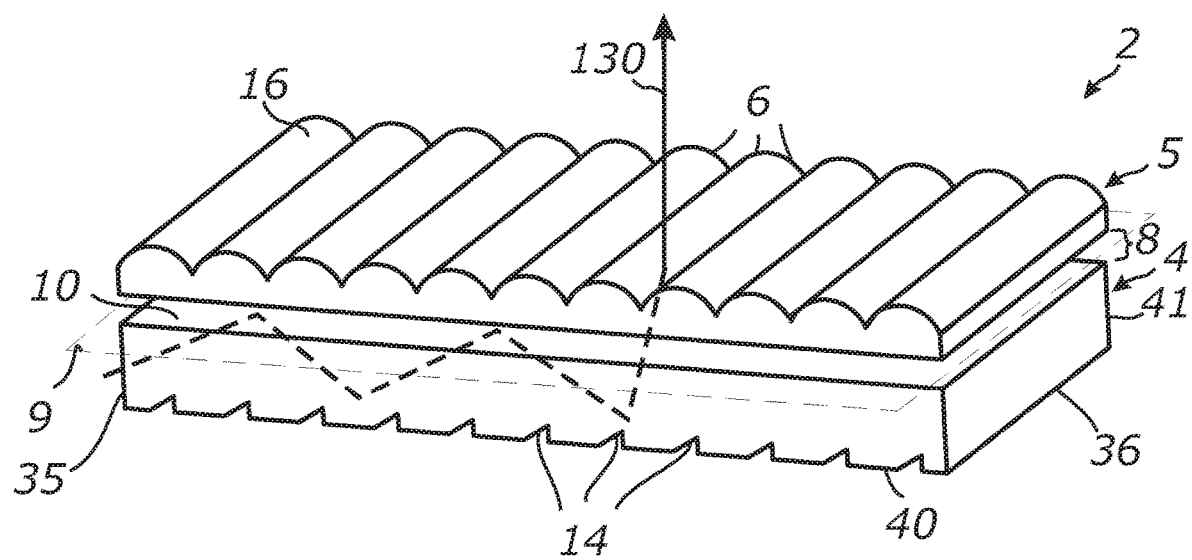
FIGS. 23A and 23B are perspective views of the compact light collection system according to at least one embodiment of the present invention, showing elongated (linear) deflectors and lenses operating in combination.
Figure 23B:
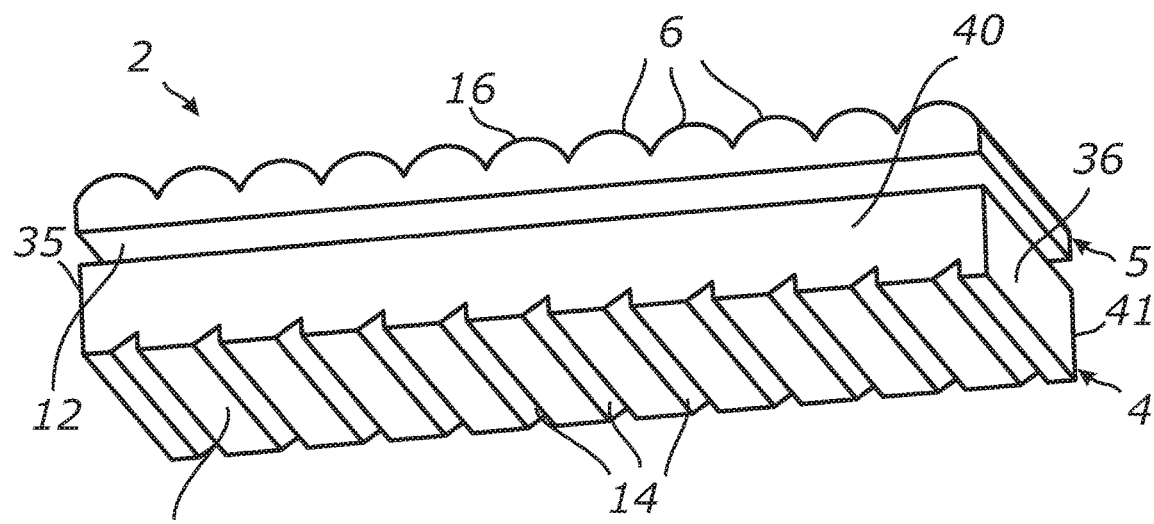

FIG. 23A and FIG. 23B illustrate example embodiments of an illumination device. Referring to FIG. 23A, optical illumination device 2 is shown by way of example comprising a optically transparent multimode planar waveguide 4 and a light collimating array 5, such as a planar lenticular lens array, disposed adjacent to waveguide 4 so that waveguide 4 and lens array 5 form a planar sandwich-like configuration. FIG. 23B provides a better view of the waveguide portion of the device shown in FIG. 23A. It should be appreciated that although the planar waveguide is optically transparent, it can be subject to optically losses and need only be sufficiently optically transmissive for the given application to which it is directed.

Referring to FIG. 23A and FIG. 23B, waveguide 4 is formed by an optically transmissive body having a general appearance of a rectangular transparent plate or a slab. Waveguide 4 is configured to have opposing light transmissive faces 10 and 11 extending parallel to a predominant plane 9, a side face 40 and an opposing side face 41 generally perpendicular to faces 10 and 11, as well as opposing terminal faces 35 and 36 each being generally perpendicular to faces 10, 11, 40 and 41. The thickness of waveguide 4 is selected to be substantially less than the planar dimensions (length and width) of the waveguide 4 so that the surface area of either planar face 10 or 11 is substantially larger (e.g., preferably one or more orders of magnitude) than the area of at least one of the terminal faces 35 and 36. Furthermore, waveguide 4 is configured to transmit light by means of a total internal reflection (TIR) along at least its light conducting faces 10 and 11 and generally toward at least one of the terminal faces 35 and 36. By way of example, waveguide 4 can be configured so that a light ray entering waveguide 4 through its face 35 can be guided generally in one direction toward the opposing face 36 by means of light conduction through the body of waveguide and by means of bouncing the light from faces 10 and 11 due to TIR.

If used at optical frequencies, waveguide 4 can be made from any highly transparent material such as glass, PMMA or polycarbonate. Other transparent materials or substances, such as a liquid or a silicon rubber can also be used for making at least a portion of the body of waveguide 4. In order to enhance its optical guiding ability, the material of waveguide 4 can have a relatively high index of refraction, and can be surrounded by a material with lower refractive index. In such a case, the structure can guide optical waves by means of TIR and can be characterized by a critical angle $\theta_C$ so that when a ray of light propagating within waveguide 4 strikes a waveguide boundary at an angle larger than $\theta_C$ with respect to the normal to the boundary surface, the ray is reflected back into waveguide 4. Faces 10 and 11 should normally be smooth or polished so as to avoid or minimize parasitic light scattering when undergoing TIR reflections from the faces. When appropriate, face 11 can be configured with a mirrored surface to enhance light guiding properties of waveguide 4.

Additionally, side edges of waveguide 4 (faces 40 and 41 in FIG. 23A and FIG. 23B) can be configured as smooth surfaces capable of reflect light by means of TIR or specular reflection so that the light is kept in the waveguide even when it reaches either of the side edges of waveguide 4. Metallization, a reflective film or other type of mirror finish can be applied to either one or both faces 40 and 41 to further enhance reflectivity and the ability of the waveguide to conduct light. Face 36 can also be made specularly reflective in order to reflect any light arriving at it from the inside of waveguide 4 back into the waveguide thus effectively reversing the path of the light back toward face 35.

In accordance with a preferred embodiment, waveguide 4 comprises a plurality of light deflecting elements optically coupled to waveguide 4. The term "optically coupled" is meant herein to describe any relationship between a first optical component and a second optical component which enables light to pass from the first optical component to the second optical component. Reference to optically coupled does not preclude various forms of optical losses. Also, it should be appreciated that this term also includes implementations in which the first and second optical components are separated by one or more optical interfaces or layers at which the light may undergo respective optical losses (e.g., parasitic reflections, Fresnel reflections, attenuation, and so forth) and/or changing of its direction of propagation (e.g., refraction at the interface between two media having different refractive indexes). For the purpose of demonstrating a preferred mode of the present invention, the light deflecting elements are represented by surface relief features associated with face 11, more specifically, parallel v-shaped prismatic grooves 14 made in face 11, as shown in FIG. 23A and FIG. 23B.

As previously described, prismatic grooves 14 can be produced by any of a variety of known methods of creating surface relief such as micro-structures and/or texture. These structures can be fabricated using a technique for direct material removal including mechanical scribing, laser scribing, micromachining, etching, grinding, embossing, imprinting from a master mold, photolithography, other known mechanisms, and combinations thereof. If required, the faces of prismatic grooves 14 can be further polished to obtain a very smooth surface. It will be appreciated that waveguide 4 can also be made with grooves already embedded into it by means of casting, injection molding, compression molding or the like processes, such as might arise in a mass production environment.

Alternatively, waveguide 4 can incorporate a layer of transparent material, such as a plastic film or thin transparent plate, attached to face 11 and the prismatic grooves 14 can be formed in that layer. Optical lithography can be used to create the required pattern in a light-sensitive chemical photo resist by exposing it to light (typically UV) either using a projected image or an optical mask with a subsequent selective removal step of unexposed parts of a thin film or the bulk of a substrate.

In another alternative, the transparent material can be overmolded onto waveguide 4 in the respective areas and prismatic grooves 14 can be formed in the overmold. A negative replica of prismatic grooves 14 can be made by diamond cutting/machining, laser micromachining, ion beam etching, chemical etching, or any similar material removal technique followed by imprinting in an overmold process. In the illustrated case, prismatic groves 14 or tapered prismatic voids in face 11 extend end-to-end from face 40 to face 41 and are optically coupled to waveguide 4 directly through the surface of waveguide 4, preferably without the use of additional optical interfaces or layers which are subject to associated losses.

Referring again to FIG. 23A and FIG. 23B, lens array 5 is formed by an optically transmissive body having a generally planar rectangular shape with the length and width dimensions approximating those of waveguide 4. Lens array 5 is configured to have a planar face 12 facing waveguide 4 and forming an entrance aperture and an opposing face 16 forming an exit aperture. Further, lens array 5 comprises a plurality of cylindrical linear lenses 6 (also referenced heretofore to as lenslets) associated with face 16 and arranged on a single substrate in a planar array. The individual lenslets of lens array 5 are made an integral part of the body of lens array 5 and positioned adjacent to each other with a high packing factor to form a generally planar, three dimensionally textured surface. Lenses 6 forming planar lens array 5 can be lenticular, linear-focus, or point-focus and can be packed with any desired density covering the entrance aperture of lens array 5. The lens array can be fabricated using any conventional method such as replication, molding, micromachining, chemical etching, beam etching and the like. The individual lenses can be made an integral part of collector array 5 and made from the same material as that of the body of the array. Alternatively, the lens array can be formed on a transparent substrate plate and can be made either from the same or a different material than the substrate plate. Individual lenses can also be made as separate pieces and attached to the substrate plate. The placement of lenses in the lens array can be arranged according to any desired pattern, insofar as the light is collected on the deflection elements within the waveguide. For example, the lenses can be spaced apart, contacting each other or overlapping and can be positioned in any desired pattern in the planar array.

Lens array 5 is positioned in a close proximity and generally parallel to waveguide 4 and disposed in an energy receiving relationship with respect to waveguide 4. Energy receiving relationship is meant to mean any relationship between waveguide 4 and collector array 5 which enables light exiting waveguide 4 to enter into the collector array. According to a preferred embodiment, collector array 5 is positioned to receive light emerging from waveguide 4 through its face 10. For this purpose, lens array 5 is aligned with respect to waveguide 4 so that its face 12 is disposed in a close proximity and parallel to face 10 of waveguide 4 forming a sandwich structure. Face 12 of lens array 5 is configured to transmit a substantial portion of light emerging from face 10 of waveguide 4 into lens array 5.

The number and placement of individual lenslets in lens array 5 are selected so that each lens 6 corresponds to a prismatic groove 14, extends parallel to the prismatic groove 14 and is aligned with respect to the prismatic groove 14 along a perpendicular to face 10 of waveguide 4.

Each prismatic groove 14 is configured to intercept a portion of the light beam propagating through waveguide 4 by its active area (also referenced heretofore as an entrance aperture of prismatic groove 14) and redirect the portion of the light beam toward face 10 of waveguide 4 and at a greater angle with respect to face 10 so that the condition of TIR is not met for the redirected light and it can exit from waveguide 4 and subsequently enter lens array 5.

Each lenslet in lens array 5 is configured to receive a divergent beam of decoupled light emerging from waveguide 4 after being redirected by a matching prismatic groove 14 and collimate the divergent beam into a quasi-parallel beam propagating perpendicular to plane 9 and away from optical device 2.

Naturally, one of the best modes illustrating the present invention may employ such an arrangement of optical device 2 in which each prismatic groove 14 is disposed at or near the focus of the respective lens 6 and the receiving aperture of prismatic groove 14 is substantially smaller than the entrance aperture of the respective lenslet 6. Prismatic grooves 14 can be made sufficiently spaced apart from the respective lenses 6 to allow for efficient light collimation. For the purpose of this invention and from the practical standpoint, the terms "focal area" or "focus" of lens 6 should be understood broadly and generally refers to a relatively small area within the envelope of a focused beam that the lens 6 would have produced if illuminated by a generally parallel input beam of light. The focal area generally has a cross section substantially smaller than the cross section of respective lens 6. Accordingly, the focal area can also include areas at a relatively small distance from the "ideal" focus of lens 6 and also where the focused beam can be convergent (before focus) or divergent (after focus).

In accordance with this invention, it is preferred that an effective focal length of each lens 6 is substantially shorter than the dimensions of faces 10 and 11 in order to achieve better compactness of device 2. For the purpose of this invention, the term "effective focal length" generally refers to the distance between lens 6 and its focus. This term should also be understood broadly and it also includes the cases when the focal length of the same lens 6 can change depending on the optical properties of the material filling up the space between lens 6 and the focus. Accordingly, the location of the effective focal area, and thus focal length, may be different if a different material separates lens 6 and its focal area. By way of example, for the same parameters of lens 6, its focal distance can be longer in PMMA material than in the air due to the difference in refractive indexes.

In accordance with preferred embodiments, waveguide 4 should be optically separated from lens array 5 by at least one optical interface that allows for propagating the light in waveguide 4 by means of TIR without escaping into array 5. A suitable optical interface 8 can be created by various means. For example, interface 8 can be a physical boundary or wall of the body of waveguide 4 which is surrounded by outside media with lower refractive medium, such as air. Alternatively, it may comprise an interface between two media having different refractive indices so that the refractive index decreases along the optical path from waveguide 4 toward lens array 5. By way of example and not limitation, an interface of this type can be obtained by separating waveguide 4 from the body of lens array 5 (or from bodies of individual lenses 6) by introduction of a thin layer of air, lower refractive index material, or any other boundary between higher and a lower refractive index material. In a more specific example, interface 8 can comprise an interface between glass, PMMA or polycarbonate (high refractive index) and a low refractive index polymer or air. By way of example, waveguide 4 can be partially or entirely surrounded by ambient air. Alternatively, a layer of cladding material can be provided between waveguide 4 and lens array 5 in which case, the optical device can form a monolithic system while maintaining the same basic structure and operation. In at least one preferred embodiment of the present invention, waveguide 4 spaced apart from lens array 5 so that a layer of ambient air is disposed therebetween with interface 8 formed by face 10 being the boundary between waveguide 4 and layer of ambient air.

In operation, the optical device illuminator can be better understood from a cross sectional schematic representation of the device and its components, as well as from analyzing the paths of individual light rays in the device.

Figure 25:
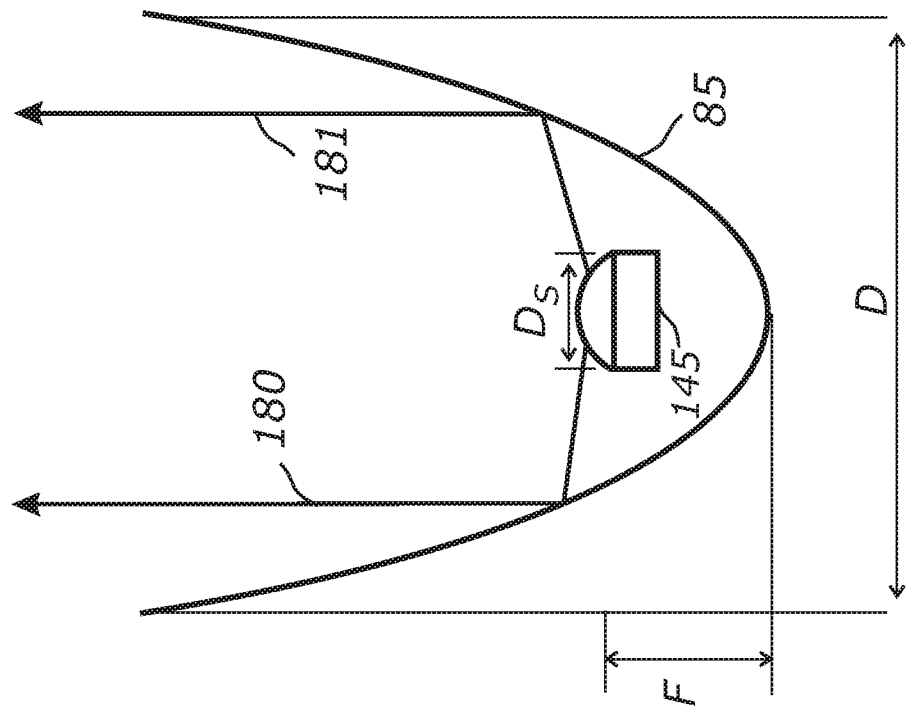
FIGS. 24 and 25 are ray tracing diagrams for conventional light collimation system.
Figure 24:
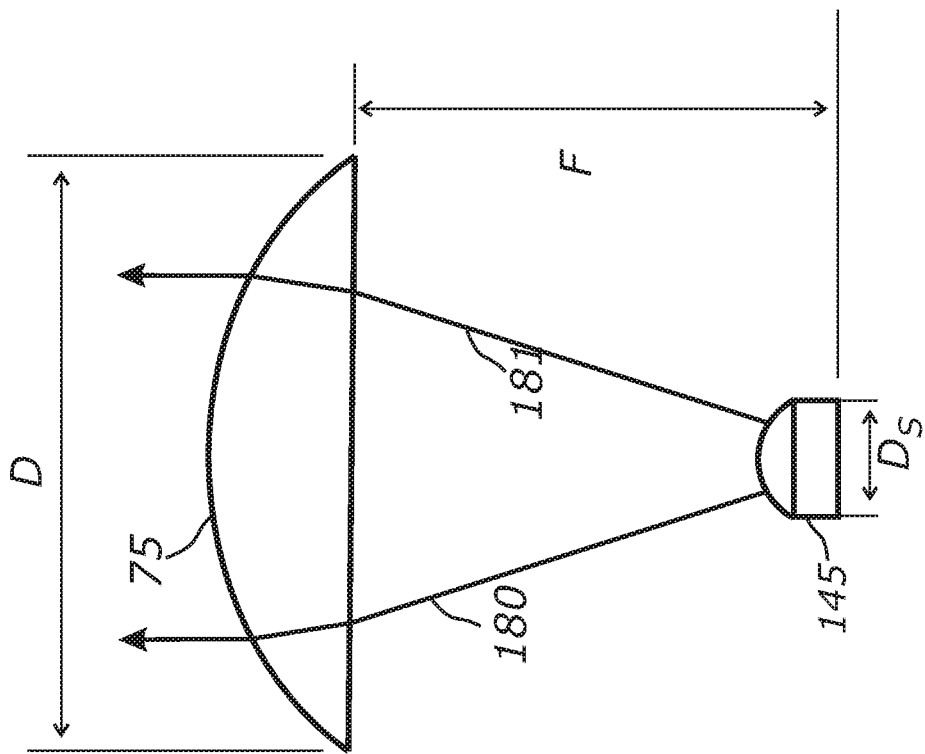

First, turning to the prior art, FIG. 24 and FIG. 25 illustrate the operation of conventional collimating systems typically employing a large-aperture optical collimating device such as lens 75 (FIG. 24) or mirror 85 (FIG. 25). Rays 180 and 181 emanating from light source 145 are being collected by the receiving aperture of the collimators and directed/collimated in a direction parallel to the optical axis and perpendicular to the focal plane of lens 75 or mirror 85. Each lens 75 and mirror 85 can be characterized by a transversal size D and a focal length F. In the prior art, an uncollimated light source 145 is usually placed in the focus of the lens or mirror at a considerable distance from the collimating device. Also, it will be appreciated by those skilled in the art that, when light source 145 has a finite transversal size $D_S$, in order to obtain useful collimation of the light, the collimator's size D should be significant larger than $D_S$ as a matter of optics. These aspects of the conventional design result in overall size and weight increases which limit applicability.

In comparison to the above, an embodiment of optical device 2 as FIG. 23A is configured so that a ray 130 enters waveguide 4 from its edge and is propagated through waveguide 4 by TIR until it strikes one of the prismatic grooves 14 which deflect ray 130 out of the waveguide and toward lens array 5. A lenslet 6 further collects ray 130 and collimates it into a direction generally perpendicular to plane 9. Further details of the operation of device 2 and the path of ray 130 illustrated in FIG. 23A will be apparent from FIG. 4A and its description considering the reversing of ray 30.

Figure 26:
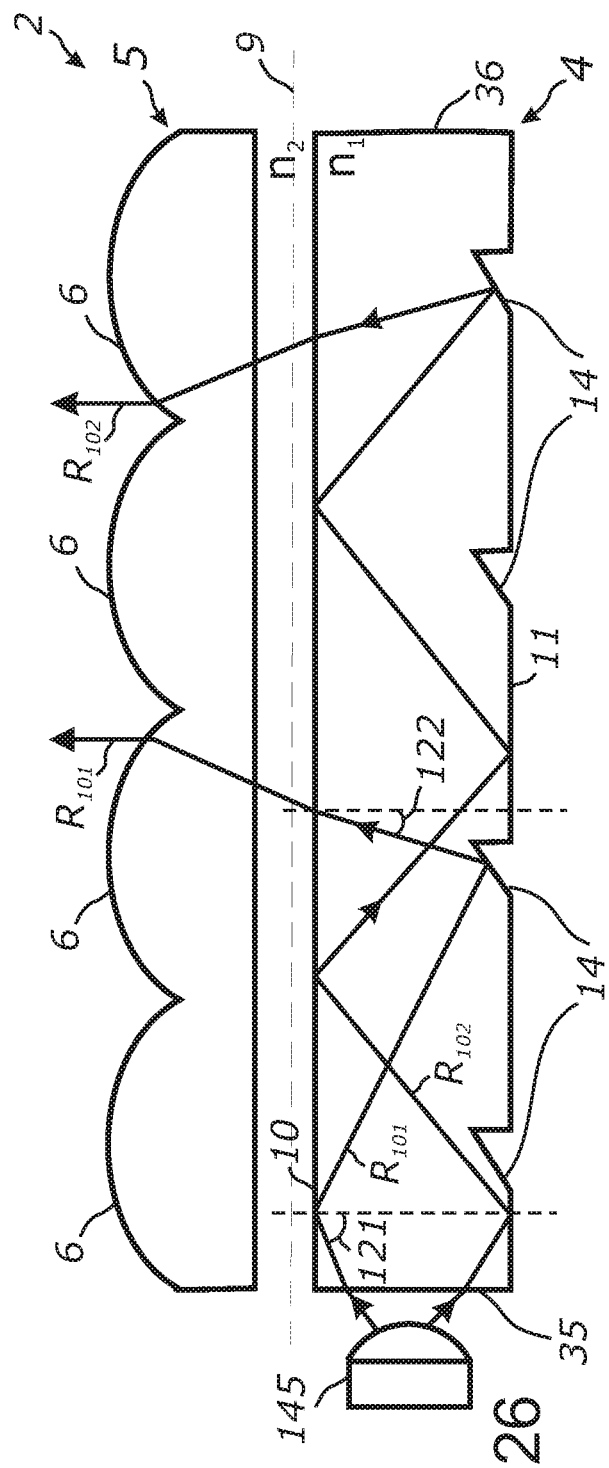
FIG. 26 is a cross section view of a planar lens array and prismatic grooved features shown operating within an illuminator according to at least one embodiment of the present invention.

FIG. 26 illustrates an example illuminator embodiment 2 shown configured for collimating otherwise uncollimated light emanated by light source 145 in a more space efficient manner. Source 145 is positioned so that it illuminates an edge of waveguide 4, the edge represented by face 35, allowing the light to enter waveguide 4 and propagate in the waveguide generally toward the opposing face 36 while being confined between faces 10 and 11 due to TIR. Light source 145 can be of any known type, including but not limited to incandescent lighting, heat emitting bodies, light emitting diodes (LEDs), lasers, sunlight, light/heat scattering, radiating surfaces, or any other devices or combinations thereof adapted for generating light. The shape of the incident beam may be optionally formed by any desired optical system which provides a suitable angular and/or spatial energy distribution in the beam illuminating the side edge of waveguide 4. For example, a light collimating device can be used to produce a beam of light with a suitable angular spread. In another example, one or more optical fibers can be used to deliver and input light into waveguide 4 through face 35.

In at least one preferred implementation of FIG. 26, waveguide 4 comprises a highly transparent material having a refractive index $n_1$ which should be generally greater than a refractive index $n_2$ of the outside medium ($n_1 > n_2$). In an exemplary case of waveguide 4 being made from PMMA or glass, $n_1$ can be a value of about 1.5. In response to the presence of a thin cushion space between collector array 5 and waveguide 4, there is a layer of air whose refractive index is about 1, and which adjoins face 10 of waveguide 4. Furthermore, since waveguide 4 is surrounded by air, the refractive index increases outwardly at each external face of waveguide 4 including faces 10 and 11. Faces 10 and 11 serve as TIR reflectors for light propagating in waveguide 4 at angles with respect to a surface normal direction of faces 10 and 11 greater than $\theta_C$, which is a critical angle of TIR. Face 10 serves as optical interface 8 between waveguide 4 and lens array 5.

According to Snell's law of optics, when light passes through a boundary between a first refractive medium and a second refractive medium, $n_1 \sin \phi_1 = n_2 \sin \phi_2$, where $n_1$ and $n_2$ are the refractive index of the first medium and the second medium, respectively, with $\phi_1$ and $\phi_2$ being the angle of incidence and the angle of refraction, respectively. Furthermore, the critical angle of TIR $\theta_C$ is the value of $\phi_1$ for which $\phi_2$ equals 90°. Accordingly, $\theta_C = \arcsin(n_2/n_1 \cdot \sin \phi_2) = \arcsin(n_2/n_1)$, which makes $\theta_C$ approximately 42.155° for an exemplary case of the interface between PMMA with the reflective index $n_1$ of about 1.49 and air with $n_2$ of about 1.

Prismatic grooves 14 are formed in face 11 where the size of individual prismatic grooves 14 and their number are selected so that they can be spaced from each other by a distance which is generally substantially larger than the receiving aperture of each prismatic groove. Prismatic grooves are shown as identical structures and approximately evenly spaced along face 11 in FIG. 26. However, it should be appreciated that these structures can have different individual sizes, shapes, and spacing without departing from the teachings of the present invention.

Each prismatic groove 14 is configured to have a light receiving aperture comprising a sloped reflective face that is positioned to intercept a portion of the light propagating along waveguide 4 and redirect the portion of light toward face 10 at such an angle so as to result in the portion of light passing through face 10 and into lens array 5. This can be achieved by the following. At least one face of each prismatic groove 14 is made reflective. The face of prismatic groove 14 is also exposed to the light propagating along waveguide 4 and positioned at an angle with respect to the prevailing direction of the light propagation in waveguide 4. As a result, the light incident onto the exposed face of prismatic groove 14 is redirected from its original propagation path in waveguide 4 and is directed onto face 10 of waveguide 4 generally at an angle with respect to face 10 which exceeds the TIR angle, thus allowing the redirected light to exit (decouple) from waveguide 4.

Upon exiting from waveguide 4, the redirected light enters lens array 5 and is collected by lens 6 matching the respective prismatic groove 14. Since prismatic groove 14 is disposed at or near the focus of the respective lens 6 in a matching groove-lens pair, the light collected by lens 6 is collimated into a generally parallel beam propagating along the optical axis of lens 6. When each of the lenses 6 forming lens array 5 has an optical axis perpendicular to the lens array 5 and the matching prismatic groove 14 is disposed on the optical axis, lens array 5 will form an array of collimated beams propagating away from it and perpendicular to its surface. Thus, the optical illuminator device receives a generally uncollimated light incident on its side edge, distributes the light through the body of waveguide 4 and emits a highly collimated parallel beam of light from the device's frontal surface.

More particularly, the operation of the optical illuminator device can be illustrated by exemplifying the paths of individual light rays. Referring again to FIG. 26, a ray $R_{101}$ is seen emanating from light source 145 and entering waveguide 4 through face 35, at a skew angle with respect to face 10, and which then strikes face 10. In response to an angle of incidence 121, with respect to the surface normal direction of face 10, which is greater than TIR angle $\theta_C$, ray $R_{101}$ is reflected back into waveguide 4. Ray $R_{101}$ then approaches face 11 and strikes a reflective face of prismatic groove 14 where it is redirected again toward face 10 of waveguide 4 at an angle for which the condition of TIR is not met at the optical interface created by face 10 and the outside media. Thus, prismatic groove 14 provides a deflection angle for ray $R_{101}$ to assure that $R_{101}$ is deflected to an angle of incidence 122 that is smaller than $\theta_C$. In response to this angle of incidence, redirected ray $R_{101}$ has an angle which is now smaller than $\theta_C$, wherein ray $R_{101}$ exits from waveguide 4 through face 10 with some bend due to refraction, passes through a thin layer of lower refractive index medium and enters lens array 5 where it is intercepted by lens 5 and directed away from optical device 2 in a direction generally perpendicular to the prevailing plane 9 of optical device 2.

Similarly, a different ray $R_{102}$ emitted by source 145 and entering waveguide 4 at a skew angle with respect to waveguide faces 10 and 11 propagates along waveguide 4 by bouncing from its faces until it strikes a different prismatic groove 14 at face 11. Ray $R_{102}$ is also redirected back toward face 10 at an incidence angle which is smaller than $\theta_C$ that allows ray $R_{102}$ to decouple from waveguide 4 and enter the respective lens 6 which further collimates $R_{102}$ generally into the same direction as ray $R_{101}$. It will be appreciated by those skilled in the art that additional rays randomly entering face 35 within a pre-determined range of angles will be initially trapped in waveguide 4 and propagated toward face 36, and then in response to striking a prismatic groove 14 the rays are deflected out of the waveguide and collimated by the lens array 5.

Figure 27:
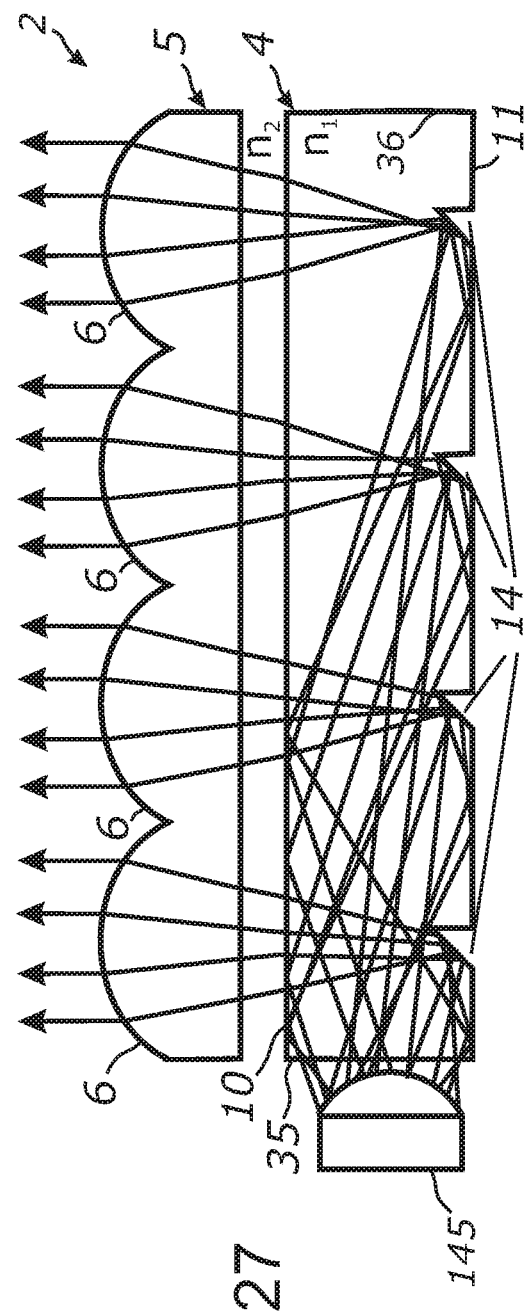
FIG. 27 is a detailed ray tracing diagram of the illuminator device shown in FIG. 26.

FIG. 27 illustrates an embodiment of illumination device 2 having a plurality of lenses 6 which intercept and redirect the random rays emitted by source 145 and injected into waveguide 4 through face 35. The redirected rays are decoupled from waveguide 4 and are further collimated by lens array 5 into a parallel beam. As the light passes through the illumination device it is deflected, distributed and collimated prior to exiting lens array 5.

It should be understood that, while only few rays are shown in FIG. 27 for the sake of illustrative clarity, the optical illumination device can operate with any number of rays within a predetermined acceptance angle and in a desired spectral range of the incident light. Accordingly, prismatic grooves 14 can be configured to receive a fan of rays having a predetermined angular spread and redirect the rays at a sufficient bend angle so that at least a substantial portion of the rays is decoupled from waveguide 4 and is further collimated by lens array 5. It will be recognized, therefore, that if a moderately divergent beam of monochromatic or broad-spectrum electromagnetic energy enters planar waveguide 4 through a small-area terminal end of the waveguide, the light is distributed through the volume of the waveguide and exits as collimated light (substantially parallel) across a substantially larger surface area.

Only four prismatic grooves 14 and four matching lenslets 6 are shown in each of FIG. 26 and FIG. 27 for clarity. However, it should be understood that waveguide 4 and lens array 5 can incorporate any suitable number of prismatic grooves 14 and lenses 6, respectively, to provide for a desired operation and light extraction and collimation. In order to increase the decoupling efficiency of light propagating in waveguide 4, the sizes and placements of individual prismatic grooves can be so selected and the longitudinal dimensions of waveguide 4 can be increased to a point when practically all of the light rays incident into waveguide 4 through its face 35 have a chance of being decoupled and collimated, so that practically no optical energy is lost.

Additionally, it will be appreciated that face 36 can be mirrored and/or inclined at an angle with respect to face 10 so that the light rays reaching face 35 will be directed back into waveguide 4 as their propagation direction will be reversed which will increase the light extraction/decoupling efficiency. For this purpose, the second face of each prismatic groove 14 can be made reflective and positioned at a suitable angle to intercept the reversed rays and decouple them in the manner described above. Also, as described above, various faces of waveguide 4 participating in TIR can be selectively mirrored and/or provided with a cladding layer to promote reflection and protection of the device from the environment. Mirroring can be obtained by depositing a reflective layer using any known means, such as, for example utilizing a coating, such as silver, aluminum, or laminating with a reflective film, or other known techniques and combinations for increasing the efficiency of light reflection.

The size of prismatic grooves 14 is exaggerated for clarity in the illustrations discussed above. However, it should be understood that the individual grooves 14 should preferably be substantially smaller in size than the width of each respective lenslets 6 toward improving collimation efficiency. Furthermore, it should be understood that the dimensions of the prismatic grooves 14 is also exaggerated for clarity with respect to the dimensions of waveguide 4 as well, while a specific application may require a micro-scale size of prismatic grooves 14 whereas lens array 5 may comprise a large number of micro-lenses which can be very small compared to the dimensions of the array.

Figure 28:
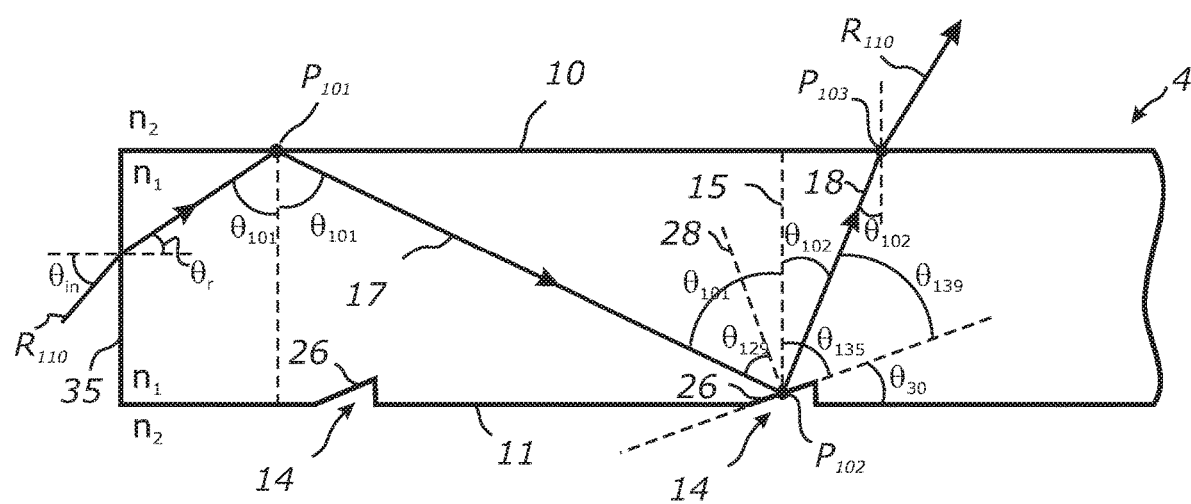
FIG. 28 is a detailed ray trace of light traversal through the waveguide of an illuminator according to at least one embodiment of the present invention.

FIG. 28 depicts a detailed ray tracing according to at least one embodiment of the illumination device according to the present invention. Waveguide 4 is configured with a higher refractive index $n_1$ than the surrounding medium ($n_2$) which permits propagation of a ray despite it being received at a relatively sharp angle with respect to the prevailing material plane and surfaces 10 and 11. As shown in the figure, a ray $R_{110}$ impinges onto face 35 of waveguide 4 at an incidence angle $\theta_{in}$ with respect to a normal to face 35 and enters waveguide 4 at a refraction angle $\theta_r$ with respect to a surface normal direction of face 35.

Ray $R_{110}$ can propagate in waveguide 4 when its refraction angle $\theta_r$ permits for TIR at faces 10 and 11. Therefore, a maximum refraction angle $\theta_{r\,max}$ can be defined as $90-\theta_C$. From Snell's law the equation $n \sin \theta_{in\,max} = n_1 \sin \theta_{r\,max}$, is obtained where n is the refractive index of the medium adjacent to face 35 of waveguide 4 and $\theta_{in\,max}$ is a maximum incidence angle that waveguide 4 will accept. Since $\sin \theta_{r\,max} = \sin(90° - \theta_C) = \cos \theta_C$, $n \sin \theta_{in\,max} = \cos \theta_C$ is obtained which can be further transformed to the following.

$$\frac{n^2}{n_1^2} \sin^2 \theta_{in\,max} = \cos^2 \theta_C$$

Furthermore, since $$\cos^2 \theta_C = 1 - \sin^2 \theta_C = 1 - \frac{n_2^2}{n_1^2},$$

obtain the following relationships:

$$\sin \theta_{rmax} = \frac{\sqrt{n_1^2 - n_2^2}}{n_1} \text{ and } n \sin \theta_{in\,max} = \sqrt{n_1^2 - n_2^2},$$

where the expression $n \sin \theta_{in\,max}$ can be defined as a numeric aperture NA of waveguide 4.

An imagery cone having an angular size of $2\theta_{in\,max}$ ($\pm\theta_{in\,max}$ from a normal to face 35 of waveguide 4) can be defined as an acceptance cone of waveguide 4 for the purpose of illustrating this invention and the angle $2\theta_{in\,max}$ can be referenced as an acceptance angle of waveguide 4.

In FIG. 28, a case is illustrated when $\theta_{in} < \theta_{in\,max}$ which results in $\theta_r$ being less than $90-\theta_C$ and $\theta_{101}$ being greater than TIR angle $\theta_C$. Subsequently, ray $R_{110}$ propagating in waveguide 4 strikes face 10 at point $P_{101}$, where it makes angle $\theta_{101}$ with a surface normal direction to parallel faces 10 and 11 and undergoes a practically lossless total internal reflection. Upon reflecting by means of TIR, ray $R_{110}$ is further directed toward face 11 where it strikes a reflective surface 26 of prismatic groove 14 at point $P_{102}$. The corresponding segment of ray $R_{110}$ propagating between points $P_{101}$ and $P_{102}$ is denoted as segment 17.

Face 26 represents the working aperture of prismatic groove 14 and is configured to redirect ray $R_{110}$ from its original direction of propagation in waveguide 4 into a different direction at which ray $R_{110}$ can be extracted from waveguide 4. In order to achieve this, face 26 is inclined at a slope angle $\theta_{30}$ with respect to face 11. Accordingly, face 26 makes angle $\theta_{135}$ with a surface normal direction 15 to face 11 which is also a surface normal direction with respect to face 10 due to the parallelism of faces 10 and 11. Face 26 has a planar mirrored surface which provides a low-loss specular reflection for ray $R_{110}$. However, it should be understood that this invention is not limited to the planar configuration of reflective face 26. It will be appreciated that face 26 can be configured with any desired shape without departing from the teachings of the present invention, for example it may comprise any segmented or curved surface.

Ray $R_{110}$ bounces from face 10 by means of TIR, at which the angle of reflection is equal to the angle of incidence, and continues propagating in waveguide 4 at angle $\theta_{101}$ with respect to the surface normal direction of faces 10 and 11 until it strikes face 26 at point $P_{102}$. A ray segment 18 represents a continuation of ray $R_{110}$ when it is internally redirected/deflected by prismatic groove 14 back into waveguide 4 so that segment 18 forms a different angle $\theta_{102}$ with respect to surface normal direction 15 of face 10. The slope of face 26 is selected so as to result in angle $\theta_{102}$ being smaller than angle $\theta_{101}$ and also smaller than TIR angle $\theta_C$. The TIR angle $\theta_C$ can be defined from the following expression.

$$\theta_C = \arcsin(n_2/n_1)$$

When ray $R_{110}$ is reflected by face 26 and further strikes face 10 from the inside of waveguide 4 at point $P_{103}$, it maintains the same angle $\theta_{102}$ with respect to a surface normal direction of face 10. Since angle $\theta_{102}$ is smaller than TIR angle $\theta_C$, ray $R_{110}$ passes through face 10 with some refraction and with relatively small Fresnel losses defined by the difference in refractive indexes $n_1$ and $n_2$. Ray $R_{110}$ therefore becomes decoupled from waveguide 4 and can be further collected and collimated by the associated lens array.

Referring again to FIG. 28, since surface normal direction 15 makes an angle of 90° with face 26, $\theta_{135} = 90° - \theta_{30}$. Accordingly, considering that face 26 makes an angle $\theta_{139}$ with respect to segment 18 of ray $R_{110}$, the following expression can be derived as a matter of optics and geometry: $\theta_{102} = \theta_{101} - 2\theta_{30}$. Subsequently, $\theta_{102} = \theta_{101} - 2(90° - \theta_{135})$. Thus, for example, if ray $R_{110}$ propagates in waveguide 4 so that it makes an angle of 65° with respect to surface normal 15, that is $\theta_{110} = 60°$, and the slope of face 26 with respect to face 11 is 27 degrees, that is $\theta_{20} = 27°$ and $\theta_{135} = 63°$, a value of $\theta_{102} = 6°$ is obtained. Accordingly, segment 18 will strike face 10 at the angle of 4° with respect to a normal to face 10. If waveguide 4 is made from PMMA with the reflective index $n_1$ of about 1.49 and the ambient medium is air with refractive index $n_2$ of about 1, TIR angle $\theta_C$ will be equal to $\arcsin(1/1.49)$ which is approximately 42.155°, that is greater than angle $\theta_{102}$. It follows that, in the above example, $\theta_{102} < \theta_C$ and therefore the condition of TIR is not met at point $P_{103}$ resulting in ray $R_{110}$ exiting from waveguide 4 through its face 10.

It will be appreciated that when face 26 has a mirrored surface, by selecting a suitable slope angle $\theta_{30}$ of reflective face 26, ray $R_{110}$ can be directed at any desired angle with respect to surface normal 15 or faces 10 and 11.

Figure 29:
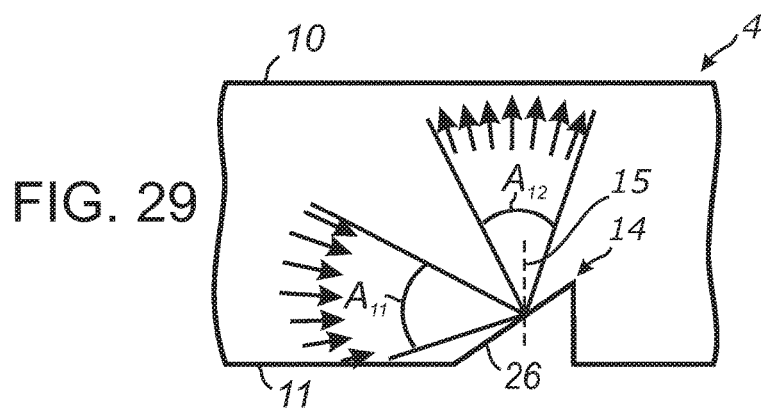
FIG. 29 is a ray range tracing of light redirection from a first angular aperture to a second angular aperture within an illuminator according to at least one embodiment of the present invention.

FIG. 29 illustrates a range of incident and reflected rays for a prismatic groove within waveguide 4. The light incident upon face 26 at a particular point of an individual prismatic groove 14 can be characterized by a fan of incident rays having a first angular aperture $A_{11}$ and the redirected (e.g., reflected) light can be characterized by a fan of outgoing rays having a second angular aperture $A_{12}$. As discussed above, prismatic grooves 14 can be configured to receive light rays incident into its working surface at various angles and redirect the rays at angles lesser than the TIR angle in relation with faces 10 and 11. Thus, prismatic grooves 14 can be configured to receive light from a first angular aperture $A_{11}$ and redirect that light into a second angular aperture $A_{12}$ so that apertures $A_{11}$ and $A_{12}$ do not intersect and each ray in the second angular aperture $A_{12}$ propagates at an angle lesser than angle $\theta_C$ with respect to surface normal direction 15 providing for the maximum decoupling efficiency. When deflecting means employ a planar reflective face 26, the angular value of second angular aperture $A_{12}$ will generally be the same as angular value of first angular aperture $A_{11}$. However, face 26 can also be made concave or convex resulting in the second angular aperture $A_{12}$ being greater or smaller than the first angular aperture $A_{11}$.

Toward maximizing the efficiency of light decoupling from waveguide 4 and considering a planar configuration of face 26, an optimum range of acceptable values for slope angle $\theta_{30}$ can be selected in response to the following reasoning. Since light rays are randomly distributed in waveguide 4, ray $R_{110}$, when striking face 26, can make angles $+\theta_r$ in response to an approach to prismatic groove 14 from face 10, or of $-\theta_r$ in response to an approach to prismatic groove 14 from face 11, with respect to prevailing plane of the material. Therefore, face 26 should be positioned to decouple ray $R_{110}$ incident into it at either $\theta_r$ or $-\theta_r$ with respect to the material plane. As a matter of optics, this condition can be written in the form of the following expression.

$$(\theta_r + \theta_C)/2 \leq \theta_{30} \leq 90° - (\theta_r + \theta_C)/2$$

Referring now to both FIG. 28 and FIG. 29, in order to decouple the entire fan of rays confined within angular aperture $A_{11}$, slope angle $\theta_{30}$ should be within the following range: $A_{11}/4 + \theta_C/2 \leq \theta_{30} \leq 90° - A_{11}/4 - \theta_C/2$. If slope angle $\theta_{30}$ is outside of this range, a portion of the light beam redirected by the respective prismatic groove 14 will undergo TIR at face 10 and will therefore remain in waveguide 4 until it can be extracted by other prismatic grooves 14. However in the case of slope angle $\theta_{30}$ being outside of this range, a longer optical path, and thus a longer waveguide 4, may be required for decoupling all the light.

By taking the above exemplary case with waveguide 4 comprising PMMA material ($n_1 \leq 1.49$) with air cladding ($n_1 \leq 1$) and assuming angular aperture $A_{11}$ of the fan of rays incident into prismatic groove 14 being 60° (±30° from the plane of the material), a desired range for slope angle $\theta_{30}$ can be obtained as: $36.08° \leq \theta_{30} \leq 53.92°$ which provides over 22° wide useful span of slope angles for obtaining the maximum light decoupling efficiency with a minimum number of prismatic grooves 14.

Obviously, the greater aperture $A_{11}$ the narrower the optimum range of angles $\theta_{30}$ is. In an extreme case when $A_{11} = 2\theta_{r\,max}$, for instance when the light beam injected into waveguide 4 can comprise rays making angles of up to $90° - \theta_C$ with respect to the prevailing material plane, or down to $\theta_C$ with respect to a surface normal direction in relation to the material plane and faces 10 and 11, by making the respective substitutions to obtain the following:

$$(2(90° - \theta_C))/4 + \theta_C/2 \leq \theta_{30} \leq 90° - (2(90° - \theta_C))/4 - \theta_C/2,$$

which translates into: $45° \leq \theta_{30} \leq 45°$ or simply $\theta_{30} = 45°$.

In other words, face 26 should be inclined at an angle of 45° with respect to faces 10 and 11 to decouple the maximum number of rays when aperture $A_{11} = 2\theta_{r\,max}$.

It will be appreciated by those skilled in the art that reflective faces can reflect at least a portion of the incident light by means of TIR and in which case no mirror coating may be required for face 26. Referring to FIG. 28, when face 26 makes a sufficiently acute angle with respect to segment 17, angle $\theta_{129}$ can exceed a TIR angle for the optical interface formed by face 26 and the outside media. Thus, ray $R_{110}$ will undergo TIR at face 26 even if face 26 is optically transparent and not specularly reflective.

Although FIG. 26 through FIG. 29 illustrated illuminator embodiments employing prismatic grooves with a sloped reflective face, the invention is not limited to this configuration. The following describes a few variations which can be considered separately or in combination with one another and the other embodiments described herein.

Figure 30A:
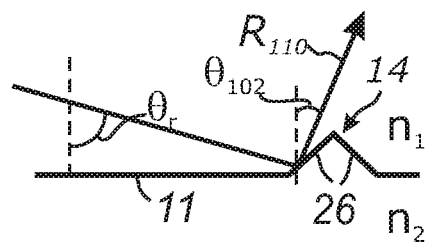
FIG. 30A is a cross section view of a bifacial prismatic feature in a wall of an illuminator waveguide, according to at least one embodiment of the present invention.

FIG. 30A illustrates an individual v-shaped prismatic groove 14 which is configured to redirect and decouple the light from waveguide 4 as a bifacial prismatic groove 14. Furthermore, prismatic groove 14 can have any other geometry and any desired number of faces that can reflect, refract, scatter or otherwise redirect light propagating within waveguide 4 so that the redirected light can be extracted from the waveguide.

Figure 30B:
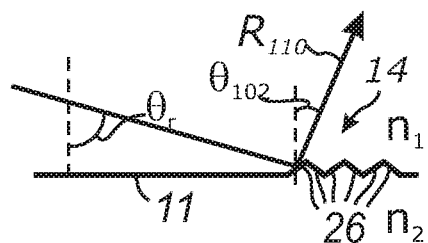
FIG. 30B is a cross section view of a multiple prismatic features in a wall of an illuminator waveguide, according to at least one embodiment of the present invention.

FIG. 30B illustrates an example embodiment in which several smaller v-shaped prismatic grooves are disposed within the waveguide instead of a single prismatic groove 14. Faces 26 of the grooves are inclined in accordance with the above principles to allow for efficient light extraction from waveguide 4 with the subsequent collimation by a respective lenslet 6.

Figure 30C:
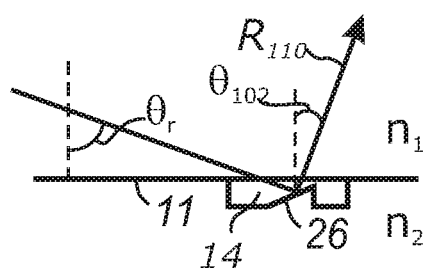
FIG. 30C is a cross section view of a portion of an illuminator waveguide according to at least one embodiment of the present invention, showing use of a block of transparent material with a prismatic feature.

FIG. 30C illustrates an example of a deflection structure 14 optically coupled to surface 11. The deflection structure 14 comprises a groove with face 26. As with the foregoing embodiments, reflective face 26 is inclined at a suitable angle to decouple the light propagating in waveguide 4. The material in which prismatic groove 14 is formed can be selected to approximately match that of waveguide 4 in which case the parasitic reflections at the interface between prismatic groove 14 and waveguide 4 can be minimized thus minimizing the light propagation losses.

Figure 30D:
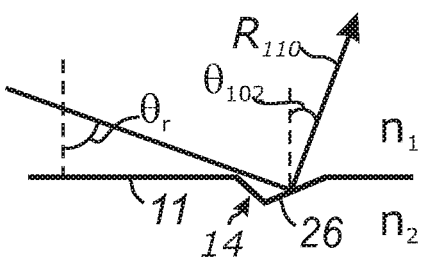
FIG. 30D is a cross section view of a portion of an illuminator waveguide according to at least one embodiment of the present invention, shown using a prismatic feature protruding from the waveguide.

FIG. 30D illustrates an example embodiment of a prismatic feature protruding from face 11 which provides the same basic operation as described above.

Figure 30E:
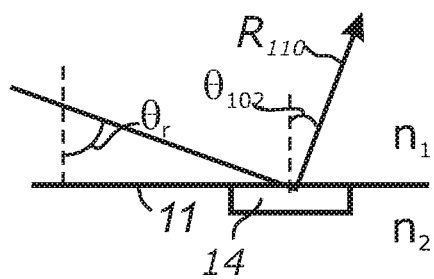
FIG. 30E is a cross section view of a portion of an illuminator waveguide according to at least one embodiment of the present invention, showing utilization of a diffraction grating.

FIG. 30E illustrates an example embodiment in which the prismatic groove 14 is replaced with one or more diffraction gratings (e.g., which may be produced in the form of a hologram) and which is configured for deflecting the incident light at a suitable angle with respect to faces 10 and 11 so that the light can be effectively decoupled from waveguide 4. The hologram can be produced in the form of a glass plate or highly transparent plastic film and can be made angularly and/or spectrally multiplexed.

The foregoing embodiments of the present invention are described upon the case where prismatic grooves 14 are formed in or associated with face 11. However, this invention is not limited to this and can be applied to the case when prismatic grooves 14 can positioned anywhere at or between faces 10 and 11, or they can be made embedded or integral to waveguide 4 or attached externally to either face 10 or 11, provided that prismatic grooves 14 are optically coupled to waveguide 4 and can intercept a portion of the light propagating in waveguide 4 and extract the light from the waveguide to allow for the subsequent collimation with lenses 6.

Figure 31:
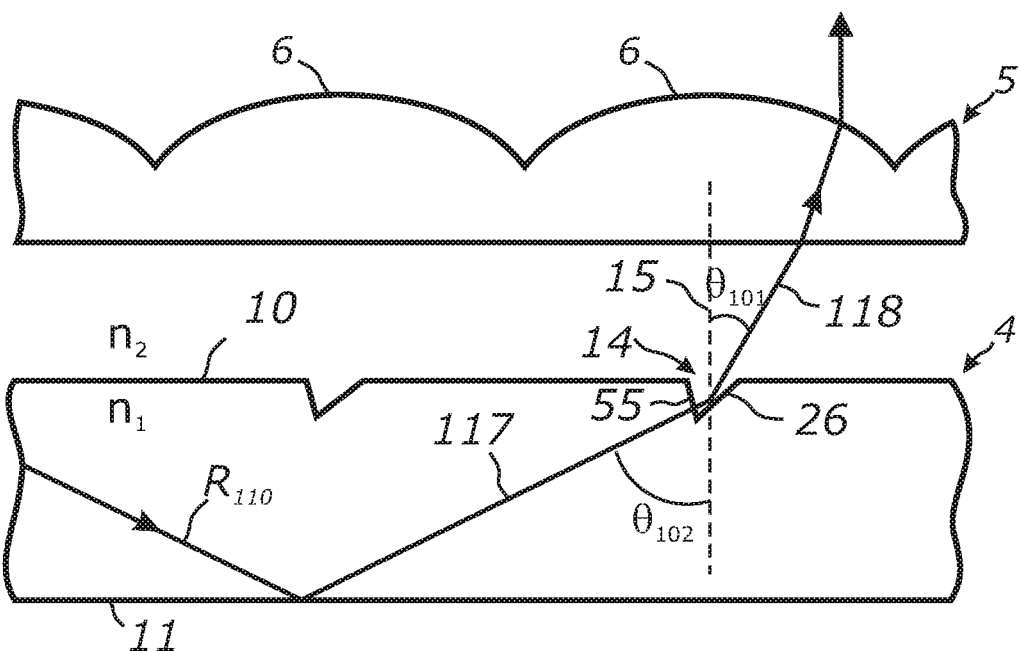
FIG. 31 is a ray tracing diagram of operation of an illuminator employing a prismatic groove formed in an opposing face of a waveguide, according to at least one embodiment of the present invention.

FIG. 31 illustrates an example embodiment in which the prismatic grooves 14 are formed in face 10, which is the opposite planar face as that described in the embodiments described above. Referring to the ray $R_{110}$ propagating in waveguide 4 strikes prismatic groove 14 at angle $\theta_{101}$ with respect to a surface normal direction 15 of face 10. Prismatic groove 14 deflects segment 117 of ray $R_{110}$ into segment 118 which forms angle $\theta_{102}$ with respect to surface normal direction 15. Light prismatic groove 14 is configured to have both a reflective face 26 and a transparent face 55. Ray $R_{110}$ passes through face 55 and is reflected by face 26 toward a corresponding lens 6. Face 26 is inclined with respect to face 10 so as to provide a suitable angle $\theta_{102}$ for segment 118. Similarly to the embodiments illustrated above, ray $R_{110}$ exits waveguide 4 and is collected and collimated by lens array 5. Face 55 can be made approximately perpendicular to face 10 or it can be inclined at any suitable angle with respect to face 10 or surface normal direction 15, toward providing a more efficient light deflection or extraction from waveguide 4.

Figure 32:
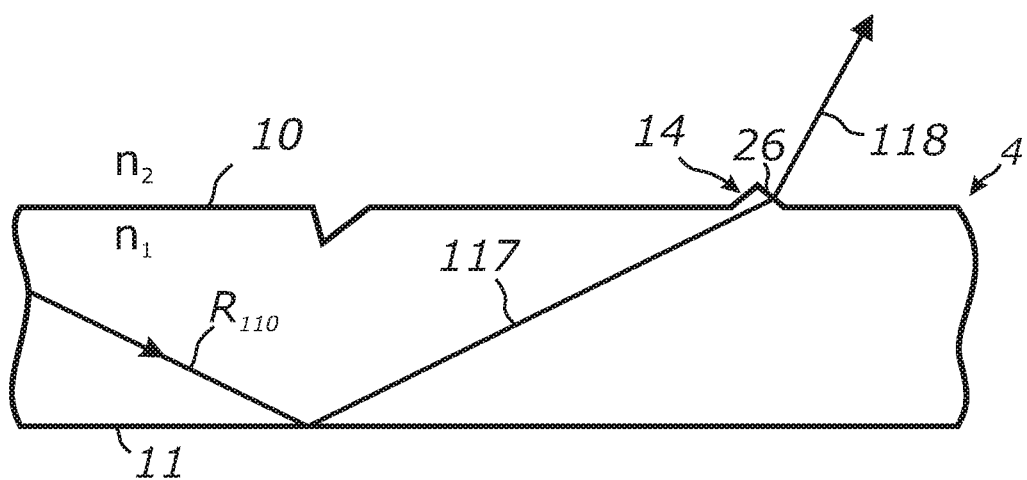
FIG. 32 is a ray tracing diagram of an illuminator employing a prismatic feature protruding from an opposing face of the waveguide, according to at least one embodiment of the present invention.

FIG. 32 illustrates an example embodiment in which the extraction of the ray is facilitated without the need of a reflective deflection. In the preceding embodiments of the present invention a prismatic groove 14 was configured with a reflective face 26. However, the present invention is not limited to this configuration. The figure depicts an example in which a prismatic groove 14 (or ridge) of a refractive type is utilized in which light passes through face 26 (with deflection) rather than being reflected from it. In FIG. 32 a prismatic feature protrudes from surface 11 with prismatic face 26 that is inclined with respect to surface 10 at a suitable angle so that the condition of TIR is not met for ray $R_{110}$ when it strikes face 26 and, therefore, ray $R_{110}$ is extracted from waveguide 4 for subsequent collimation.

It should be appreciated that the illumination device can be configured to collect light rays in a preselected spectral domain and/or only those rays propagating in waveguide 4 in a predetermined range of acceptance angles. For example, prismatic grooves 14 can be replaced by a reflection or transmission hologram designed to deflect and decouple only a specific wavelength or a relatively narrow range of wavelengths from waveguide 4 while allowing the other wavelengths to further propagate through waveguide 4 by means of TIR. Alternatively, one or more layers of a dichroic material can be deposited on face 26 of prismatic groove 14 which will cause the incident light to be split up into distinct beams of different wavelengths and allow only selected beam(s) to be extracted from waveguide 4. In a further example, prismatic grooves 14 can be designed so that any rays impinging onto its active aperture within an acceptance angle of up to a pre-determined value (e.g., up to 30 degrees) will be extracted from waveguide 4. The remainder of the light rays are allowed to propagate further in waveguide 4 at angles greater than TIR angle $\theta_C$ with respect to normal 15 and these latter rays can therefore be allowed to remain in waveguide 4.

Figure 33:
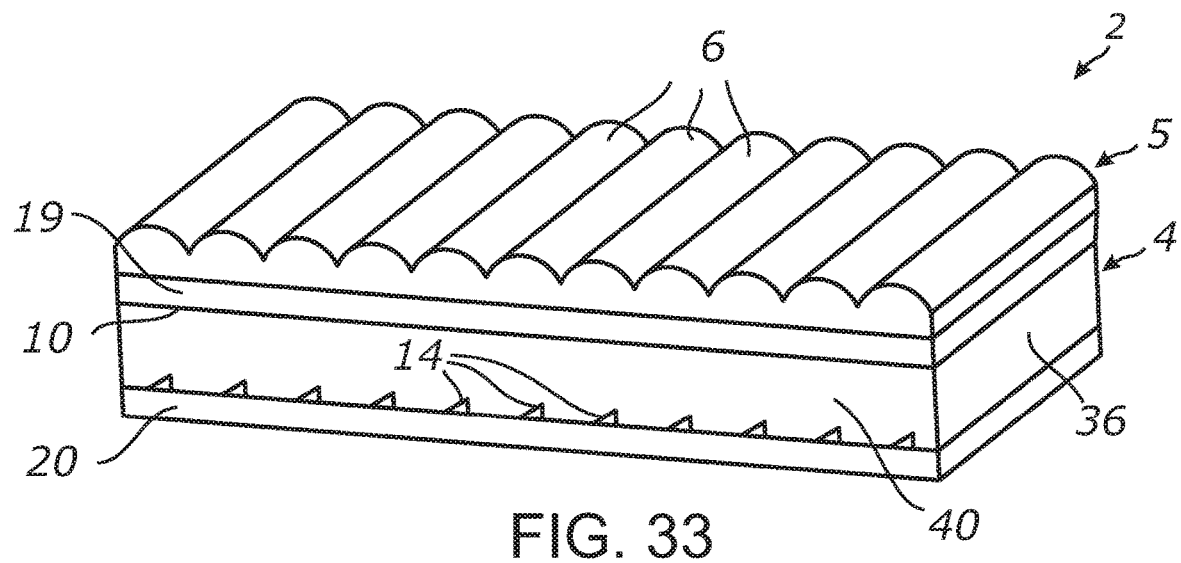
FIG. 33 is a perspective view of an illuminator according to at least one embodiment of the present invention, showing a material coupling layer between the collimator and waveguide.

FIG. 33 illustrates an example embodiment in which the waveguide and collimator are not separated by air. It should be appreciated that the present invention is not limited to configurations in which the waveguide is separated from the lens array (collimator) by a medium of air. The figure depicts a practical embodiment of the present invention which incorporates a buffer layer 19 of optically transmissive material having a refractive index lower than that of waveguide 4. Layer 19 is separating waveguide 4 from lens array 5 providing for a stepped drop in refractive index outwardly from waveguide 4 so that light can be trapped in the waveguide by TIR and that the illuminator device 2 has the same basic operation as discussed above. Layer 19 can be positioned between lens array 5 and waveguide 4 so that system 2 forms a monolithic sandwiched structure. Suitable materials for layer 19 can be selected from the group of low refractive index materials consisting essentially of, but not limited to: monomers, polymers, fluoropolymers, low-n optical adhesives, thin films, materials commonly used for cladding in optical waveguides or any other optically clear material provided that its refractive index is lower than the refractive index of the material selected for waveguide 4. Additionally, amorphous fluoropolymers which are conventionally used for cladding optical waveguides such as PFTE AF 1600 and PFTE AF 2400 are particularly well suited for use.

Additionally, face 11 of waveguide can be provided with a backsheet or cladding layer 20 which also has a low refractive index so that waveguide 4 is encapsulated and protected from the outside media by a low-n material similar to conventional light guides. This can help avoid light spillage from waveguide 4 and improve the efficiency of system 2. Cladding materials suitable for layer 20 can include any of the low-n materials mentioned above for layer 19. Alternatively, layer 20 can be formed by a plastic reflective film or by metallization of face 11 to improve reflectivity or reduce light spillage through face 11. Another example of a suitable protective backsheet material for layer 20 can be Polyvinyl fluoride (PVF), a fluoropolymer which is commercially available as a film from DuPont and is sold under the Tedlar® brand.

Similarly, any or all side faces (side walls) or terminal faces (end walls, terminal walls) of waveguide 4 can be encapsulated or otherwise covered by a protective or reflective layer and allowed to reflect light propagating in waveguide 4 back into the waveguide by means of TIR or specular reflection. It will be appreciated that layer 20 or encapsulation layers of the edges of waveguide 4 do not have to be optically transparent and can include opaque, light scattering or reflective materials. Yet further, optical illumination device 2 can incorporate any other suitable layers such as reflective or anti-reflective coatings, diffusers, radiation protective coatings or films, scratch and stain resistant coatings, light filtering films and the like. By way of example, waveguide 4, lens array 5 or any of their portions can be coated by dip coating, spin coating, vacuum metallization, applying a thin film using low-n adhesives, etc.

In accordance with an embodiment of the present invention, optical illumination device 2 discussed above can comprise an elongated light source extending along terminal face 35 for inputting light into waveguide 4. Alternatively, a plurality of miniature light sources can be arranged along face 35 for this purpose.

The foregoing embodiments are described upon the case when prismatic grooves 14 are aligned pair wise with the respective lenses 6 which can be preferred for collimating the light decoupled from waveguide 4 into a highly collimated, particularly parallel, beam. However, this invention is not limited to this configuration and can also be implemented so that the optical axis of each individual prismatic groove 14 is slightly offset with respect to an optical axis of the matching lens 6. Furthermore, the amount of the offset can be varied for different prism-lens pairs over the length of waveguide 4. Particularly, prismatic grooves 14 and lenslets 6 can be positioned and aligned in accordance to a pre-selected ordered or randomized pattern. This can be useful, for example to create a non-parallel, yet collimated beam with a desired angular spread and or a particular intensity distribution. By way of example, the plurality of lenses 6 can be designed to direct the respective beams into converging directions or focus. Alternatively, these directions can be made diverging to distribute the illumination pattern within a pre-determined angle (a diverging conical light pattern). The respective beams of light can be spaced apart, overlapped, or mixed in any suitable manner so as to provide the desired operation or light distribution in space or on a target.

Figure 34:
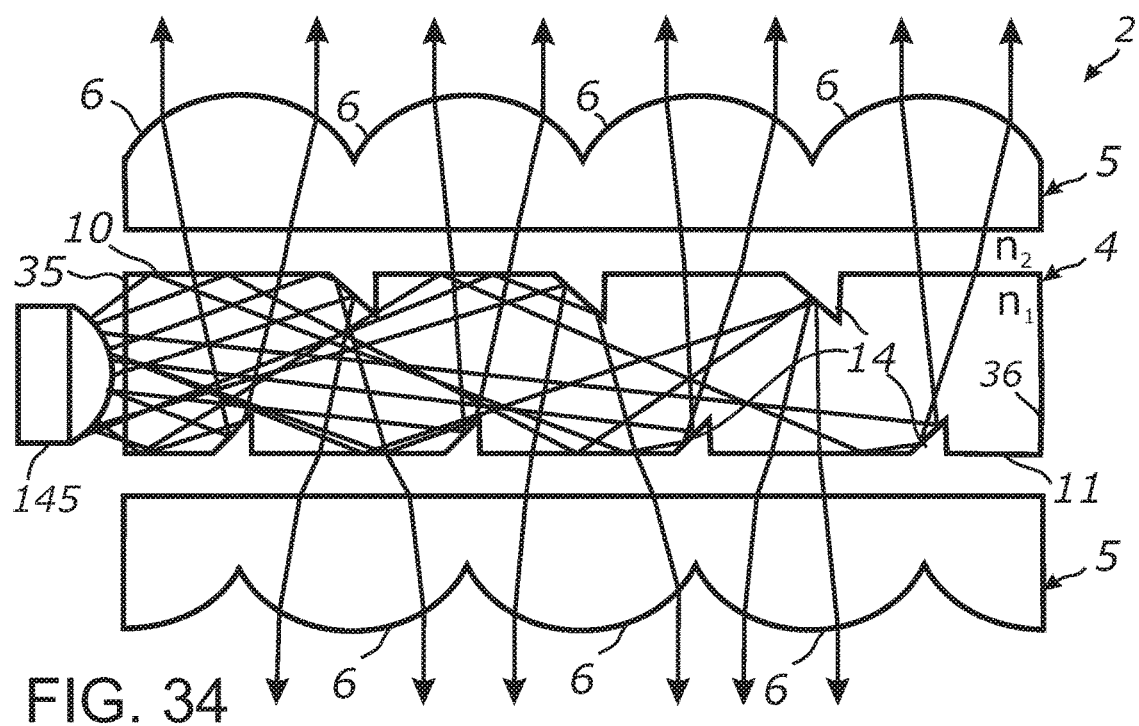
FIG. 34 is a cross section and ray tracing of a dual sided illuminator according to at least one embodiment of the present invention.

FIG. 34 illustrates an example embodiment in which light is deflected for exiting the waveguide and being collimated on both sides of the waveguide. Although, the foregoing embodiments described the use of prismatic grooves disposed on a single side of the waveguide, it should be appreciated that the present invention is not limited to that configuration. The figure depicts grooves 14 formed in face 10 and face 11 with a respective lens array 5 on either side of waveguide 4 in a bifacial configuration of optical device 2.

FIG. 35 illustrates an embodiment of a space efficient optical device 2 in which matching pairs of prismatic grooves 14 and lenses 6 are disposed in a two-leg symmetric configuration along planar waveguide 4. There is a central opening in waveguide 4 in which light source 145 is inserted so that the latter can illuminate the waveguide as illustrated in the figure. In the illustrated case, source 145 may comprise a side-emitting LED for maximizing the efficiency of injecting the light into waveguide 4. A suitable finned or finless heat sink can be further attached to source 145 for improved heat removal. In FIG. 35 a finned heat sink 54 is shown conforming to the planar geometry of waveguide 4. Common materials for heat sink 54 may comprise, for instance, aluminum, copper, and any of their alloys or similar materials. A layer of optical adhesive or encapsulant such as silicone, EVA resin or the like can be provided between light source 145 and waveguide 4 to promote optical and physical contact. Toward efficient light injection, the refractive index of the adhesive or encapsulant should preferably be close to, or greater than, the refractive index of the material of waveguide 4. Waveguide 4 distributes the injected light along its working aperture where the light is decoupled, one portion at a time, by prismatic grooves 14 and collimated into a quasi-parallel beam by respective lenses 6 similarly to the process described above.

Referring again to FIG. 35, system 2 can be arranged to have either a linear configuration with a plane of symmetry perpendicular to the drawing plane, similarly to the embodiments described above, or to have an annular configuration. In an annular configuration, optical device 2 can have an axial symmetry in which case the shapes of lens array 5 and waveguide 4 can be formed by a revolution of the cross sectional design shown in FIG. 35 around an axis of symmetry by a full or partial angular turn.

FIG. 36A through FIG. 36D illustrate exemplary configurations of the illuminator, such as linear and various circular, and partial patterns. In each case light rays are shown entering waveguide 4 in the area indicated as a light input area 147. It should also be understood that optical device 2 can be configured to have multiple light input areas 147 with multiple light sources 145. In addition, either one or both waveguide 4 and lens array 5 may be tapered and or provided with any other desired shape.

Figure 37A:
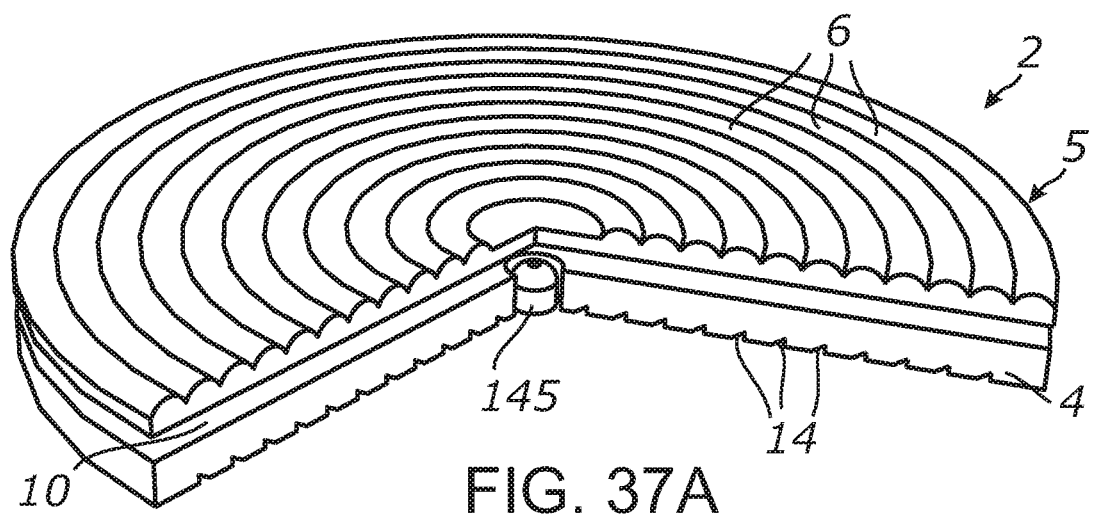
FIGS. 37A and 37B are perspective views of an annular illuminator according to at least one embodiment of the present invention.
Figure 37B:
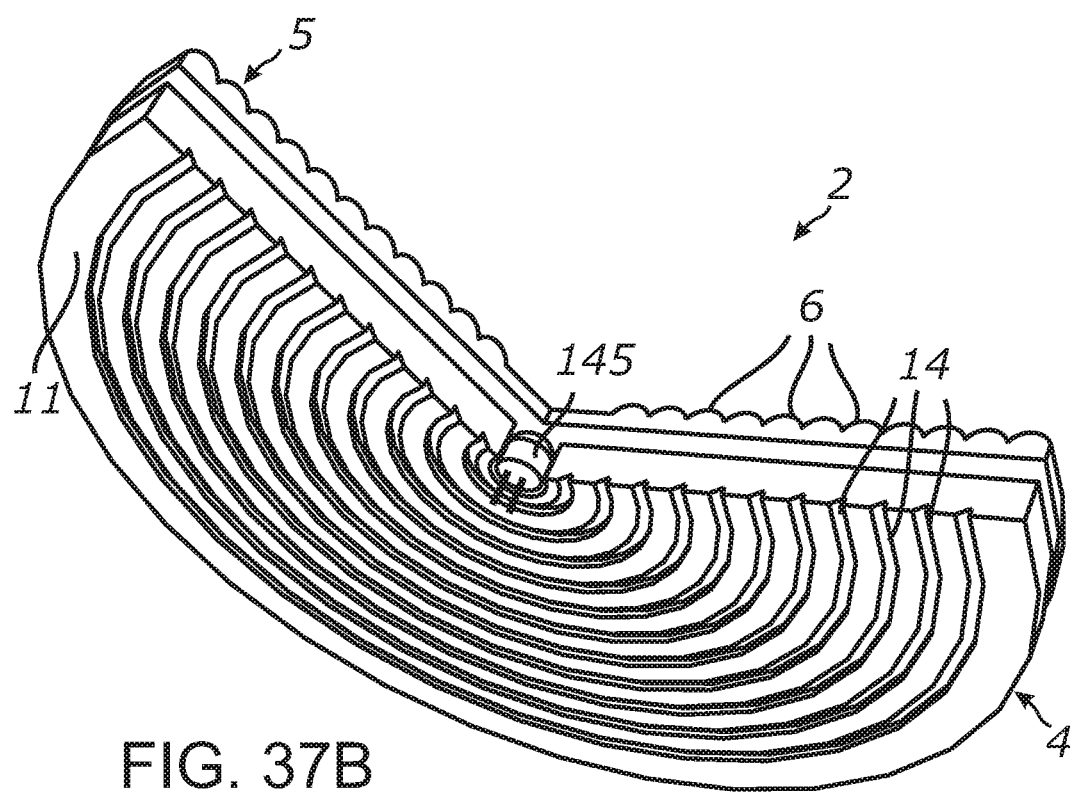

FIG. 37A through 37B illustrate an example embodiment of a round axisymmetrical configuration. While a partial-circle configuration of optical device 2 is shown in the figures for the sake of clarity of explanation, it should be understood that lens array 5 and waveguide 4, along with respective lenses 6 and prismatic grooves 14, more preferably span a full-circle annular configuration. Alternatively, the device can be configured into any desired symmetric or asymmetric shape, or partial shape, such as cutting from an annular configuration, such as for example, a rectangular shape (see, e.g., FIG. 36C and FIG. 36D), or various decorative shapes.

Although the foregoing embodiments of the illuminator are discussing a planar configuration, the invention is not limited to planar light collection devices. It can also be applied to a case when collector array 5 and waveguide 4 are made of a flexible material such that optical device 2 is able to bend and can be shaped, for example, in a cylindrical configuration.

It should also be understood that this invention is not limited to employing lenses 6 of an imaging type and can be applied to the case when lenses 6 can have any other suitable shape, so that an individual lens 6 can produce a convergent or divergent beam or any other light pattern. Furthermore, this invention is not limited to the use of lens array 5 of a refractive type and can also be applied to the case when lens array 5 can be replaced by a reflective mirror array. By way of example, collector array 5 can be formed by a dense planar array of micro-mirrors in which case each mirror element 6 can be represented by a concave reflector which has a mirrored surface and is configured to focus an incident beam of light onto a respective prismatic grooves 14. Each mirror can have a spherical shape, parabolic shape or any other shape resulting in collection of the incident light to a substantially smaller area than the aperture area of the mirror. In another example, each mirror in collector array 5 can, in turn, be formed by a micro-array of planar reflectors inclined at suitable angles, such as a Fresnel mirror, so as to result in efficient focusing the incident radiation.

Figure 38:
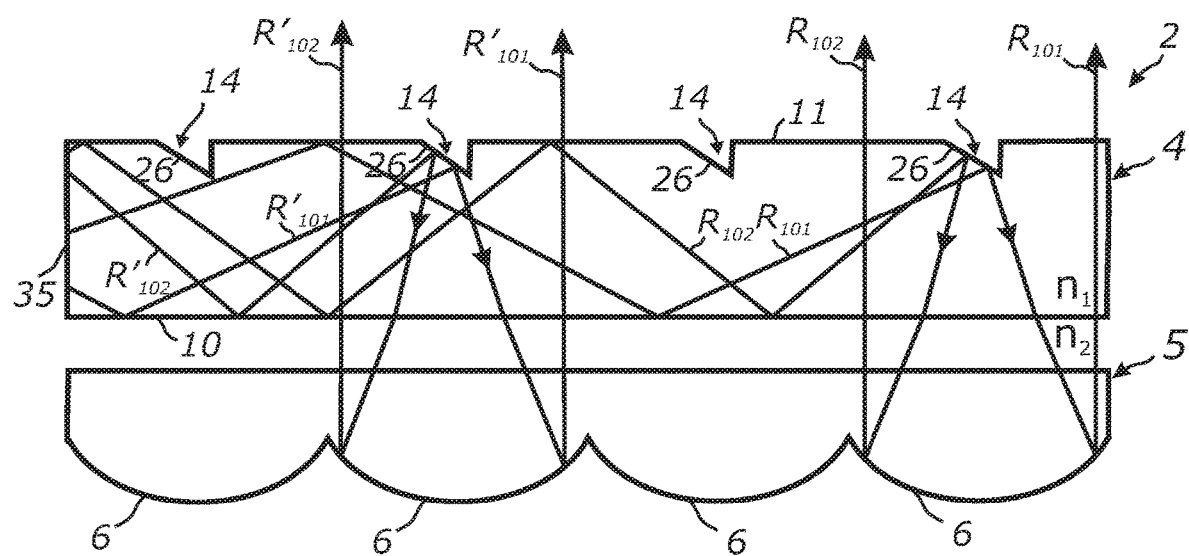
FIG. 38 is a detailed ray tracing of illuminator operation of a collector array formed by an array of micro-mirrors, according to at least one embodiment of the present invention.

FIG. 38 illustrates an example embodiment of optical illuminator device 2 in which collector array 5 comprises a planar transparent body having a surface texture in the form of a densely packed array of micro-mirrors 6. Thus, each micro-mirror 6 is integral to the planar transparent body. Each micro-mirror 6 has a curved mirrored surface that allows it to efficiently collect incident light and focus the light onto a corresponding prismatic groove 14 having a substantially smaller aperture. In a similar manner as lenses in lens array 5, micro-mirrors can be designed in linear or point focus configurations. Waveguide 4 is configured in the form of a planar transparent plate having a refractive index greater than that of the outside media and optically coupled to each of the plurality of prismatic grooves 14 associated with face 11. Both parallel faces 10 and 11 of waveguide 4 are also preferably transparent to incident light. Similarly to the examples discussed above, each prismatic groove 14 comprises reflective face 26.

In operation, incident ray $R_{101}$ enters waveguide 4, propagates in waveguide 4 by means of TIR and enters prismatic groove 14. Face 26 is inclined with respect to a normal to walls 10 and 11 and it redirects ray $\theta_{101}$ back into waveguide 4 at an angle with respect to a normal to walls 10 and 11 which is less than critical angle $\theta_C$ so that ray $\theta_{101}$ is decoupled by prismatic groove 14 and directed to a respective micro-mirror 6. In turn, micro-mirror 6 directs ray $\theta_{101}$ to a direction perpendicular to wall 11. Accordingly, rays $R_{102}$, $R'_{101}$ and $R'_{102}$ propagating in waveguide 4 are also decoupled from waveguide 4 and directed generally toward the same direction. In similar manner to the system of FIG. 33, transparent cladding or buffer layer 19 can be configured with low-n material can be laid between the collector array 5 and waveguide 4. Further, a cladding and/or protective layer or layers can be added to either or all of the walls or faces of waveguide 4 to protect it from the environment. Further details of operation of device 2 shown in FIG. 38 as well as its possible variations configurations will be apparent from the foregoing description of preferred and other embodiments.

It should be noted that any other conventional device used to collect or collimate light can be used in place of lenses 6. Any known optical system or collector of radiant energy or light which collects the energy from it entrance aperture and directs it further with improved collimation can be used for the purpose of this invention. Illustrative of useful devices that can be used in place of lenses 6 are spherical or aspherical refractive lenses, parabolic or spherical mirrors, Fresnel lenses, Total Internal Reflection (TIR) lenses, gradient index lenses, diffraction lenses, lens arrays, mirrors, Fresnel mirrors, mirror arrays and the like.

The foregoing embodiments have been described upon the case when v-shaped prismatic grooves 14 are used for decoupling the light from waveguide 4. However, this invention is not limited to this and can be applied to the case when any suitable optical device used to receive the light beam in a pre-determined acceptance angle from one direction and deflect at least a substantial portion of the incident beam from its original direction to a different direction can be utilized in place of prismatic grooves 14. Each such optical element should be configured to intercept a portion of the light propagating within waveguide 4 and redirect it at a different propagation angle with respect to faces 10 and/or 11 at which the condition of TIR is not met and the light can exit waveguide 4 and can further be collected and collimated by respective lens 6. By means of example, an alternative to prismatic grooves 14 can include a reflective surface or a refractive element disposed at an angle to the incident light beam and optically coupled to waveguide 4. Similarly, an alternative can include planar or curved mirrors, prisms, prism arrays, diffraction gratings, holograms, and similar optical elements. Additionally, various light scattering or light diffusing elements, such as small areas of waveguide 4 painted with a white paint or provided with matte-finish, can be used in place of prismatic grooves 14 which will redirect at least a portion of light out of waveguide 4 through at least one of its faces 10 or 11 so that optical device 2 will have the same basic structure and operation.

The present invention is not limited to the case when waveguide 4 and lens array 5 are disposed in a stationary position with respect to each other and can also be applied to the case when lens array 5 and waveguide 4 can be disposed in any one of a translated, a reversed and/or a rotated orientation relative to each other in order, for example, to achieve different collimation angles or desired visual effects for the collimated light. Furthermore, lens array 5 and waveguide 4 can be made movable with respect to each other to provide for fine tuning or "focusing" the collimated beam.

Accordingly, it will be appreciated that the system of the present invention can be used for collecting and concentrating otherwise distributed light in a very space-efficient manner by using a thin planar geometry of the light collecting optics. Furthermore, the system allows for homogenizing the collected light by means of multiple lossless total internal reflections and delivering the light to an edge of a waveguide with a substantial concentration and low loss.

Additionally, the device of this invention can be used for collimating otherwise divergent light in a very space-efficient manner by using a thin planar geometry of the collimating optics. Furthermore, the device allows distributing light emitted by a highly localized light source across a much larger area and creating a broad yet highly collimated light beam without the glare typically associated with bright point sources such as high-power LEDs, incandesced lamps and the like.

As can be seen, therefore, the present invention can be implemented in various ways, which can include, but which are not limited to, one or more of the following embodiments, modes and features described herein:

1. An apparatus for light collimation and distribution, comprising: a planar waveguide having an optically transparent planar material having edges disposed between a first planar surface and a second planar surface; in which said planar waveguide is configured to receive light on one edge of said planar material, and to propagate the received light through said planar waveguide in response to optical transmission and total internal reflection; a plurality of light collimating elements within a collimating array which is disposed in an optical receiving relationship with a planar surface of said planar waveguide; and a plurality of light deflecting elements optically coupled to said waveguide and configured for deflecting light propagating through said planar waveguide at a sufficiently low angle, below the predetermined critical angle for total internal reflection (TIR), with respect to a surface normal direction of an exterior surface of said planar waveguide to exit said planar waveguide and enter said collimating array; wherein each of said plurality of light deflecting elements is in a predetermined alignment with each of said plurality of light collimating elements; wherein light received on the edge of said planar waveguide is angularly redirected, collimated, and distributed from the surface of said collimating array which is optically coupled to said planar waveguide.

2. The apparatus of embodiment 1, wherein said plurality of light collimating elements comprises a parallel array of elongated lenticular lenses.

3. The apparatus of embodiment 1, wherein said plurality of light collimating elements comprises a parallel array of elongated focus mirrors.

4. The apparatus of embodiment 1, wherein said plurality of light deflecting elements comprises a parallel array of elongated grooves.

5. The apparatus of embodiment 1, wherein said plurality of light deflecting elements comprises a parallel array of elongated grooves; wherein said grooves are configured at a slope angle which is bounded by the relation in which is the refractive index of the planar waveguide and is the refractive index of the collimator array.

6. The apparatus of embodiment 1, wherein said plurality of light deflecting elements comprises grooves within said planar waveguide configured for redirecting the received light in response to reflection from at least one surface of said groove toward said collimating array.

7. The apparatus of embodiment 1: wherein said light deflecting elements comprise grooves; and wherein said grooves are formed within each of a plurality of blocks that are attached and in optical communication with said planar waveguide, and said grooves are configured for redirecting the received light in response to reflection from at least one surface of said groove toward said collimating array.

8. The apparatus of embodiment 1: wherein said light deflecting elements comprise grooves; and wherein each of said grooves has a transparent surface and a reflective surface, and light received from the planar waveguide passes through the transparent surface of each of said grooves to be reflected from the reflective surface of each of said grooves toward said collimating array.

9. The apparatus of embodiment 1: wherein said light deflecting elements comprise grooves; and wherein each of said grooves comprise a prismatic groove or ridge formed in a surface of said planar waveguide disposed toward said collimating array for refractively deflecting the received light impinging on said prismatic groove to pass through said prismatic groove or ridge to exit the planar waveguide.

10. The apparatus of embodiment 1, wherein said plurality of light collimating elements is selected from the group of optical elements consisting of imaging lenses, non-imaging lenses, spherical lenses, aspherical lenses, lens arrays, Fresnel lenses, TIR lenses, gradient index lenses, diffraction lenses, mirrors, Fresnel mirrors, spherical mirrors, parabolic mirrors, mirror arrays, and trough mirrors.

11. The apparatus of embodiment 1, wherein said plurality of light deflecting elements is selected from the group of optical elements consisting of planar mirrors, curved mirrors, prisms, prism arrays, prismatic grooves, surface relief features, reflective surfaces, refractive surfaces, diffraction gratings, holograms, and light scattering elements.

12. The apparatus of embodiment 1, further comprising an optical interface disposed between said planar waveguide and said collimating array; wherein said optical interface is characterized by a drop in refractive index in the direction of light propagation from said planar waveguide toward said collimating array.

13. The apparatus of embodiment 1, further comprising: an optical interface layer disposed between said planar waveguide and said collimating array; wherein said optical interface layer is selected from the group of optical materials consisting of low refractive index monomers, polymers, fluoropolymers, low-n optical adhesives, thin films, and optical waveguide cladding materials.

14. The apparatus of embodiment 1, further comprising: an optical interface layer disposed between said planar waveguide and said collimating array; wherein said optical interface layer has a lower refractive index than said planar waveguide.

15. The apparatus of embodiment 1, further comprising: an optical interface layer disposed between said planar waveguide and said collimating array; wherein said optical interface layer comprises air.

16. The apparatus of embodiment 1, further comprising at least one illumination source coupled to at least one edge of said planar waveguide.

17. The apparatus of embodiment 1, further comprising at least one illumination source optically coupled to edges of a cutout within said planar waveguide.

18. The apparatus of embodiment 1, wherein both said collimating array and said planar waveguide have a round or sectorial shape obtainable by a revolution of a cross section of said collimating array and said planar waveguide around an axis.

19. The apparatus of embodiment 1, wherein said collimator array comprises point focus lenses.

20. The apparatus of embodiment 1: wherein said collimator array comprises point focus lenses; and wherein said point focus lenses have a shape selected from the group consisting of round, rectangular, square, and hexagonal.

21. The apparatus of embodiment 1, wherein said collimator array comprises point focus mirrors.

22. The apparatus of embodiment 1: wherein said collimator array comprises point focus mirrors; and wherein said point focus mirrors have a shape selected from the group of shapes consisting of round, rectangular, square, and hexagonal.

23. The apparatus of embodiment 1, wherein said planar waveguide comprises a rectangular plate having a first terminal edge, a second terminal edge, a first side wall, a second side wall, said first planar surface and said second planar surface.

24. The apparatus of embodiment 1, further comprising: a mirrored surface; wherein said planar waveguide comprises a rectangular plate having a first terminal edge, a second terminal edge, a first side wall, a second side wall, said first planar surface and said second planar surface; and wherein said mirrored surface is on one or more of said first terminal edge, said second terminal edge, said first side wall and said second side wall.

25. The apparatus of embodiment 1, further comprising: a cladding layer; wherein said planar waveguide comprises a rectangular plate having a first terminal edge, a second terminal edge, a first side wall, a second side wall, said first planar surface and said second planar surface; and wherein said a cladding layer is disposed upon one or more of said first terminal edge, said second terminal edge, said first side wall and said second side wall.

26. The apparatus of embodiment 1, wherein said planar waveguide and said collimator array are adapted for being retained in either a planar configuration or in bent and/or rolled configurations.

27. The apparatus of embodiment 1, wherein said planar waveguide and said collimator array are adapted for being retained in a translated, a reversed and/or a rotated orientation relative to each other toward achieving a adjusting the light distribution or collimation pattern.

28. The apparatus of embodiment 1, wherein said planar waveguide and said collimator array are adapted for being retained in a movable relationship with one another toward adjusting the light distribution or collimation pattern.

29. The apparatus of embodiment 1, further comprising: a coating on the exterior of said planar waveguide and/or said collimator array; wherein said coating is selected from the group of coatings consisting of anti-reflective, protective, encapsulates, reflective, diffusive, radiation protective, scratch and stain resistant, and light filtering.

30. An apparatus for light collimation and distribution, comprising: a planar waveguide having an optically transparent planar material configured to receive light on one edge of said planar material, and to propagate the received light through said planar waveguide in response to optical transmission and total internal reflection; a parallel collimating array having a plurality of elongated light collimating lenses disposed in an optical receiving relationship with a planar surface of said planar waveguide; and a parallel deflecting array having a plurality of elongated light deflecting grooves within said planar waveguide which are configured for deflecting light propagating through said waveguide at a sufficiently low angle, below the predetermined critical angle for total internal reflection (TIR), with respect to a surface normal direction of an exterior surface of said planar waveguide to exit said planar waveguide and enter said parallel collimating array; wherein each of said plurality of elongated light deflecting grooves is in a predetermined alignment with each of said plurality of elongated light collimating lenses; wherein light received on the edge of said planar waveguide is angularly redirected, collimated, and distributed from the surface of said parallel collimating array which is optically coupled to said planar waveguide.

31. A method for distributing radiant energy comprising: receiving radiant energy into an edge of an optical waveguide having edges disposed between a first planar surface and a second planar surface; propagating the radiant energy by optical transmission and total internal reflection in an optical material disposed between the first planar surface and the second planar surface along the length of the optical waveguide; deflecting the radiant energy at a plurality of deflecting elements distributed along the first planar surface and/or second planar surface of the optical waveguide to a sufficiently low angle, below the predetermined critical angle for total internal reflection (TIR) which is with respect to a surface normal direction of the first planar surface or second planar surface of the optical waveguide, causing the radiant energy to exit the surface of the optical waveguide through the first planar surface and/or the second planar surface; and collimating the radiant energy exiting the optical waveguide at a plurality of focal zones in response to the radiant energy passing through a plurality of radiation collimating elements.

32. An apparatus for collecting light, comprising: a plurality of light collecting elements within a collector array configured for collecting received light; a planar waveguide having edges disposed between a first planar surface and a second planar surface; said planar waveguide is disposed in an optical receiving relationship with said collector array and configured to propagate the received light by optical transmission and total internal reflection; and a plurality of light deflecting elements optically coupled to said planar waveguide with each of said plurality of light deflecting elements disposed in energy receiving relationship within said planar waveguide to at least one of said plurality of light collecting elements; wherein each of said plurality of light deflecting elements is configured to redirect incident light at a sufficiently high angle, above the predetermined critical angle for total internal reflection (TIR) with respect to a surface normal direction with respect to the first planar surface or the second planar surface of said planar waveguide, to redirect and propagate the received light within said planar waveguide by optical transmission and TIR.

33. The apparatus of embodiment 32, wherein said plurality of light collecting elements comprises a parallel array of elongated focus mirrors.

34. The apparatus of embodiment 32, wherein said plurality of light collecting elements comprises a parallel array of elongated lenticular lenses.

35. The apparatus of embodiment 32: wherein said plurality of light deflecting elements comprises a parallel array of elongated grooves.

36. The apparatus of embodiment 32: wherein said plurality of light deflecting elements comprises a parallel array of elongated grooves; wherein said grooves are configured at a slope angle $\theta_{30}$ which is bounded by the relation $$\arcsin\left(\frac{n_2}{n_1}\right) \le \theta_{30} \le \arccos\left(\frac{n_2}{n_1}\right)$$

in which $n_1$ is the refractive index of the planar waveguide and $n_2$ is the refractive index of an outside medium.

37. The apparatus of embodiment 32, wherein said plurality of light deflecting elements comprises grooves within said planar waveguide configured for redirecting the received light in response to reflection from at least one surface of said groove into the plane of the planar waveguide.

38. The apparatus of embodiment 32, wherein said plurality of light deflecting elements comprises grooves formed within each of a plurality of blocks that are attached and in optical communication with said planar waveguide, and said grooves are configured for redirecting the received light in response to reflection from at least one surface of said groove into the plane of the planar waveguide.

39. The apparatus of embodiment 32, wherein said plurality of light deflecting elements is selected from the group of optical elements consisting of planar mirrors, curved mirrors, prisms, prism arrays, prismatic grooves, surface relief features, reflective surfaces, refractive surfaces, diffraction gratings, holograms, and light scattering elements.

40. The apparatus of embodiment 32, wherein said plurality of light collecting elements is selected from the group of optical elements consisting of imaging lenses, non-imaging lenses, spherical lenses, aspherical lenses, lens arrays, Fresnel lenses, TIR lenses, gradient index lenses, diffraction lenses, mirrors, Fresnel mirrors, spherical mirrors, parabolic mirrors, mirror arrays, and trough mirrors.

41. The apparatus of embodiment 32, further comprising: an optical interface disposed between said planar waveguide and said collector array; wherein said optical interface is characterized by a drop in refractive index in the direction of light propagation from said planar waveguide toward said collimating array.

42. The apparatus of embodiment 32, further comprising: an optical interface layer disposed between said planar waveguide and said collector array; wherein said optical interface layer is selected from the group of optical materials consisting of low refractive index monomers, polymers, fluoropolymers, low-n optical adhesives, thin films, and optical waveguide cladding materials.

43. The apparatus of embodiment 32, further comprising: an optical interface layer disposed between said planar waveguide and said collector array; wherein said optical interface layer has a lower refractive index than said planar waveguide.

44. The apparatus of embodiment 32, further comprising: an optical interface layer disposed between said planar waveguide and said collector array; wherein said optical interface layer comprises air.

45. The apparatus of embodiment 32, wherein said planar waveguide comprises a rectangular plate having a first terminal edge, a second terminal edge, a first side wall, a second side wall, said first planar surface and said second planar surface.

46. The apparatus of embodiment 32, further comprising: a mirrored surface; wherein said planar waveguide comprises a rectangular plate having a first terminal edge, a second terminal edge, a first side wall, a second side wall, said first planar surface and said second planar surface; and wherein said mirrored surface is on one or more of said first terminal edge, said second terminal edge, said first side wall and said second side wall.

47. The apparatus of embodiment 32, further comprising: a cladding layer; wherein said planar waveguide comprises a rectangular plate having a first terminal edge, a second terminal edge, a first side wall, a second side wall, said first planar surface and said second planar surface; and wherein said cladding layer is disposed on one or more of said first terminal edge, said second terminal edge, said first side wall and said second side wall.

48. The apparatus of embodiment 32, further comprising: at least one optically responsive electronic device; wherein said planar waveguide comprises a rectangular plate having a first terminal edge, a second terminal edge, a first side wall, a second side wall, said first planar surface and said second planar surface; and wherein said at least one optically responsive electronic device coupled to at least one of said first terminal edge and said second terminal edge of said planar waveguide.

49. The apparatus of embodiment 32, further comprising: at least one photovoltaic cell; wherein said planar waveguide comprises a rectangular plate having a first terminal edge, a second terminal edge, a first side wall, a second side wall, said first planar surface and said second planar surface; and wherein said at least one photovoltaic cell is coupled to at least one of said first terminal edge and said second terminal edge of said planar waveguide.

50. The apparatus of embodiment 32, further comprising at least one optically responsive electronic device coupled to edges of a cutout within said planar waveguide.

51. The apparatus of embodiment 32, further comprising: at least one light harvesting area configured for outputting collected received light; wherein the area of said light harvesting area is smaller than the area of the collector array; wherein said planar waveguide comprises a rectangular plate having a first terminal edge, a second terminal edge, a first side wall, a second side wall, said first planar surface and said second planar surface; and wherein any cladding layer or protective layers disposed upon said light harvesting area on one or more of said first terminal edge, said second terminal edge, said first side wall and said second side wall, is removed for harvesting the light.

52. The apparatus of embodiment 32, wherein both said collector array and said planar waveguide have a round or sectorial shape obtainable by a revolution of a cross section of said collector array and said planar waveguide around an axis.

53. The apparatus of embodiment 32, wherein said collector array comprises point focus lenses.

54. The apparatus of embodiment 32: wherein said collector array comprises point focus lenses; and wherein said point focus lenses have a shape selected from the group consisting of round, rectangular, square, and hexagonal.

55. The apparatus of embodiment 32, wherein said collector array comprises point focus mirrors.

56. The apparatus of embodiment 32, wherein said planar waveguide and said collector array are adapted for being retained in either a planar configuration or in bent and/or rolled configurations.

57. The apparatus of embodiment 32, wherein said planar waveguide and said collector array are adapted for being retained in a translated, a reversed and/or a rotated orientation relative to each other toward adjusting the acceptance angle or for tracking the source of light.

58. The apparatus of embodiment 32, wherein said planar waveguide and said collector array are adapted for being retained in a movable relationship with one another toward adjusting acceptance angle or for tracking the source of light.

59. The apparatus of embodiment 32, further comprising: a coating on said planar waveguide and/or said collector array; wherein said coating is selected from the group of coatings consisting of anti-reflective, protective, encapsulates, reflective, diffusive, radiation protective, scratch and stain resistant, and light filtering.

60. An apparatus for collecting light, comprising: a parallel collecting array having a plurality of elongated light collecting structures configured for collecting received light; a planar waveguide having edges disposed between a first planar surface and a second planar surface; said planar waveguide is disposed in an optical receiving relationship with said collector array and configured to propagate the received light by elements of optical transmission and total internal reflection; and a parallel deflecting array having a plurality of light deflecting groove structures optically coupled to said planar waveguide with each of said plurality of light deflecting groove structures disposed in light receiving relationship within said planar waveguide to at least one of said light collecting structures; wherein each of said plurality of light deflecting groove structures is configured to redirect incident light at a sufficiently high angle, above the predetermined critical angle for total internal reflection (TIR) with respect to a surface normal direction of an exterior surface of said planar waveguide, to redirect and propagate the received light within said planar waveguide by optical transmission and TIR.

61. A method for collecting radiant energy comprising: concentrating a radiant energy received upon a plurality of focal zones in response to a plurality of radiation concentrator elements; directing the radiant energy from said plurality of focal zones through a first planar surface into an optical waveguide having edges disposed between a first planar surface and a second planar surface; deflecting the radiant energy at a plurality of deflecting elements positioned to received the radiant energy from the focal zones, and to deflect the radiant energy into the planar waveguide at angles exceeding the critical angle of total internal reflection in said waveguide, which is with respect to a surface normal direction of the first planar surface or second planar surface of the optical waveguide; and propagating said radiant energy through said optical waveguide by optical transmission and total internal reflection.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An edge-lit waveguide illumination system, comprising:
   a thin planar body of an optically transmissive material having edges disposed between a first broad-area surface and an opposing second broad-area surface;
   a plurality of light emitting diodes optically coupled to an edge of said optically transmissive material;
   a plurality of linear lenses formed in said first broad-area surface;
   a plurality of surface relief features formed in said second broad-area surface according to a predetermined two-dimensional pattern;
   wherein said optically transmissive material is configured to receive light on said edge and propagate the received light towards an opposing edge in response to optical transmission and total internal reflection, wherein said plurality of surface relief features is configured to extract light from said optically transmissive material such that the extracted light is distributed from a surface of said plurality of linear lenses.

2. An edge-lit waveguide illumination system as recited in claim 1, wherein said surface relief features include discrete micro-scale protrusions formed in otherwise smooth and planar portions of said second broad-area surface, wherein each of said protrusions comprises a surface that is disposed at an angle with respect to said second broad-area surface, wherein said smooth and planar portions of said second broad-area surface are parallel to a predominant plane of said optically transmissive material.

3. An edge-lit waveguide illumination system as recited in claim 1, wherein at least one of said light emitting diodes is a side-emitting LED.

4. An edge-lit waveguide illumination system as recited in claim 1, wherein a light ray extracted from said optically transmissive material is collected by one of said plurality of linear lenses and is angularly redirected into a direction generally perpendicular to a prevailing plane of said thin planar body.

5. An edge-lit waveguide illumination system as recited in claim 1, wherein each of said plurality of linear lenses has a spherical profile in a transversal cross-section and is capable of focusing a parallel beam of light incident onto said first broad-area surface onto a plurality of focal areas located between said first and second broad-area surfaces.

6. An edge-lit waveguide illumination system as recited in claim 1, comprising a reflective surface adjacent to said second broad-area surface and further comprising a light diffusing layer, wherein said reflective surface is configured to intercept light extracted from said optically transmissive material and redirect the extracted light towards said plurality of linear lenses.

7. An edge-lit waveguide illumination system as recited in claim 1, wherein said opposing edge is encapsulated or otherwise covered by an opaque reflective layer configured to reflect light arriving at said opposing edge back into said optically transmissive material.

8. An edge-lit waveguide illumination system as recited in claim 1, wherein at least a first one of said plurality of surface relief features is configured for refractively deflecting light to pass through said at least a first one of said plurality of surface relief features to exit said optically transmissive material and at least a second one of said plurality of surface relief features is configured for reflectively deflecting light toward said first broad-area surface to exit said optically transmissive material through said plurality of linear lenses.

9. An edge-lit waveguide illumination system as recited in claim 1, wherein one or more of said plurality of light emitting diodes is optically coupled to edges of one or more cutouts formed in said optically transmissive material.

10. An edge-lit waveguide illumination system as recited in claim 1, wherein said linear lenses are positioned adjacent to each other and form a continuous corrugated surface.

11. An edge-lit waveguide illumination system as recited in claim 1, wherein said linear lenses are spaced apart from each other.

12. An edge-lit waveguide illumination system as recited in claim 1, wherein said optically transmissive material comprises a polycarbonate material.

13. An edge-lit waveguide illumination system as recited in claim 1, wherein said optically transmissive material is configured to receive light on said plurality of linear lenses, wherein said surface relief features are disposed in energy receiving relationship with respect to said plurality of linear lenses.

14. An edge-lit waveguide illumination system, comprising:
   a planar body of a flexible optically transmissive material having a first microstructured surface and an opposing second microstructured surface, wherein the first microstructured surface has a first plurality of light deflecting surface relief features within a first planar array and the second microstructured surface has a second plurality of light deflecting surface relief features distributed according to a two-dimensional pattern within a second planar array that is parallel to the first planar array;
   a plurality of light emitting diodes optically coupled to an edge of the flexible optically transmissive material;

wherein the flexible optically transmissive material is configured to receive light on the edge and propagate the received light along the first and second microstructured surfaces in response to optical transmission and total internal reflection, wherein the second plurality of light deflecting surface relief features is configured to extract light from the flexible optically transmissive material, wherein said first planar array is disposed in energy receiving relationship with respect to said second planar array, wherein said optically transmissive material is configured to receive light on the first microstructured surface and propagate the received light toward the second microstructured surface.

15. An edge-lit waveguide illumination system as recited in claim 14, wherein the first plurality of light deflecting surface relief features comprises a planar array of elongated cylindrical lenses.

16. An edge-lit waveguide illumination system as recited in claim 14, wherein the first plurality of light deflecting surface relief features comprises a planar array of rounded ridges.

17. An edge-lit waveguide illumination system as recited in claim 14, comprising ridges formed in at least one of the first and second microstructured surfaces.

18. An edge-lit waveguide illumination system as recited in claim 14, wherein both the first and second pluralities of light deflecting surface relief features comprise curved surfaces, and wherein at least one of the curved surfaces has a focusing property.

19. An edge-lit waveguide illumination system, comprising:
- a thin planar body of a flexible optically transmissive material;
- a plurality of rounded ridges formed in a first major surface of the optically transmissive material;
- a plurality of light deflecting surface relief features formed in an opposing second major surface of the optically transmissive material according to a two-dimensional pattern;
- a plurality of light emitting diodes optically coupled to an edge of the optically transmissive material;
- wherein the flexible optically transmissive material is configured to propagate light along the first and second major surfaces in response to optical transmission and total internal reflection, wherein the plurality of light deflecting surface relief features is configured to extract light from the optically transmissive material, wherein the plurality of rounded ridges is configured to receive and distribute the extracted light from the first major surface.

20. An edge-lit waveguide illumination system as recited in claim 19, wherein said flexible optically transmissive material is configured to receive light on said first major surface and propagate the received light toward the second major surface.

* * * * *